(12) United States Patent
Hatakeyama et al.

(10) Patent No.: US 11,709,426 B2
(45) Date of Patent: Jul. 25, 2023

(54) RESIST COMPOSITION AND PATTERN FORMING PROCESS

(71) Applicant: Shin-Etsu Chemical Co., Ltd., Tokyo (JP)

(72) Inventors: Jun Hatakeyama, Joetsu (JP); Takayuki Fujiwara, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 231 days.

(21) Appl. No.: 17/132,217

(22) Filed: Dec. 23, 2020

(65) Prior Publication Data

US 2021/0232048 A1 Jul. 29, 2021

(30) Foreign Application Priority Data

Jan. 22, 2020 (JP) ................................ 2020-007992

(51) Int. Cl.
*G03F 7/004* (2006.01)
*G03F 7/039* (2006.01)
*G03F 7/038* (2006.01)
*C08F 212/14* (2006.01)
*C08F 220/18* (2006.01)

(52) U.S. Cl.
CPC .......... *G03F 7/0045* (2013.01); *C08F 212/22* (2020.02); *C08F 212/24* (2020.02); *C08F 220/1802* (2020.02); *C08F 220/1805* (2020.02); *C08F 220/1806* (2020.02); *G03F 7/0382* (2013.01); *G03F 7/0392* (2013.01); *G03F 7/0397* (2013.01)

(58) Field of Classification Search
CPC ... C07C 381/12; C07C 309/00; C07C 309/02; C07C 309/06; G03F 7/0392; G03F 7/0045; C08F 220/30; C08F 220/282; C08F 220/382; C08F 220/24; C08F 212/08
See application file for complete search history.

(56) References Cited

U.S. PATENT DOCUMENTS

| 7,537,880 | B2* | 5/2009 | Harada | G03F 7/0397 430/326 |
| 8,709,651 | B2* | 4/2014 | Kim | H01M 4/133 429/66 |
| 9,017,922 | B2* | 4/2015 | Hatakeyama | G03F 7/0382 430/927 |
| 10,613,437 | B2* | 4/2020 | Hatakeyama | G03F 7/322 |
| 11,409,194 | B2* | 8/2022 | Hatakeyama | C07D 235/12 |
| 2016/0259242 | A1* | 9/2016 | Ohashi | C07D 231/56 |
| 2017/0351177 | A1 | 12/2017 | Hatakeyama et al. | |
| 2017/0369616 | A1* | 12/2017 | Hatakeyama | G03F 7/0045 |
| 2018/0039173 | A1* | 2/2018 | Hatakeyama | C07C 309/17 |
| 2018/0267402 | A1* | 9/2018 | Hatakeyama | C08F 228/02 |
| 2018/0275512 | A1* | 9/2018 | Hatakeyama | C08F 220/283 |
| 2019/0033716 | A1* | 1/2019 | Ohashi | C07C 309/12 |
| 2019/0155152 | A1* | 5/2019 | Aqad | G03F 7/16 |
| 2020/0341376 | A1* | 10/2020 | Kiriyama | G03F 7/0397 |

FOREIGN PATENT DOCUMENTS

| KR | 10-2017-0138355 A | 12/2017 |
| TW | 201805269 A | 2/2018 |
| TW | 201910311 A | 3/2019 |

OTHER PUBLICATIONS

Office Action dated Sep. 7, 2021, issued in counterpart TW Application No. 110101878. (9 pages).
Hutchinson, "The Shot Noise Impact on Resist Roughness in EUV Lithography", SPIE, 1998, vol. 3331, pp. 531-536, cited in Specification (7 pages).
Office Action dated Jan. 6, 2023, issued in counterpart KR Application No. 10-2021-0007239, with English translation. (12 pages).

* cited by examiner

*Primary Examiner* — Amanda C. Walke
(74) *Attorney, Agent, or Firm* — WHDA, LLP

(57) ABSTRACT

A resist composition comprising a base polymer and an acid generator containing a sulfonium salt having the formula (1) or an iodonium salt having the formula (2).

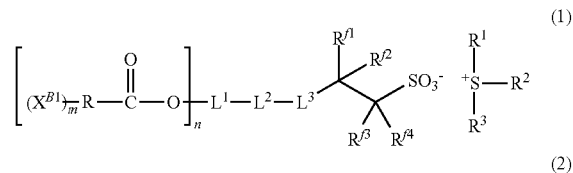

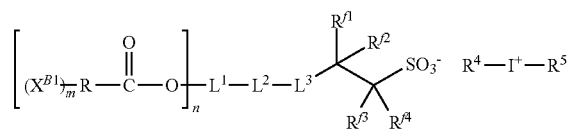

14 Claims, No Drawings

RESIST COMPOSITION AND PATTERN FORMING PROCESS

CROSS-REFERENCE TO RELATED APPLICATION

This non-provisional application claims priority under 35 U.S.C. § 119(a) on Patent Application No. 2020-007992 filed in Japan on Jan. 22, 2020, the entire contents of which are hereby incorporated by reference.

TECHNICAL FIELD

This invention relates to a resist composition and a pattern forming process.

BACKGROUND ART

As integration density and operating speed of LSIs become higher, the effort to make the pattern rule finer is in rapid progress. In particular, logic devices used in smartphones and the like drive forward the miniaturization technology, and manufacturing of 10-nm node logic devices using a process of a plurality of times of exposure by ArF lithography (multi-patterning lithography) has been implemented in a mass scale.

In the next-stage lithography at the 7-nm node and the 5-nm node, the high cost due to the plurality of times of exposure and the problem of overlay accuracy in the plurality of times of exposure have been apparent, and it has been expected that the extreme ultraviolet (EUV) lithography that can reduce the times of exposure come into practice.

The wavelength of EUV, which has a wavelength of 13.5 nm, is as short as ⅒ or less of the wavelength of ArF excimer laser radiation, which has a wavelength of 193 nm, therefore, high light contrast and high resolution can be expected in the EUV lithography. EUV has a short wavelength and a high energy density, therefore, an acid generator is undesirably exposed with a small amount of photons. The number of photons in EUV exposure is said to be 1/14 of that in exposure by ArF excimer laser radiation. In EUV exposure, the phenomenon that the edge roughness (LWR) of the line pattern and the critical dimension uniformity (CDU) of the hole pattern are deteriorated because of the variation of photon number has been regarded as a problem (Non-Patent Document 1).

As the pattern rule becomes finer, the LWR and the CDU are regarded as problems. The influence of uneven distribution and agglomeration of a base polymer and an acid generator and the influence of acid diffusion have been pointed out. Furthermore, the LWR tends to increase as the resist film becomes thinner, and the deterioration of the LWR because of the thinning due to the progress of miniaturization has become a serious problem.

The EUV resist composition needs to meet high sensitivity, high resolution, and low LWR at the same time. As the acid diffusion distance is reduced, LWR is reduced, but sensitivity becomes lower. For example, as the post-exposure bake (PEB) temperature is lowered, the outcome is a reduced LWR but a lower sensitivity. As the amount of quencher added is increased, the outcome is a reduced LWR, but a lower sensitivity. It is necessary to overcome the tradeoff relation between sensitivity and LWR.

CITATION LIST

Non-Patent Document 1: SPIE Vol. 3331 p 531 (1998)

SUMMARY OF THE INVENTION

For the chemically amplified resist composition using an acid catalyst, it is desired to develop an acid generator capable of achieving a high sensitivity and reducing the LWR or improving the CDU.

The invention has been made in view of the above-described problems, and an object of the invention is to provide a resist composition that achieves a high sensitivity, minima LWR, and improved CDU independent of whether it is of positive or negative tone, and a pattern forming process using the resist composition.

The inventors have made intensive studies to achieve the above-described object, and as a result, have completed the invention. The inventors have found that a resist composition having a high sensitivity, minimal LWR, improved CDU, high contrast, high resolution, and wide process margin is obtained using a sulfonium or iodonium salt of fluorinated sulfonic acid having an iodine or bromine-substituted hydrocarbylcarbonyloxy group (however, not a group in which an iodine atom or a bromine atom is bonded to a carbon atom on the aromatic ring)(hereinafter, the salt is also referred to as an iodized or brominated hydrocarbylcarbonyloxy group-containing fluorinated sulfonic acid onium salt) as an acid generator to generate secondary electrons efficiently from iodine atoms or bromine atoms during exposure to promote decomposition of the sulfonium salt or iodonium salt.

Therefore, the invention provides a resist composition and a pattern forming process described below.

1. A resist composition comprising a base polymer and an acid generator containing a sulfonium salt having the formula (1) or an iodonium salt having the formula (2):

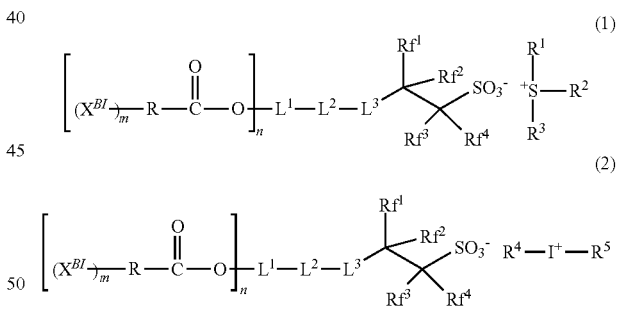

wherein m is an integer of 1 to 3, n is an integer of 1 to 3,
$X^{BI}$ is bromine or iodine,
R is a $C_1$-$C_{20}$ (m+1)-valent aliphatic hydrocarbon group which may contain at least one selected from fluorine, chlorine, a hydroxyl group, a carboxyl group, a $C_6$-$C_{12}$ aryl group, an ether bond, an ester bond, a carbonyl group, an amide bond, a carbonate group, a urethane bond, or a urea bond,
$L^1$ is a $C_1$-$C_{20}$ hydrocarbylene group which may contain a single bond or a heteroatom when n is 1, or a $C_1$-$C_{20}$ (n+1)-valent hydrocarbon group which may contain a heteroatom when n is 2 or 3,
$L^2$ is a single bond, an ester bond, or an ether bond,
$L^3$ is a single bond or a $C_1$-$C_{10}$ aliphatic hydrocarbylene group, Rf¹ to Rf⁴ are each independently hydrogen, fluorine, or a trifluoromethyl group, at least one of Rf¹ to Rf⁴ being fluorine or a trifluoromethyl group, Rf¹ and Rf², taken together, may form a carbonyl group.

$R^1$ to $R^5$ are each independently a $C_1$-$C_{20}$ hydrocarbyl group which may contain a heteroatom, and $R^1$ and $R^2$ may bond together to form a ring with the sulfur atom to which they are attached.

2. The resist composition of the item 1, further comprising a quencher.

3. The resist composition of the item 1 or 2, further comprising an organic solvent.

4. The resist composition of any one of the items 1 to 3, wherein the base polymer comprises recurring units having the formula (a1) or recurring units having the formula (a2):

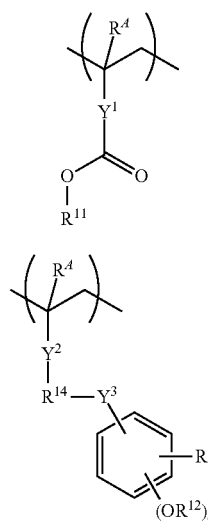

wherein $R^A$ is each independently hydrogen or a methyl group.

$Y^1$ is a single bond, a phenylene group, a naphthylene group, or a $C_1$-$C_{12}$ linking group containing at least one selected from an ester bond or a lactone ring, $Y^2$ is a single bond or an ester bond, $Y^3$ is a single bond, an ether bond, or an ester bond, $R^{11}$ and $R^{12}$ each are an acid labile group, $R^{13}$ is fluorine, a trifluoromethyl group, a cyano group, a $C_1$-$C_6$ saturated hydrocarbyl group, a $C_1$-$C_6$ saturated hydrocarbyloxy group, a $C_2$-$C_7$ saturated hydrocarbylcarbonyl group, a $C_2$-$C_7$ saturated hydrocarbylcarbonyloxy group, or a $C_2$-$C_7$ saturated hydrocarbyloxycarbonyl group, $R^{14}$ is a single bond or a $C_1$-$C_6$ alkanediyl group in which some carbon may be replaced by an ether bond or an ester bond, a is 1 or 2, and b is an integer of 0 to 4.

5. The resist composition of the item 4 which is a chemically amplified positive resist composition.

6. The resist composition of any one of the items 1 to 3, wherein the base polymer is free of an acid labile group.

7. The resist composition of the item 6 which is a chemically amplified negative resist composition.

8. The resist composition of any one of the items 1 to 7, further comprising a surfactant.

9. The resist composition of any one of the items 1 to 8, wherein the base polymer comprises recurring units having any one of the formulae (f1) to (f3):

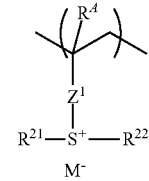

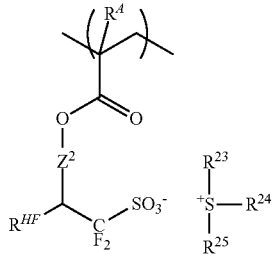

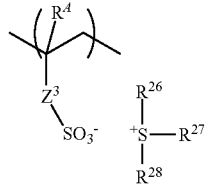

wherein $R^A$ is each independently hydrogen or a methyl group, $Z^1$ is a single bond, a phenylene group, —O—$Z^{11}$—, —C(=O)—$Z^{11}$—, or —C(=O)—NH—$Z^{11}$—, wherein $Z^{11}$ is a $C_1$-$C_6$ aliphatic hydrocarbylene group, a phenylene group, a naphthylene group, or a $C_7$-$C_{18}$ group obtained from combination thereof, which may contain a carbonyl group, an ester bond, an ether bond, or a hydroxyl group, $Z^2$ is a single bond, —$Z^{21}$—C(=O)—, —$Z^{21}$—O—, or —$Z^{21}$—O—C(=O)—, wherein $Z^{21}$ is a $C_1$-$C_{12}$ saturated hydrocarbylene group which may contain a carbonyl group, an ester bond, or an ether bond, $Z^3$ is a single bond, a methylene group, an ethylene group, a phenylene group, a fluorinated phenylene group. —O—$Z^{31}$—, —C(=O)—O—$Z^{31}$—, or —C(=O)—NH—$Z^{31}$—, wherein $Z^{31}$ is a $C_1$-$C_6$ aliphatic hydrocarbylene group, a phenylene group, a fluorinated phenylene group, or a trifluoromethyl-substituted phenylene group, which may contain a carbonyl group, an ester bond, an ether bond, or a hydroxyl group.

$R^{21}$ to $R^{28}$ are each independently a $C_1$-$C_{20}$ hydrocarbyl group which may contain a heteroatom, a pair of $R^{23}$ and $R^{24}$ or $R^{26}$ and $R^{27}$ may bond together to form a ring with the sulfur atom to which they are attached, $R^{HF}$ is hydrogen or a trifluoromethyl group, and $M^-$ is a non-nucleophilic counter ion.

10. A pattern forming process comprising the steps of applying the resist composition of any one of the items 1 to 9 onto a substrate to form a resist film thereon, exposing the resist film to high-energy radiation, and developing the exposed resist film in a developer.

11. The pattern forming process of the item 10, wherein the high-energy radiation is ArF excimer laser radiation of wavelength 193 nm or KrF excimer laser radiation of wavelength 248 nm.

12. The pattern forming process of the item 10, wherein the high-energy radiation is an electron beam (EB) or EUV of wavelength 3 to 15 in.

Advantageous Effects of the Invention

The iodized or brominated hydrocarbylcarbonyloxy group-containing fluorinated sulfonic acid onium salt is characterized by minimal acid diffusion due to the large atomic weights of iodine and bromine. Since iodine atoms and bromine atoms are highly absorptive to EUV of wavelength 13.5 nm, they generate secondary electrons and radicals during exposure to promote the decomposition of the sulfonium salt or the iodonium salt, contributing to a high sensitivity. Iodine atoms and bromine atoms generate secondary electrons more efficiently in the case of being bonded to a hydrocarbylcarbonyloxy group than in the case of being directly bonded to an aromatic group. Thus a resist composition having a high sensitivity, minimal LWR, and improved CDU is designed by using the onium salt.

DESCRIPTION OF THE PREFERRED EMBODIMENTS

As used herein, the singular forms "a," "an" and "the" include plural referents unless the context clearly dictates otherwise. The notation ($C_n$-$C_m$) means a group containing from n to m carbon atoms per group. As used herein, the term "iodized" or "brominated" indicates that a compound contains iodine or bromine; and the terms "group" and "moiety" are interchangeable.

Resist Composition

One embodiment of the invention is a resist composition comprising a base polymer and an acid generator containing the iodized or brominated hydrocarbylcarbonyloxy group-containing fluorinated sulfonic acid onium salt. The onium salt is an acid generator capable of generating an iodized or brominated hydrocarbycarbonyloxy group-containing fluorinated sulfonic acid upon light exposure. In the resist composition, another acid generator capable of generating a different sulfonic acid, imide acid, or methide acid may be added, or a base polymer having an acid generator bound thereto may be combined.

When a resist composition containing the iodized or brominated hydrocarbylcarbonyloxy group-containing fluorinated sulfonic acid onium salt in admixture is exposed to radiation, the iodized or brominated hydrocarbylcarbonyloxy group-containing fluorinated sulfonic acid and the weaker sulfonic or carboxylic acid generate. Since the acid generator is not entirely decomposed, the undecomposed acid generator is present nearby. When the iodized or brominated hydrocarbylcarbonyloxy group-containing fluorinated sulfonic acid co-exists with the sulfonium salt of weaker sulfonic or carboxylic acid, an ion exchange takes place between the iodized or brominated hydrocarbylcarbonyloxy group-containing fluorinated sulfonic acid and the sulfonium salt of weaker sulfonic or carboxylic acid, whereby a sulfonium salt of the iodized or brominated hydrocarbylcarbonyloxy group-containing fluorinated sulfonic acid is created and the weaker sulfonic or carboxylic acid is released. This is because the salt of iodized or brominated hydrocarbylcarbonyloxy group-containing fluorinated sulfonic acid having a higher acid strength is more stable. In contrast, when a sulfonium salt of an iodized or brominated hydrocarbylcarbonyloxy group-containing fluorinated sulfonic acid co-exists with weaker sulfonic or carboxylic acid, no ion exchange takes place. The ion exchange conforming to the order of acid strength takes place not only with sulfonium salts, but also similarly with iodonium salts. When combined with an acid generator capable of generating fluorosulphonic acid, a sulfonium or iodonium salt of weak acid functions as a quencher. Since iodine and bromine are highly absorptive to EUV of wavelength 13.5 nm, they generate secondary electrons and radicals during exposure. The energy is transferred to the acid generator, which promotes the decomposition of the generator, contributing to a higher sensitivity.

For the LWR improving purpose, it is effective to prevent a polymer and/or acid generator from agglomeration. Effective means for preventing agglomeration of a polymer is by reducing the difference between hydrophobic and hydrophilic properties, by lowering the glass transition temperature (Tg), or by reducing the molecular weight of the polymer. Specifically, it is effective to reduce the polarity difference between a hydrophobic acid labile group and a hydrophilic adhesive group or to lower the Tg by using a compact adhesive group like monocyclic lactone. One effective means for preventing agglomeration of an acid generator is by introducing a substituent into the triphenylsulfonium cation. In particular, with respect to a methacrylate polymer containing an alicyclic protective group and a lactone adhesive group for ArF lithography, a triphenylsulfonium composed solely of aromatic groups has a heterogeneous structure and low compatibility. As the substituent to be introduced into triphenylsulfonium, an alicyclic group or lactone similar to those used in the base polymer is regarded adequate. When lactone is introduced in a sulfonium salt which is hydrophilic, the resulting sulfonium salt becomes too hydrophilic and thus less compatible with a polymer, with a likelihood that the sulfonium salt will agglomerate. When a hydrophobic alkyl group is introduced, the sulfonium salt may be uniformly dispersed within the resist film. WO 2011/048919 discloses the technique for improving LWR by introducing an alkyl group into a sulfonium salt capable of generating an α-fluorinated sulfone imide acid.

The iodized or brominated hydrocarbylcarbonyloxy group-containing fluorinated sulfonic acid onium salt is reduced in acid diffusion because an iodine atom or a bromine atom with a large atomic weight is introduced in the anion. The salt is highly compatible with and thus well dispersible in a polymer. There are achieved improvements in LWR and CDU.

The iodized or brominated hydrocarbylcarbonyloxy group-containing fluorinated sulfonic acid onium salt exerts a LWR or CDU improving effect, which may stand good either in positive and negative tone pattern formation by aqueous alkaline development or in negative tone pattern formation by organic solvent development.

Iodized or Brominated Hydrocarbylcarbonyloxy Group-Containing Fluorinated Sulfonic Acid Onium Salt The iodized or brominated hydrocarbylcarbonyloxy group-containing fluorinated sulfonic acid onium salt contained in the resist composition of the invention has the following formulae (1) and (2), respectively.

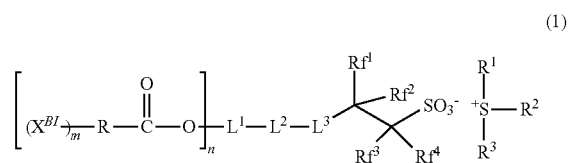

(1)

-continued

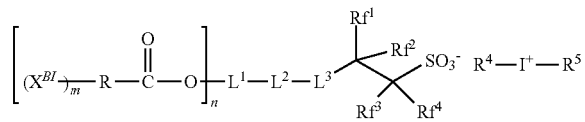
(2)

In the formulae (1) and (2), m is an integer of 1 to 3. n is an integer of 1 to 3.

In the formulae (1) and (2), $X^{BI}$ is bromine or iodine. When m and/or n is 2 or 3, a plurality of $X^{BI}$s may be the same or different from each other.

In the fornmlae (1) and (2), R is a $C_1$-$C_{20}$ (m+1)-valent aliphatic hydrocarbon group. When n is 2 or 3, a plurality of Rs may be the same or different from each other. The aliphatic hydrocarbon group may be saturated or unsaturated, and may be straight, branched, or cyclic. Specific examples of the aliphatic hydrocarbon group include aliphatic hydrocarbylene groups including alkanediyl groups such as methanediyl, ethane-1,1-diyl, ethane-1,2-diyl, propane-1,1-diyl, propane-1,2-diyl, propane-1,3-diyl, propane-2,2-diyl, butane-1,1-diyl, butane-1,2-diyl, butane-1,3-diyl, butane-2,3-diyl, butane-1,4-diyl, 1,1-dimethylethane-1,2-diyl, pentane-1,5-diyl, 2-methylbutane-1,2-diyl, hexane-1,6-diyl, heptane-1,7-diyl, octane-1,8-diyl, nonane-1,9-diyl, decane-1,10-diyl, undecane-1,11-diyl, and dodecane-1,12-diyl; cycloalkanediyl groups such as cyclopropane-1,1-diyl, cyclopropane-1,2-diyl, cyclobutane-1,1-diyl, cyclobutane-1,2-diyl, cyclobutane-1,3-diyl, cyclopentane-1,1-diyl, cyclopentane-1,2-diyl, cyclopentane-1,3-diyl, cyclohexane-1,1-diyl, cyclohexane-1,2-diyl, cyclohexane-1,3-diyl, and cyclohexane-1,4-diyl; divalent polycyclic saturated hydrocarbyl groups such as norbornane-2,3-diyl and norbornane-2,6-diyl; alkenediyl groups such as 2-propene-1,1-diyl; alkenediyl groups such as 2-propyne-1,1-diyl; cycloalkenediyl groups such as 2-cyclohexene-1,2-diyl, 2-cyclohexene-1,3-diyl, and 3-cyclohexene-1,2-diyl; divalent polycyclic unsaturated hydrocarbyl groups such as 5-norbornene-2,3-diyl; cyclic aliphatic hydrocarbyl group-substituted alkanediyl groups such as cyclopentylmethanediyl, cyclohexylmethanediyl, 2-cyclopentenylmethanediyl group, 3-cyclopentenylmethanediyl group, 2-cyclohexenylmethanediyl group, and 3-cyclohexenylmethanediyl group; groups obtained from combination of the above-described groups; and trivalent or tetravalent groups obtained by removing one or two hydrogen atoms from the above-described aliphatic hydrocarbylene groups.

In these groups, some or all hydrogen atoms may be substituted by a fluorine atom, a chlorine atom, a hydroxyl group, a carboxyl group, or a $C_6$-$C_{12}$ aryl group, and at least one selected from an ether bond, an ester bond, a carbonyl group, an amide bond, a carbonate group, a urethane bond, or a urea bond may be interposed between the carbon-carbon bond of these groups. Examples of the $C_6$-$C_{12}$ aryl group include groups such as phenyl, 2-methylphenyl, 3-methylphenyl, 4-methylphenyl, 1-naphthyl, 2-naphthyl, and fluorenyl.

In the formulae (1) and (2), $L^1$ is a $C_1$-$C_{20}$ hydrocarbylene group which may contain a single bond or a heteroatom when n is 1, or a $C_1$-$C_{20}$ (n+1)-valent hydrocarbon group which may contain a heteroatom when n is 2 or 3. The hydrocarbylene group and the (n+1)-valent hydrocarbon group may be saturated or unsaturated, and may be straight, branched, or cyclic. Specific examples of the group include the groups exemplified as a $C_1$-$C_{20}$ aliphatic hydrocarbon group represented by R; groups obtained by removing (n+1) hydrogen atoms on the aromatic ring of an aromatic hydrocarbon such as benzene, toluene, xylene, or naphthalene; and combinations thereof. In these groups, some hydrogen atoms may be substituted by a group containing a heteroatom such as oxygen, sulfur, nitrogen, or halogen, or some carbon may be replaced by a group containing a heteroatom such as oxygen, sulfur, or nitrogen, so that the group may contain fluorine, chlorine, bromine, iodine, a hydroxyl group, a cyano group, a nitro group, a carbonyl group, an ether bond, an ester bond, a sulfonic acid ester bond, a carbonate group, a lactone ring, a sultone ring a carboxylic anhydride, or a haloalkyl group.

In the formulae (1) and (2), $L^2$ is a single bond, an ester bond, or an ether bond. $L^3$ is a single bond or a $C_1$-$C_{10}$ aliphatic hydrocarbylene group. The $C_1$-$C_{10}$ aliphatic hydrocarbylene group represented by $L^3$ may be saturated or unsaturated, and may be straight, branched, or cyclic. Specific examples of the group include the $C_1$-$C_{10}$ aliphatic hydrocarbylene groups exemplified as an aliphatic hydrocarbon group represented by R.

In the formulae (1) and (2), $Rf^1$ to $Rf^4$ are each independently hydrogen, fluorine, or a trifluoromethyl group, at least one of $Rf^1$ to $Rf^4$ being fluorine or a trifluoromethyl group. It is particularly preferable that both $Rf^3$ and $Rf^4$ be fluorine. $Rf^1$ and $Rf^2$, taken together, may form a carbonyl group.

In the formulae (1) and (2), $R^1$ to $R^5$ are each independently a $C_1$-$C_{20}$ hydrocarbyl group which may contain a heteroatom. The hydrocarbyl group may be saturated or unsaturated, and may be straight, branched, or cyclic. Specific examples of the hydrocarbyl group include $C_1$-$C_{20}$ alkyl groups such as methyl, ethyl, n-propyl, isopropyl, n-butyl, isobutyl, sec-butyl, tert-butyl, n-pentyl, n-hexyl, n-octyl, n-nonyl, n-decyl, undecyl, dodecyl, tridecyl, tetradecyl, pentadecyl, heptadecyl, octadecyl, nonadecyl, and icosyl; $C_3$-$C_{20}$ cyclic saturated hydrocarbyl groups such as cyclopropyl, cyclopentyl, cyclohexyl, cyclopropylmethyl, 4-methylcyclohexyl, cyclohexylmethyl, norbornyl, and adamantyl; $C_2$-$C_{20}$ alkenyl groups such as vinyl, propenyl, butenyl, and hexenyl; $C_2$-$C_{20}$ cyclic unsaturated aliphatic hydrocarbyl groups such as cyclohexenyl and norbornenyl; $C_2$-$C_{20}$ alkynyl groups such as ethynyl, propynyl, and butynyl; $C_6$-$C_{20}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, and tert-butylnaphthyl; $C_7$-$C_{20}$ aralkyl groups such as a benzyl and phenethyl; and combinations thereof. In these groups, some hydrogen atoms may be substituted by a group containing a heteroatom such as oxygen, sulfur, nitrogen, or halogen, or some carbon may be replaced by a group containing a heteroatom such as oxygen, sulfur, or nitrogen, so that the group may contain a hydroxyl group, a cyano group, a carbonyl group, an ether bond, an ester bond, a sulfonic acid ester bond, a carbonate group, a lactone ring, a sultone ring, a carboxylic anhydride, or a haloalkyl group.

$R^1$ and $R^2$ may bond together to form a ring with the sulfur atom to which they are attached. Preferred examples of the ring are shown by the following structures.

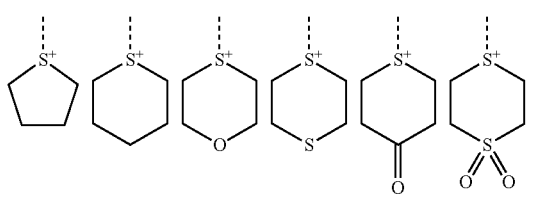
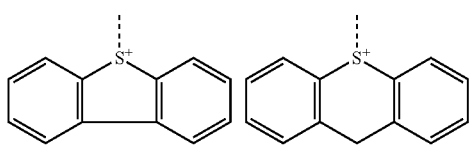
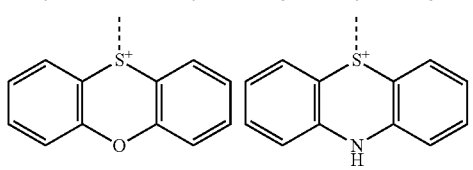
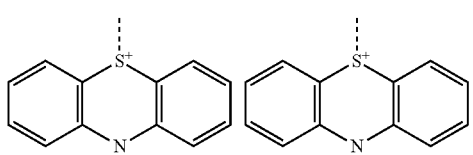
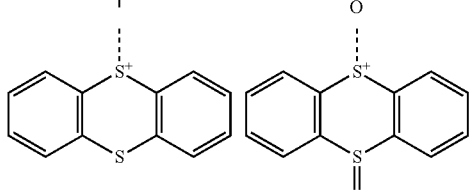
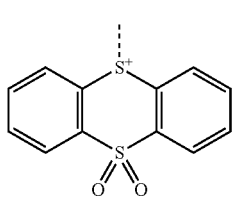
Herein the broken line designates a point of attachment to $R^3$.
Examples of the cation in the sulfonium salt having the formula (1) are given below, but not limited thereto.
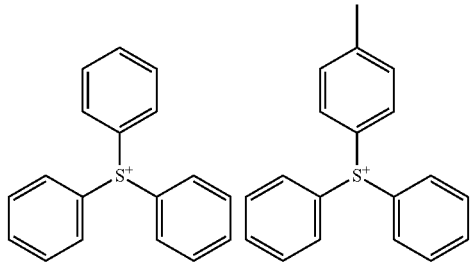
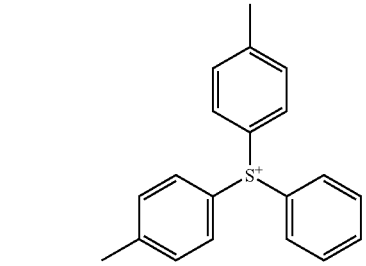
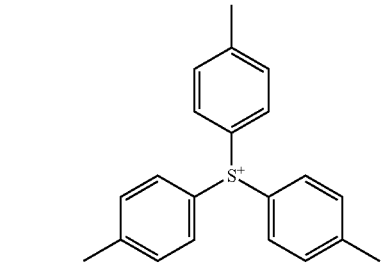
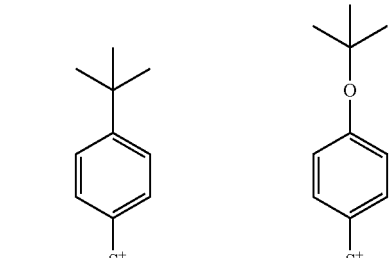
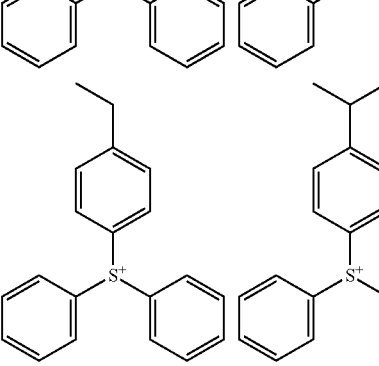
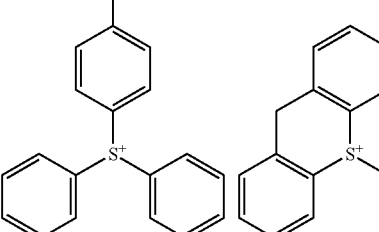
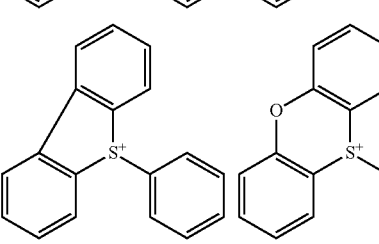

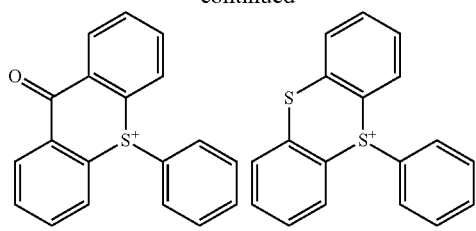
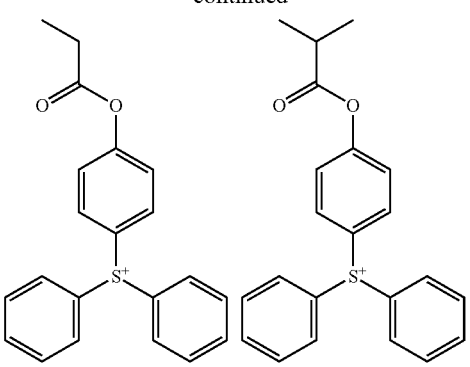
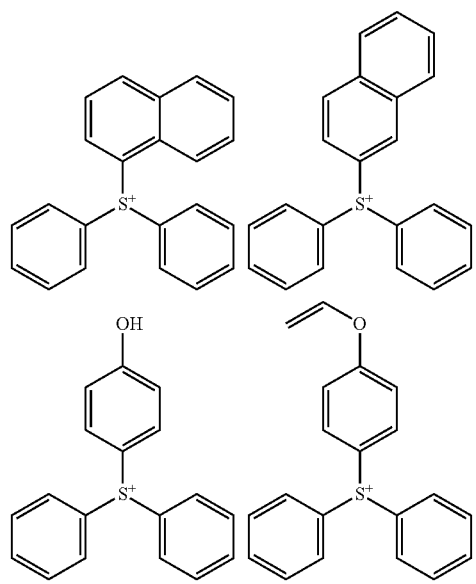
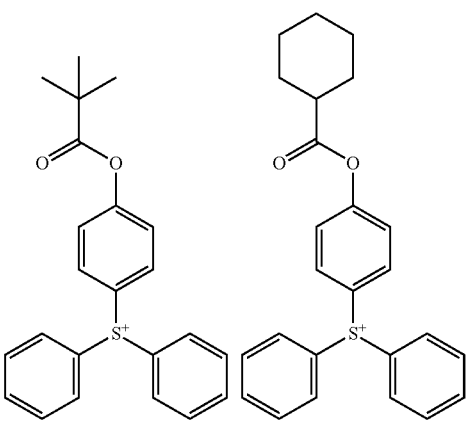
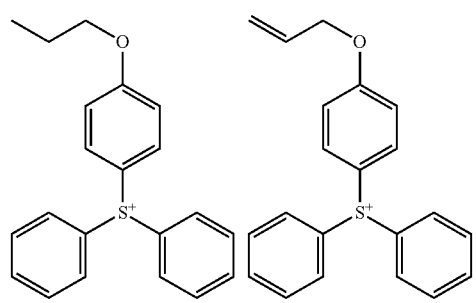
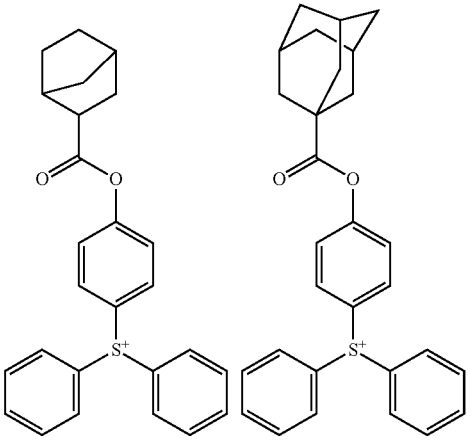
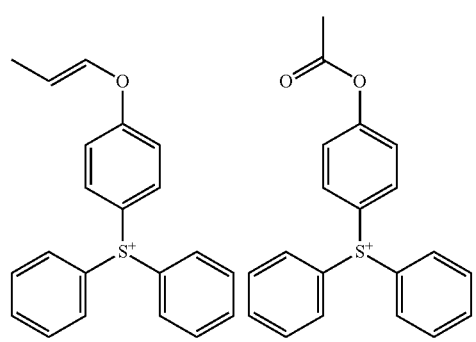
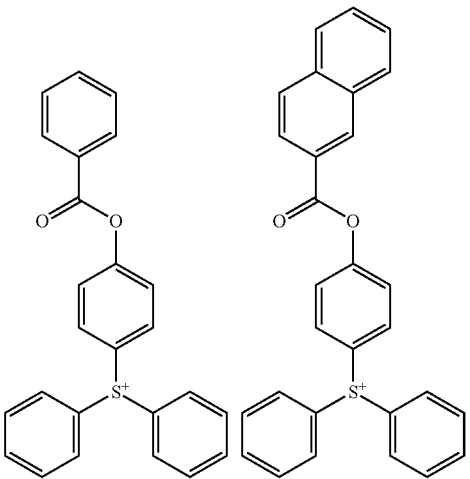

13
-continued
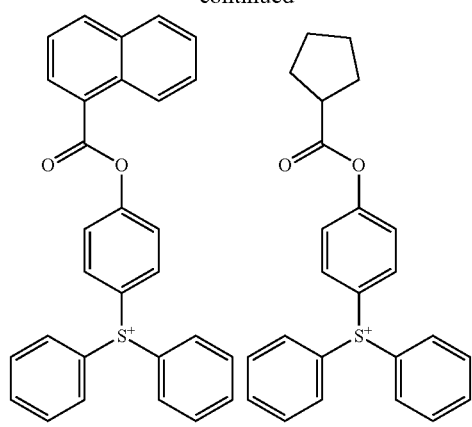
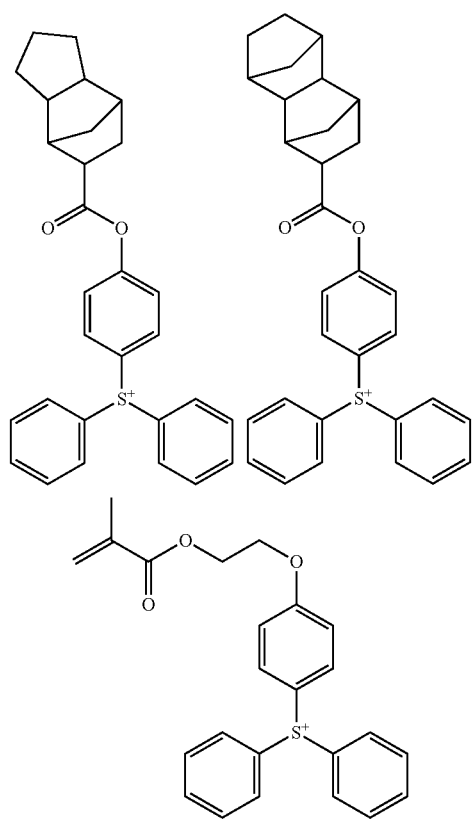
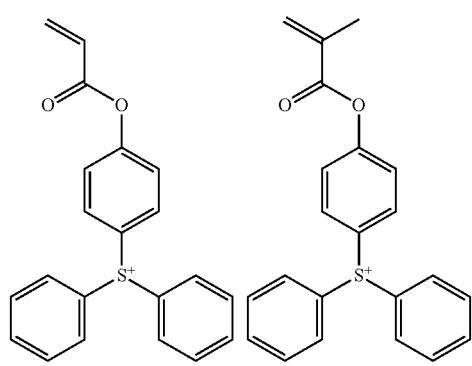
14
-continued
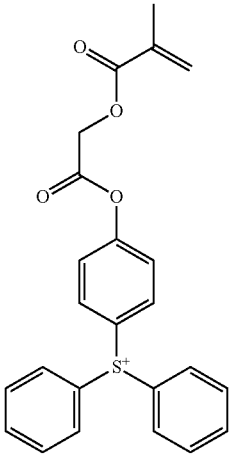
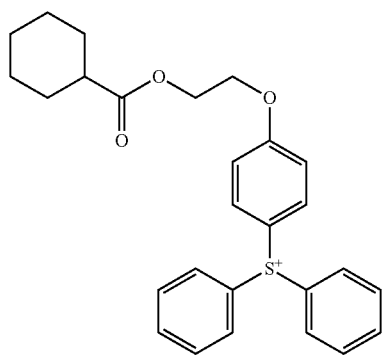
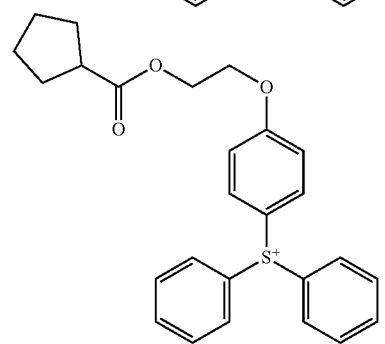
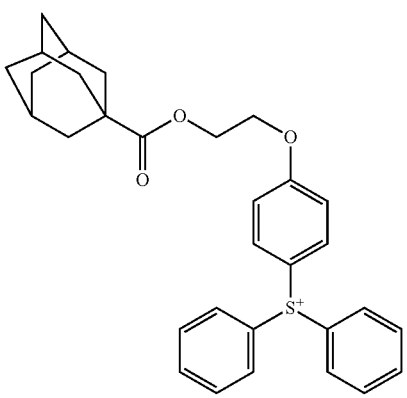

15
-continued
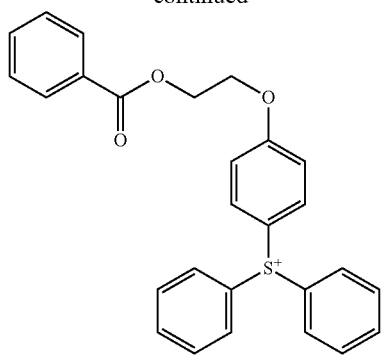
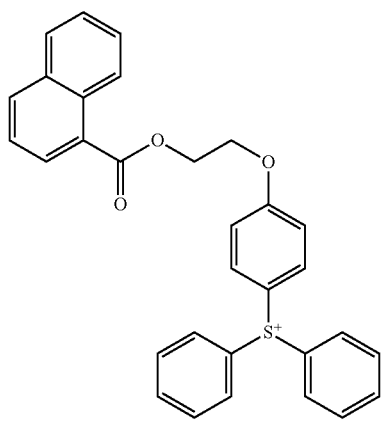
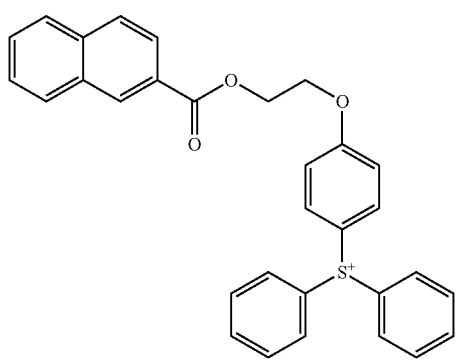
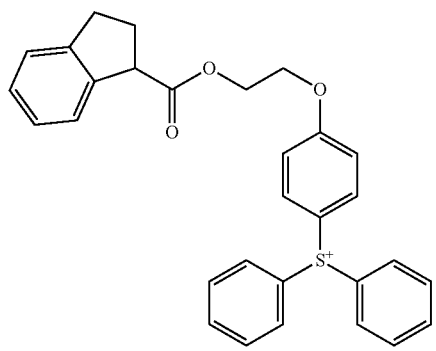
16
-continued
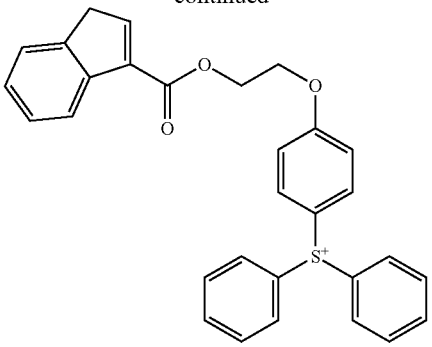
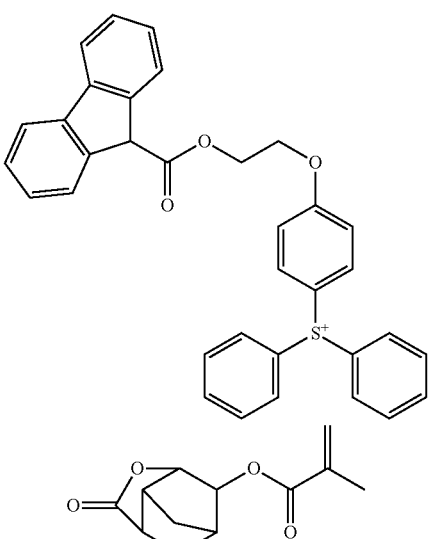
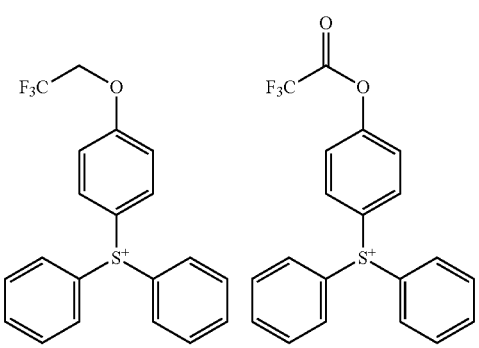

17
-continued
18
-continued
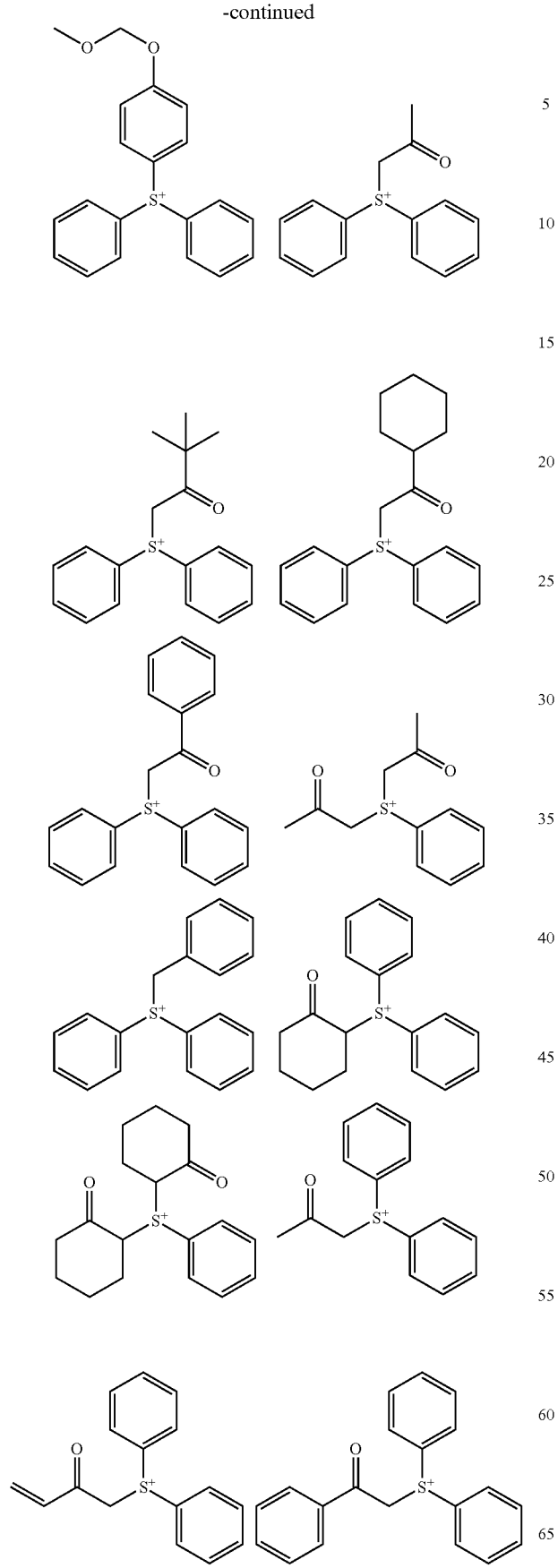

-continued
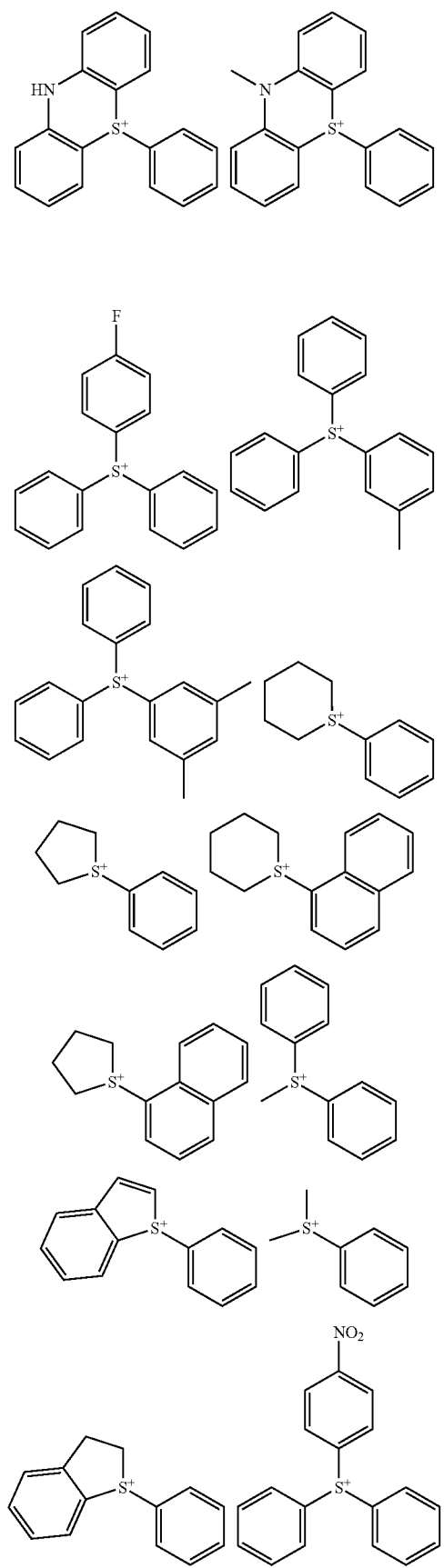
-continued
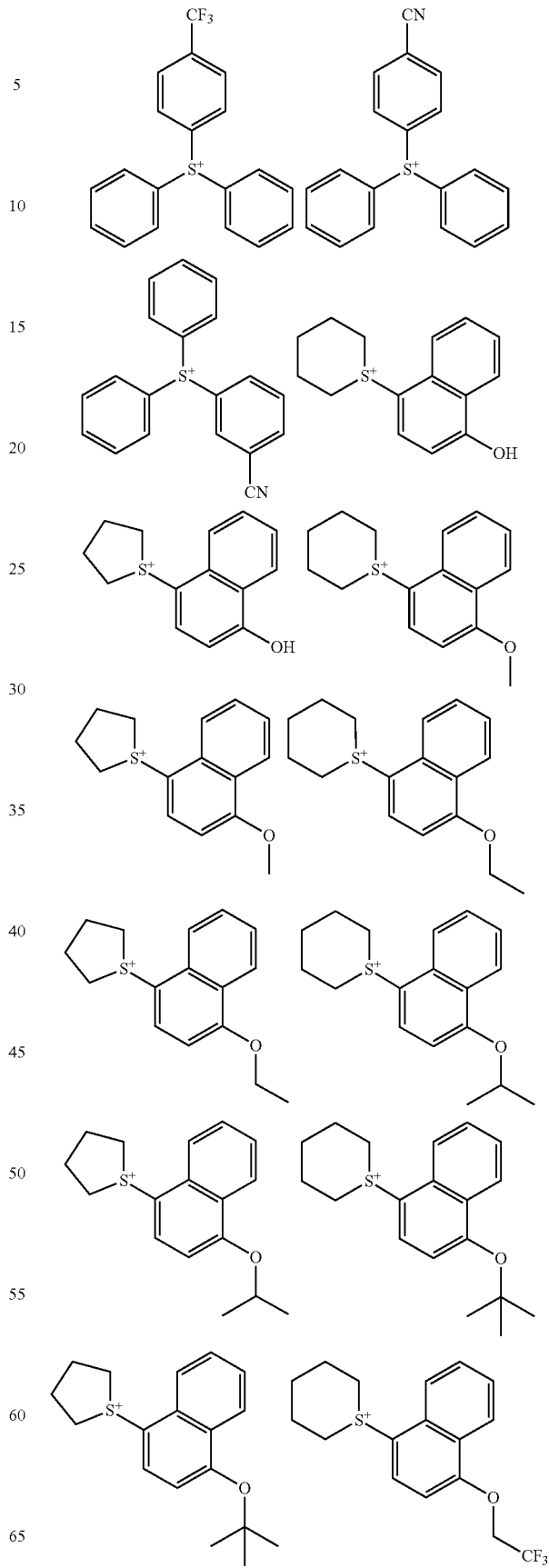

-continued
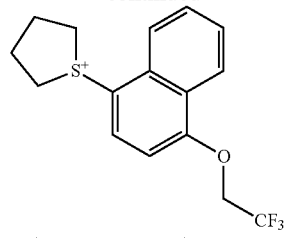
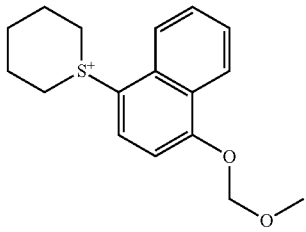
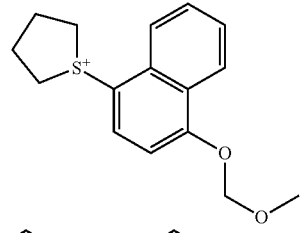
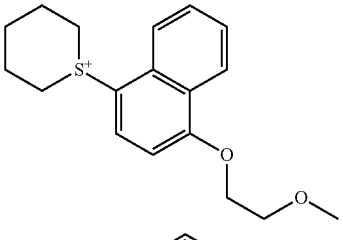
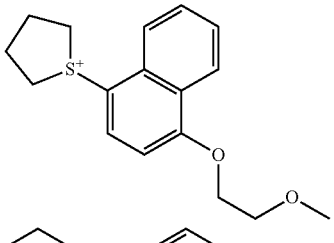
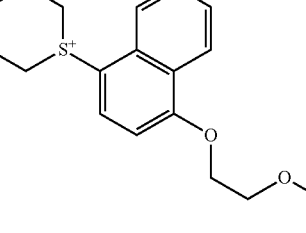
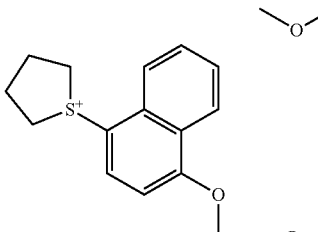
-continued
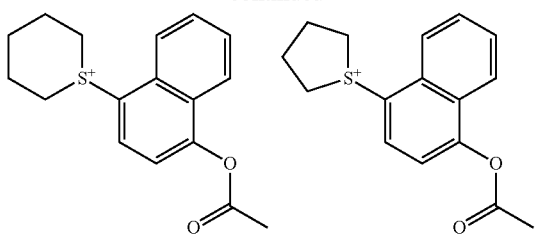
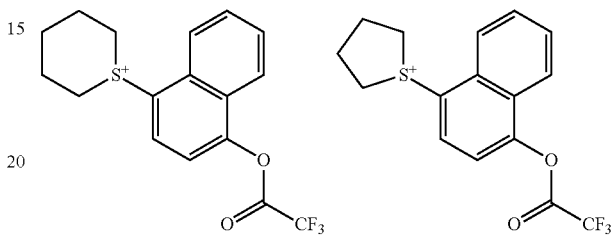
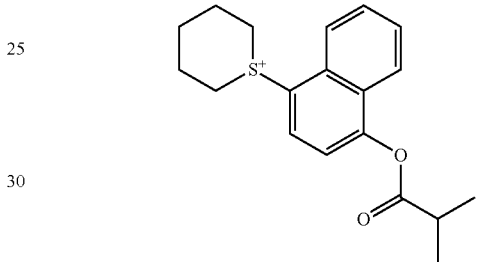
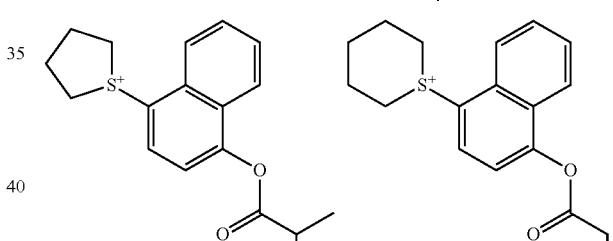
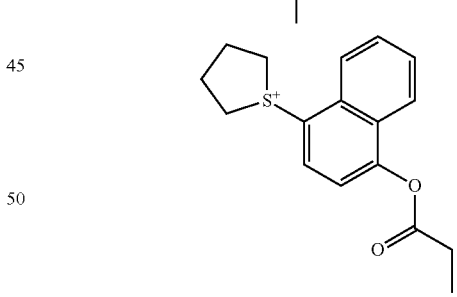
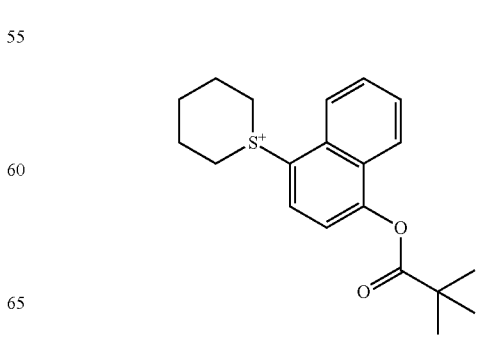

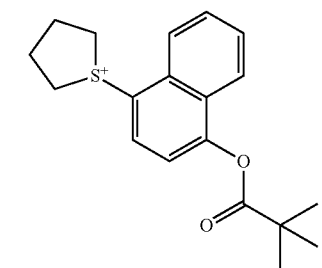
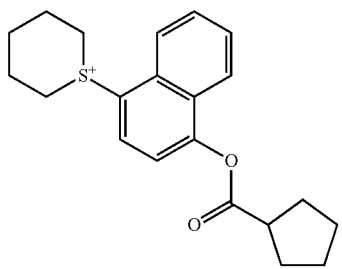
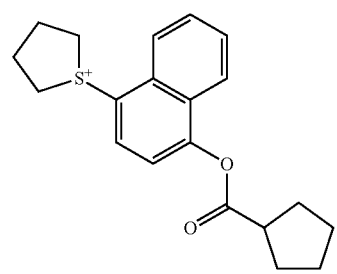
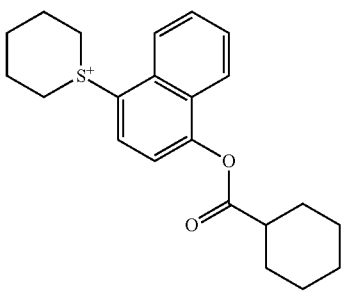
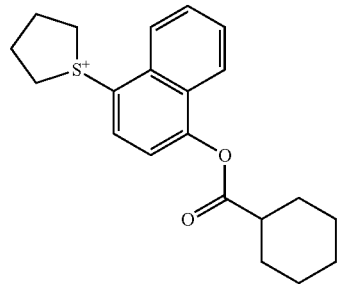
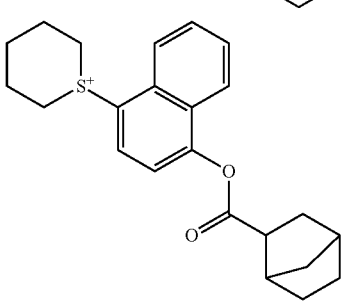
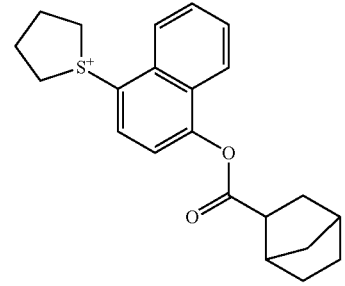
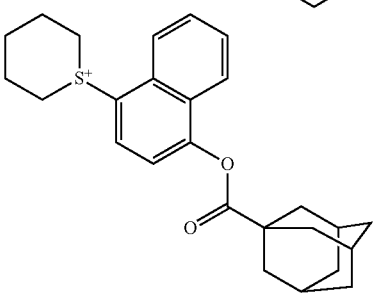
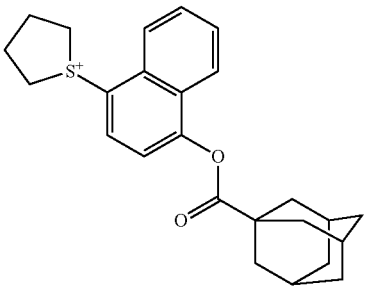
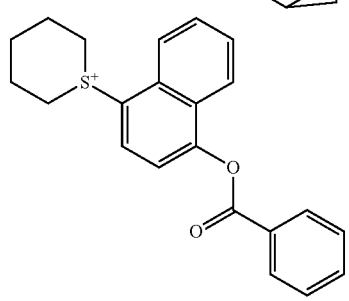
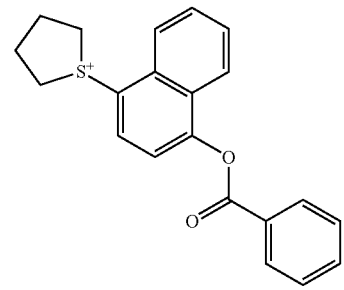
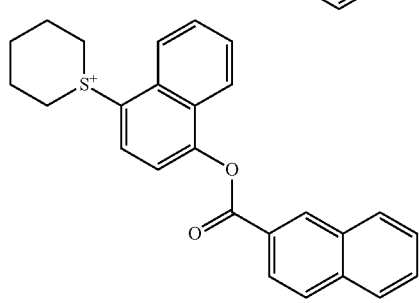

25
-continued
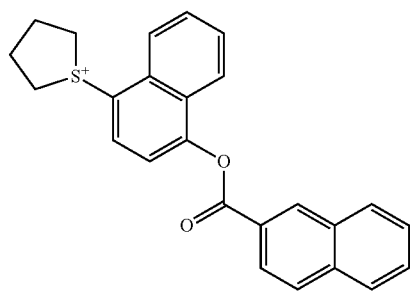
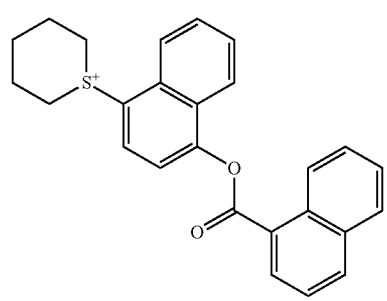
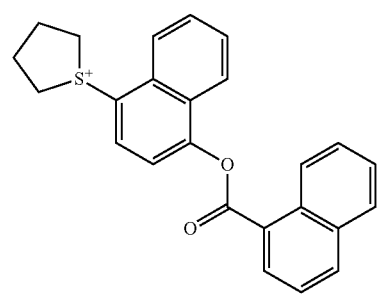
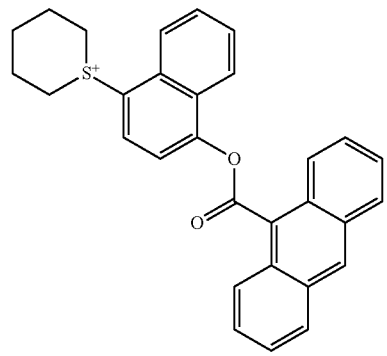
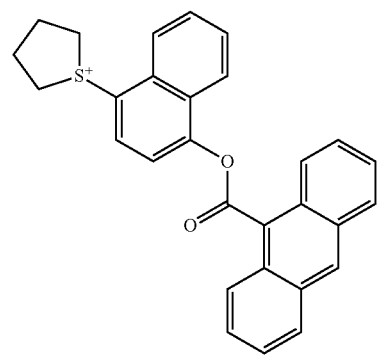
26
-continued
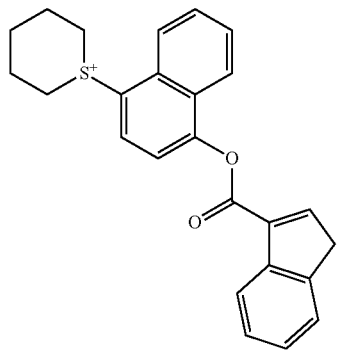
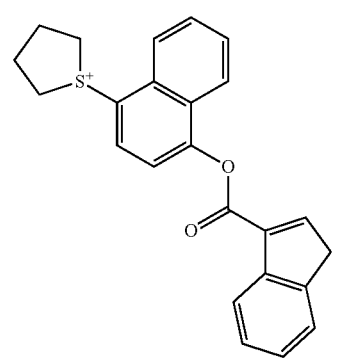
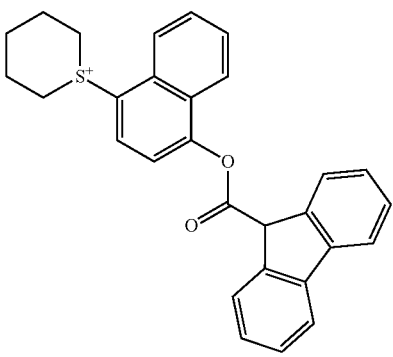
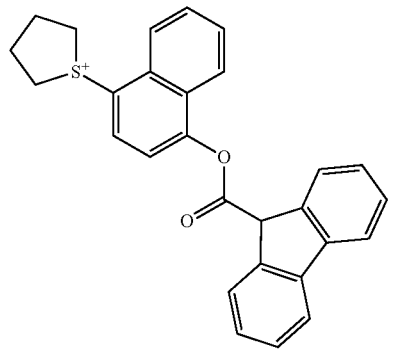
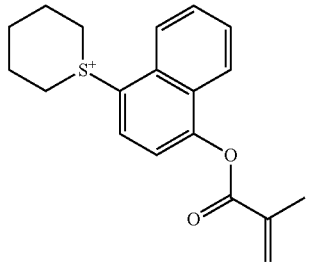

27
-continued
28
-continued
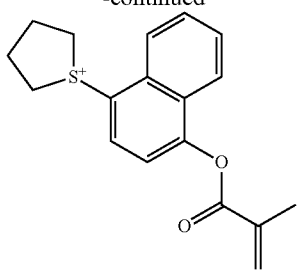
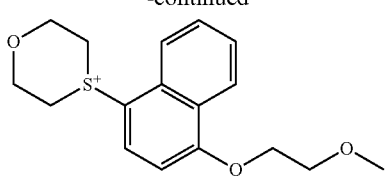
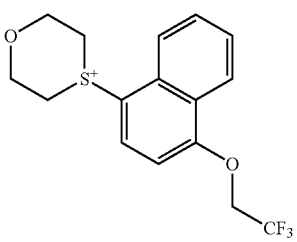
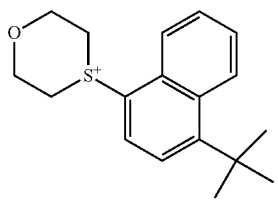
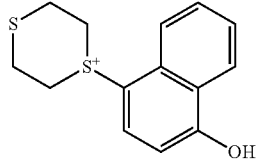
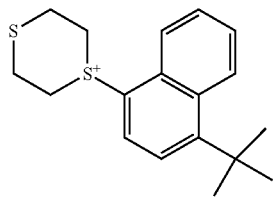
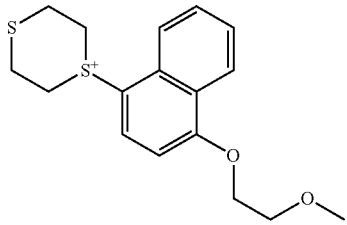
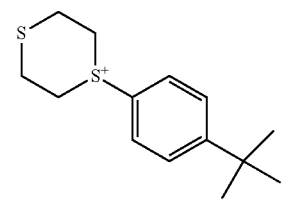
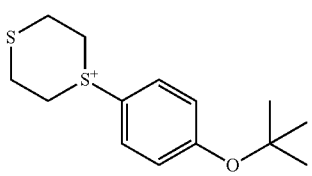

29
-continued
30
-continued
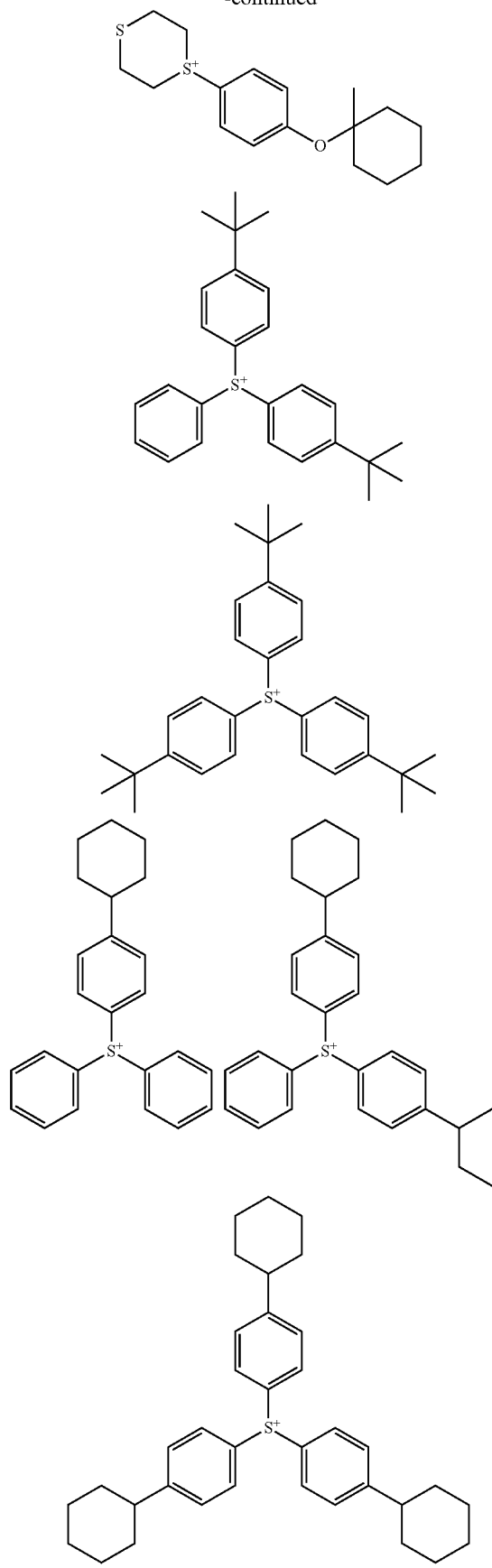
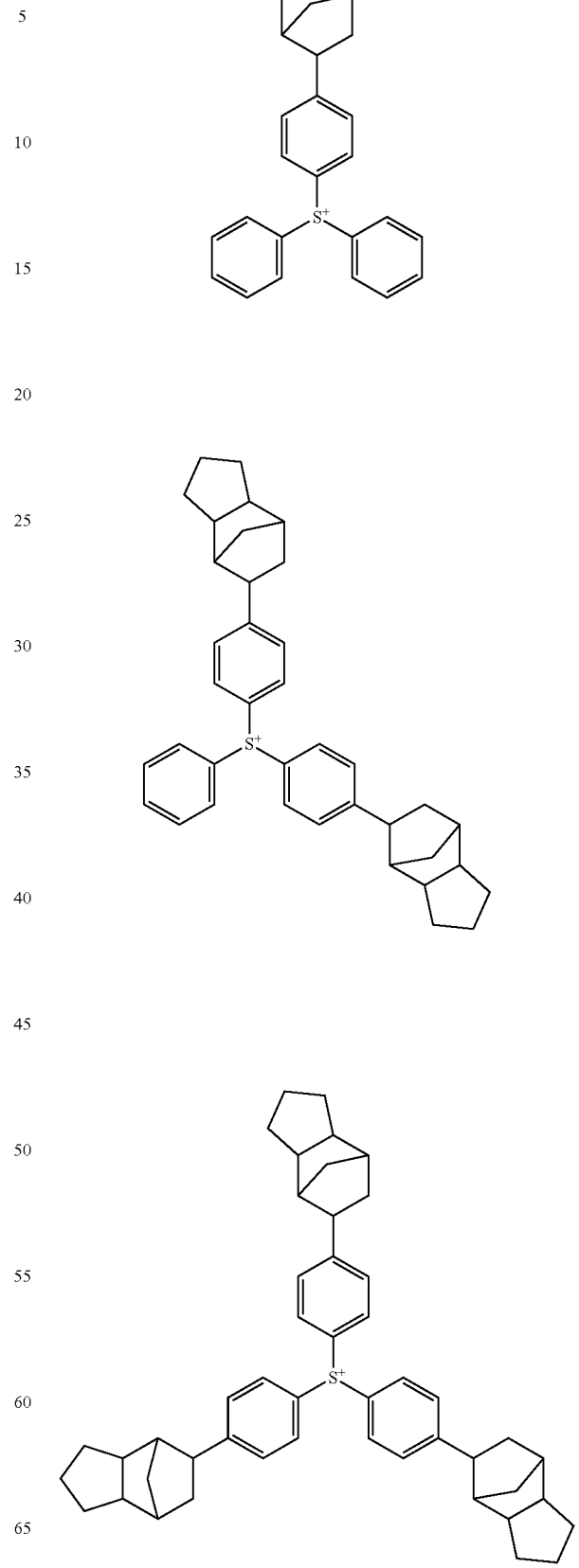

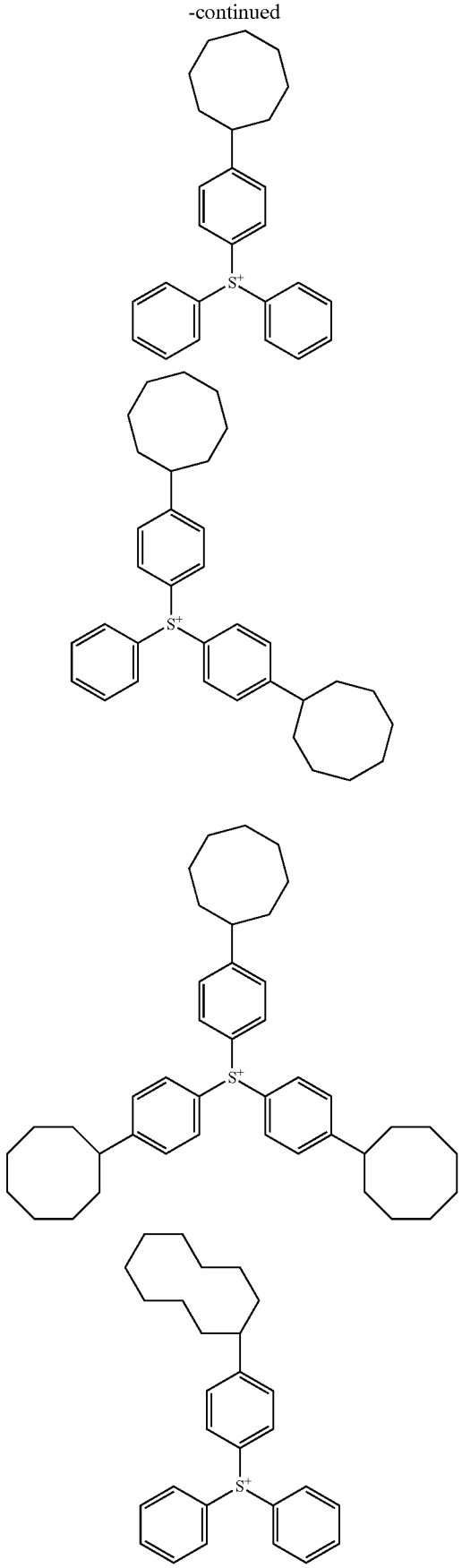
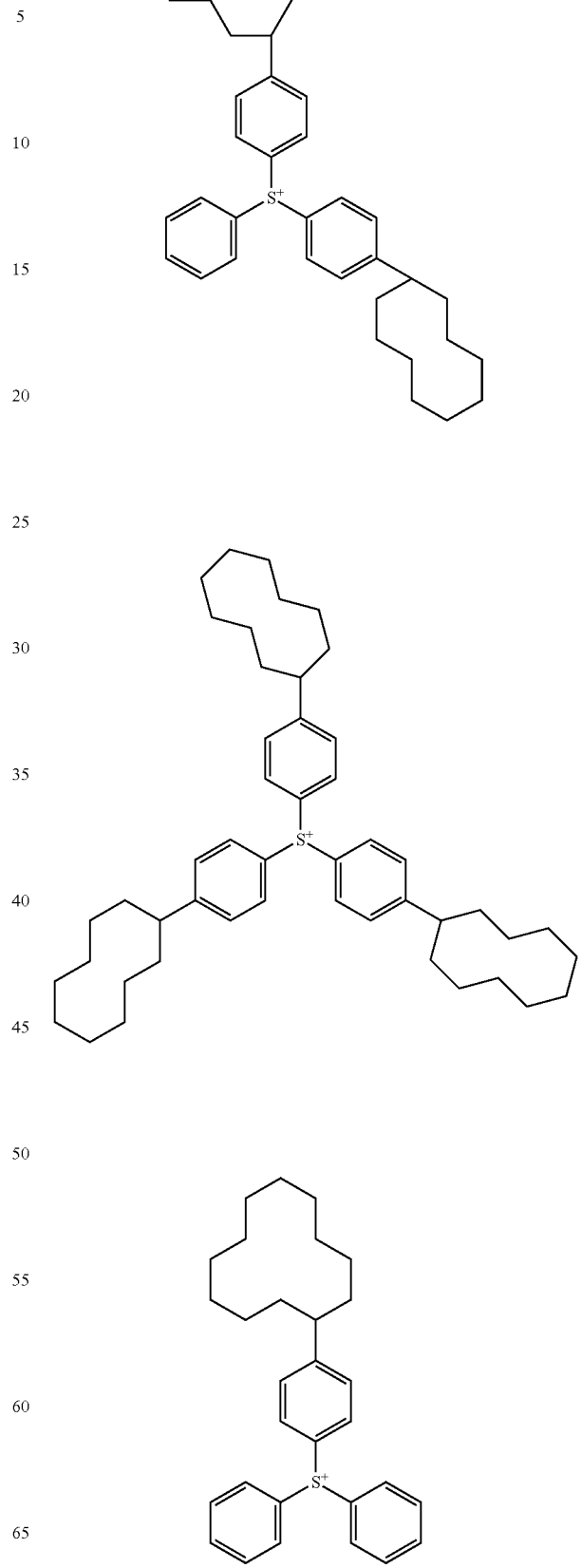

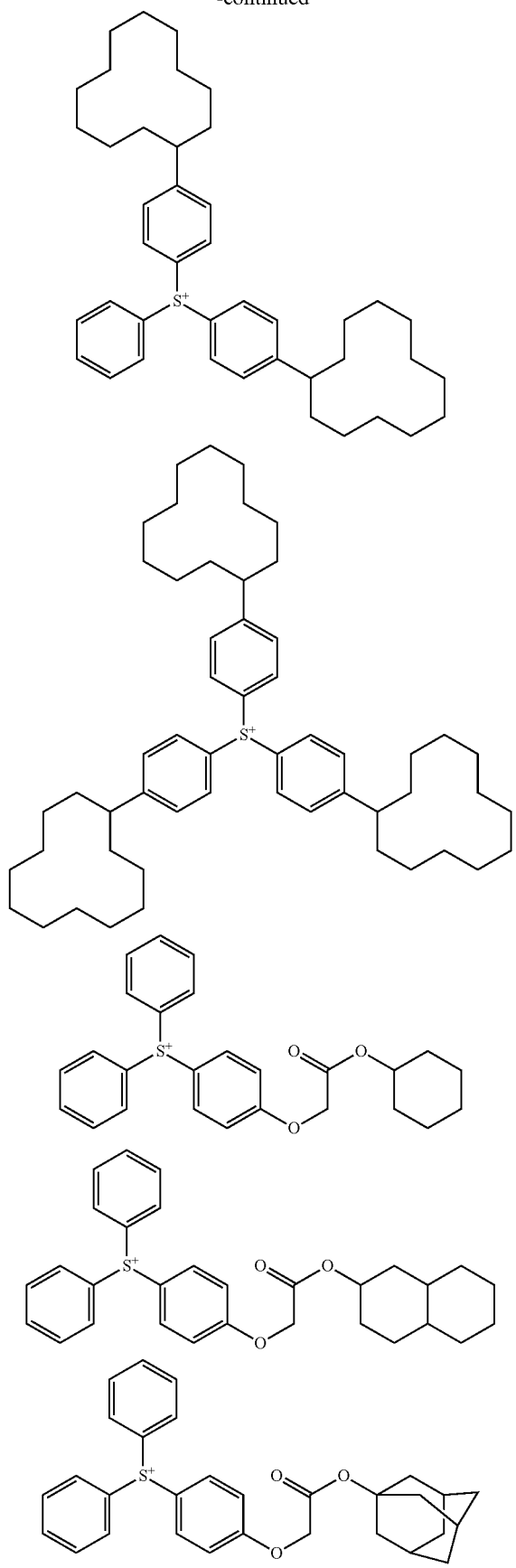

-continued
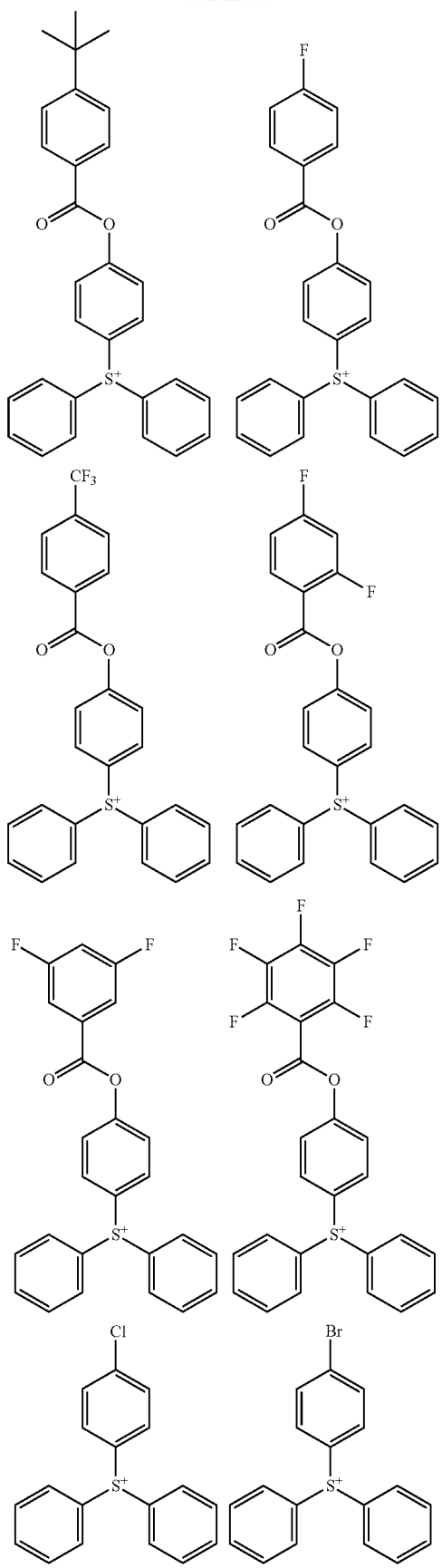
-continued
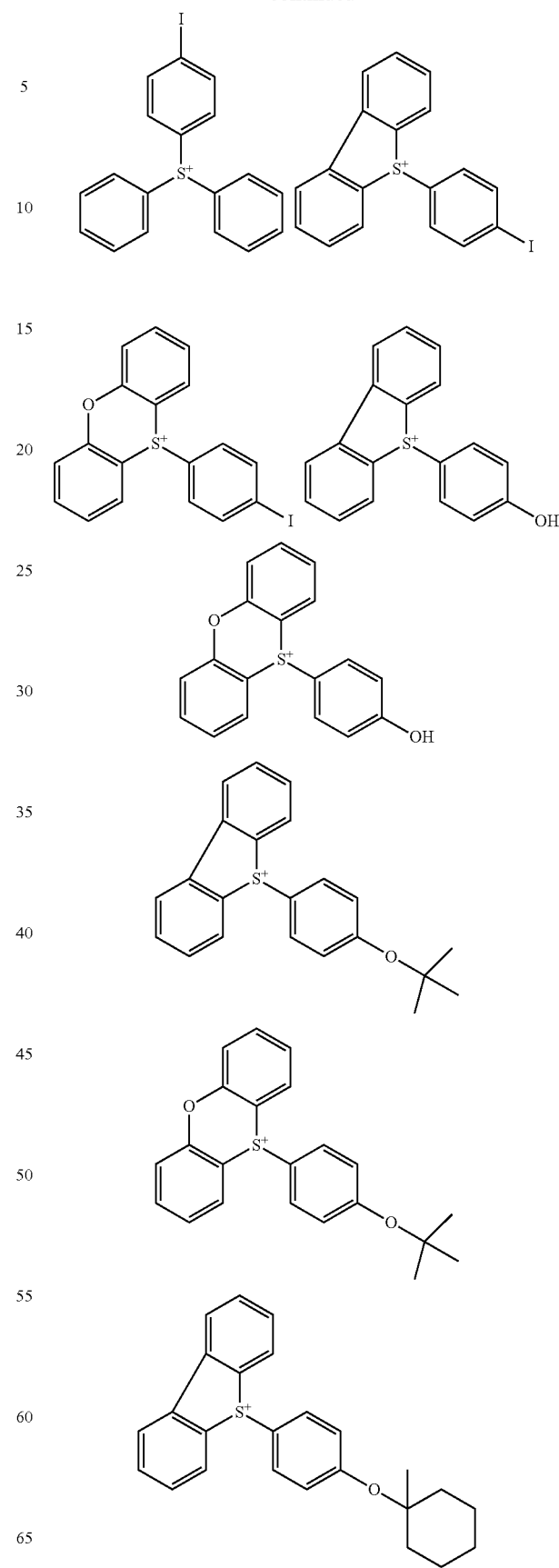

37
-continued
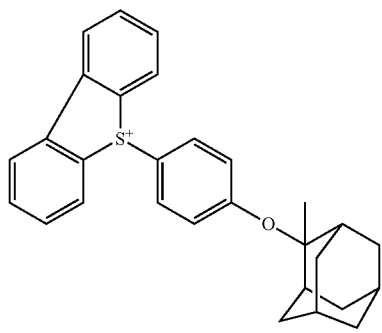
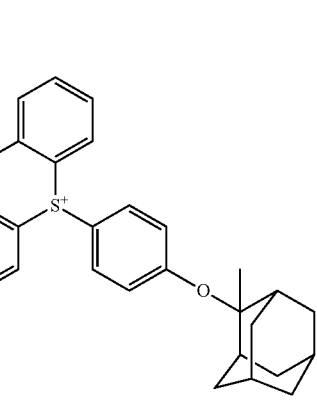
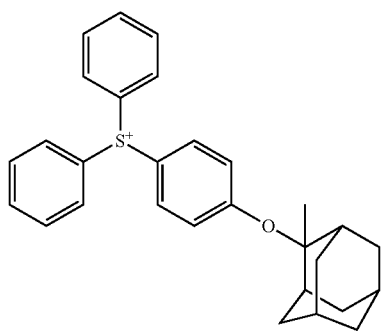
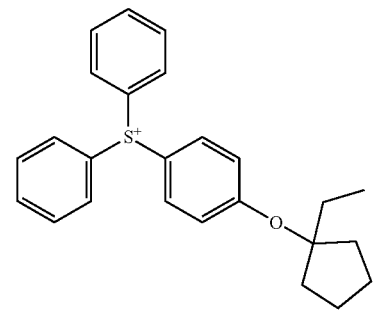
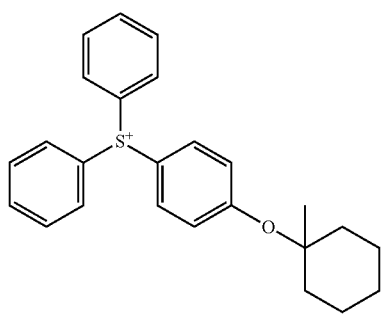
38
-continued
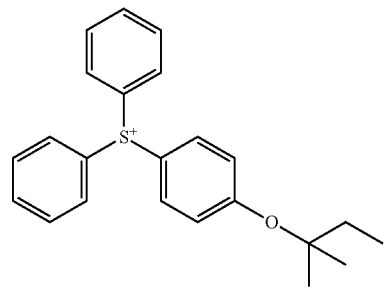
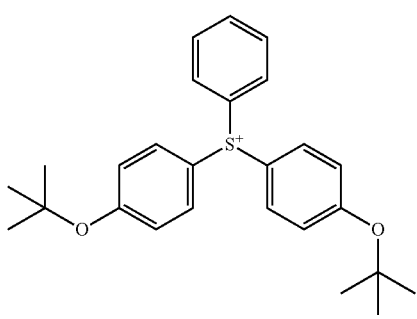
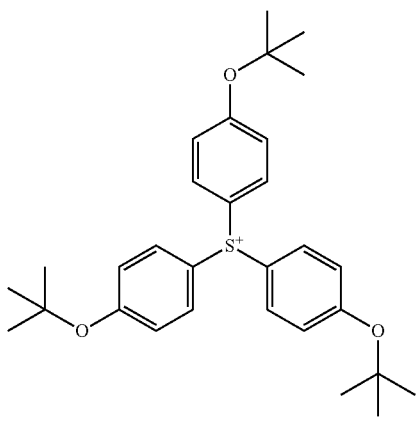
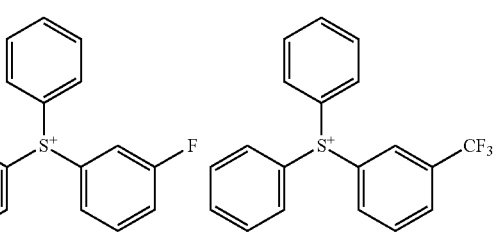
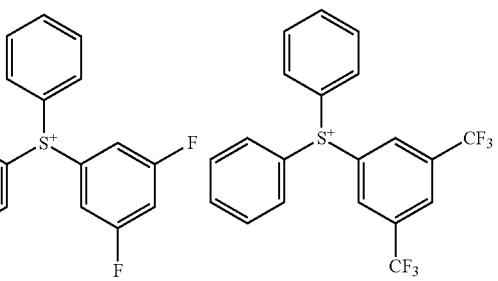

-continued
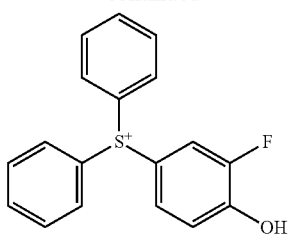
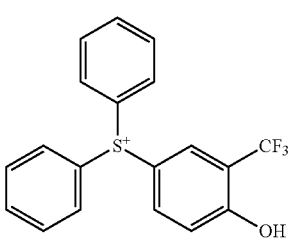
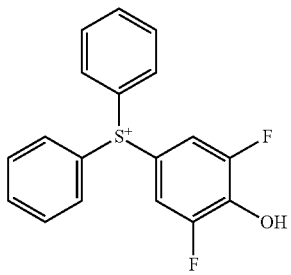
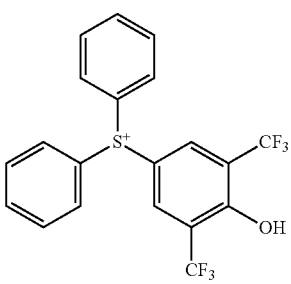
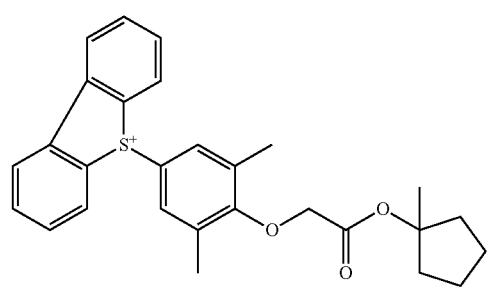
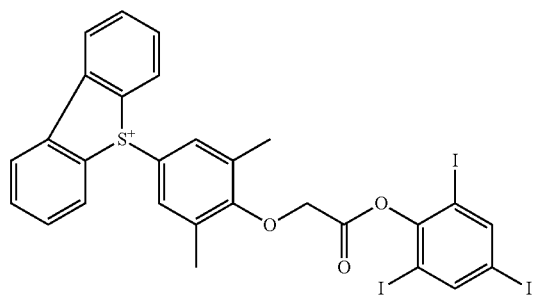
-continued
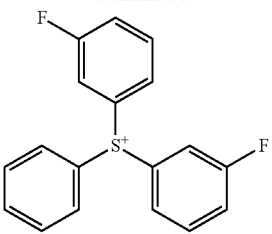
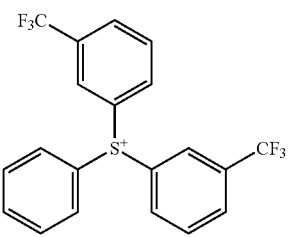
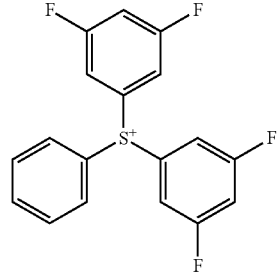
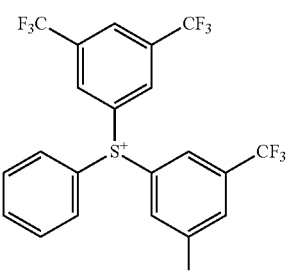
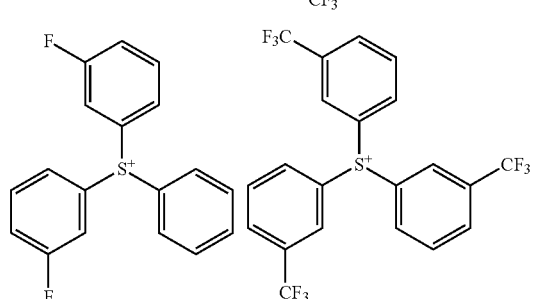
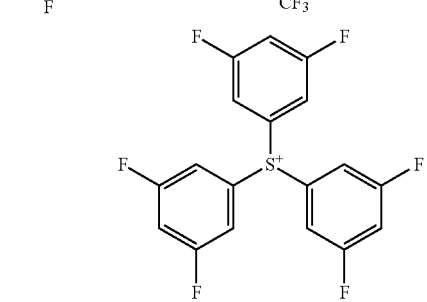

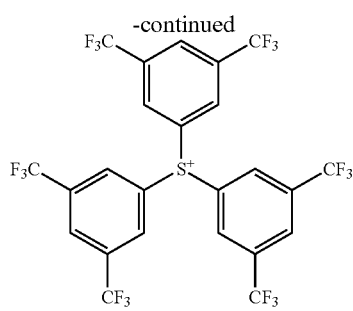
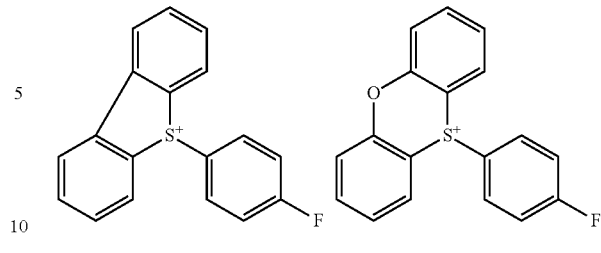
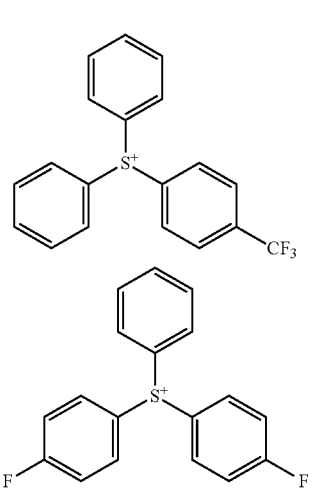
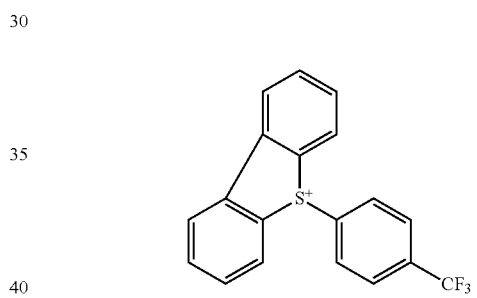
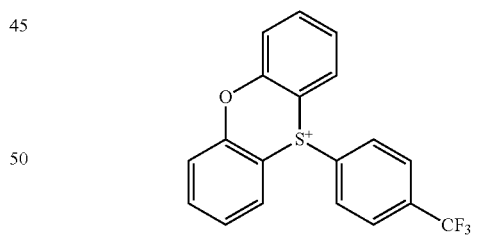
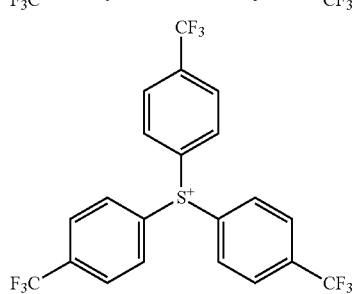
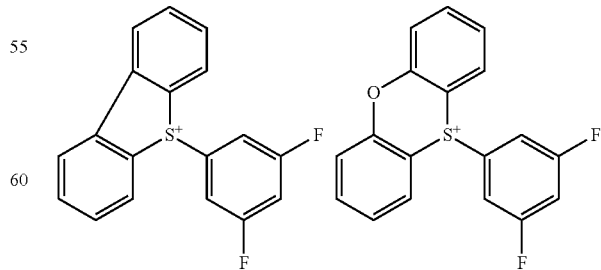
Examples of the cation in the iodonium salt having the formula (2) are given below, but not limited thereto.

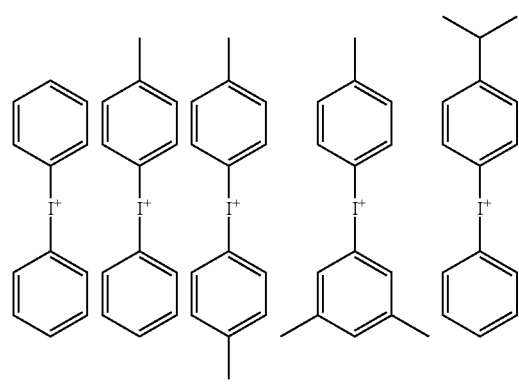

45
-continued
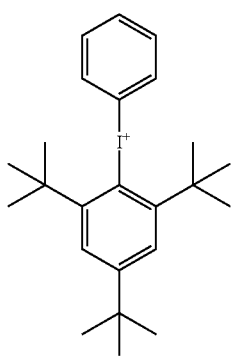
Examples of the anion in the sulfonium salt having the formula (1) and the iodonium salt having the formula (2) are given below, but not limited thereto.
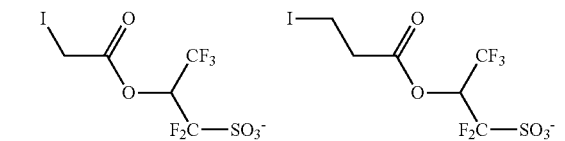
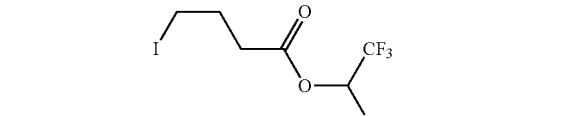
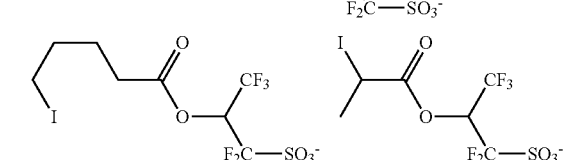
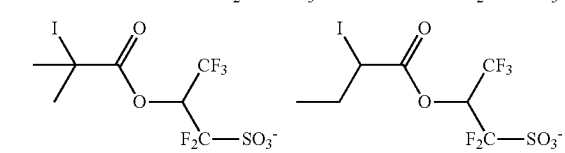
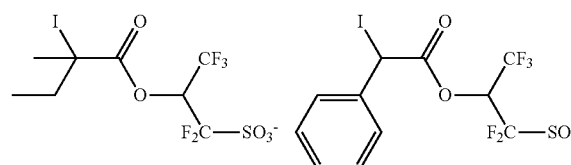
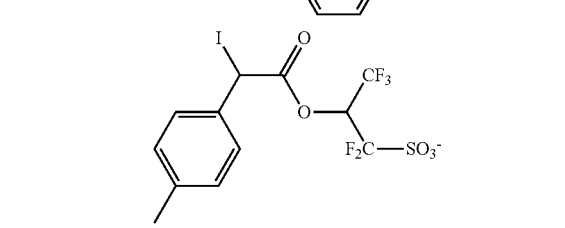
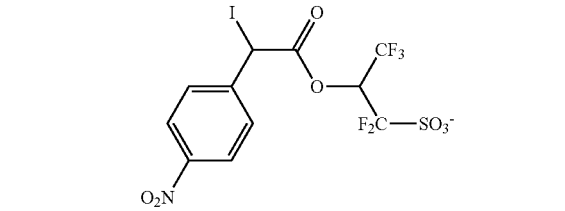
46
-continued
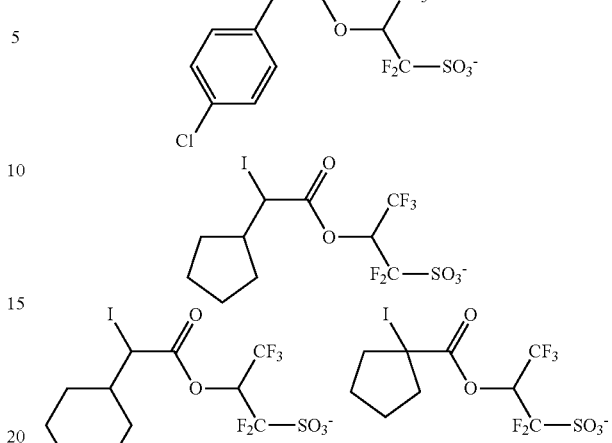
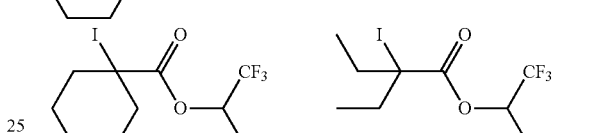
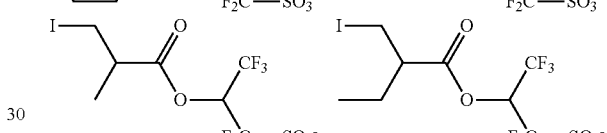
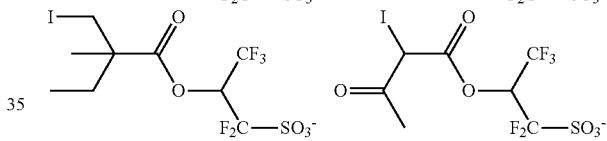
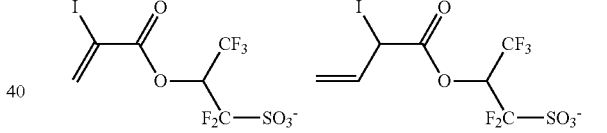
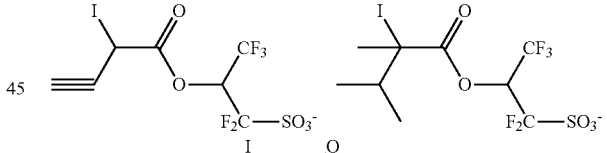
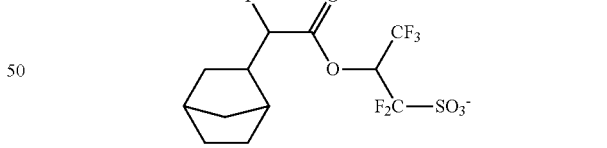
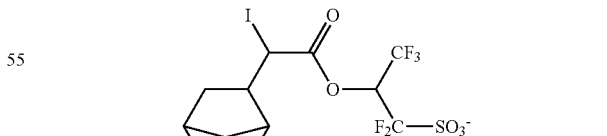
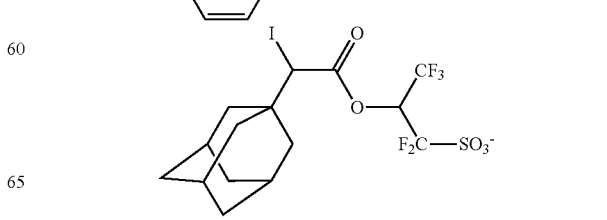

-continued
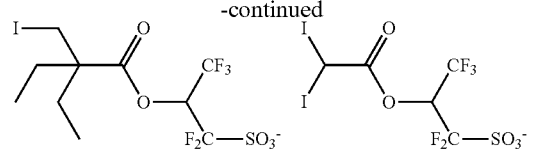
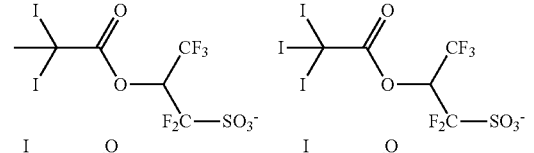
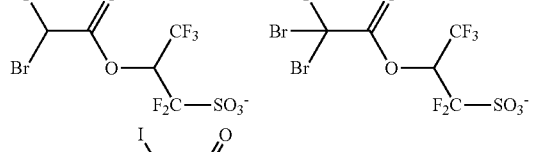
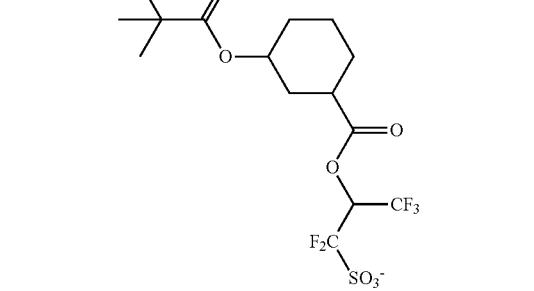
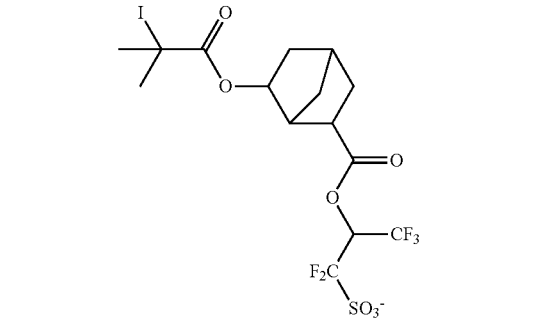
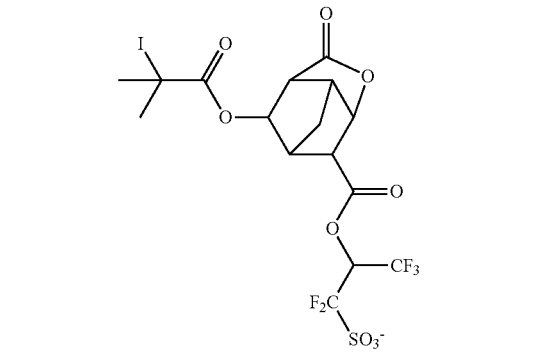
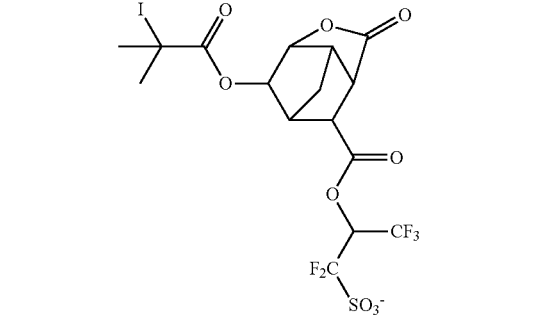
-continued
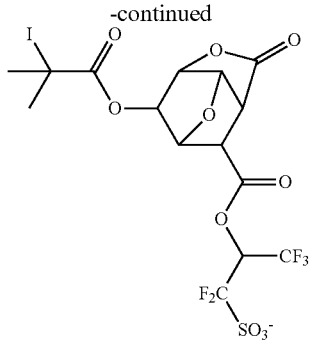
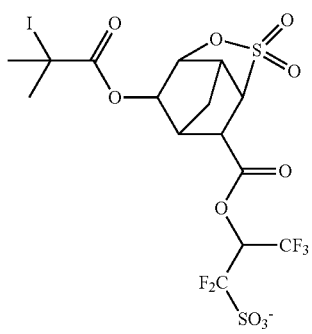
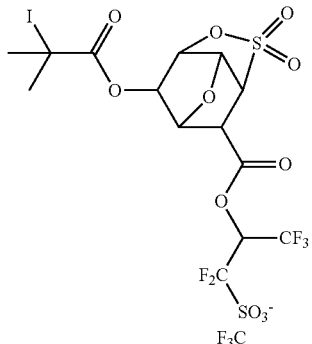
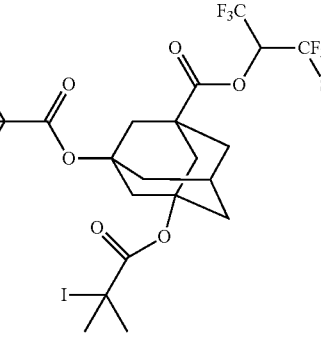
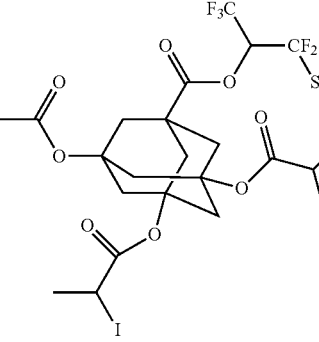

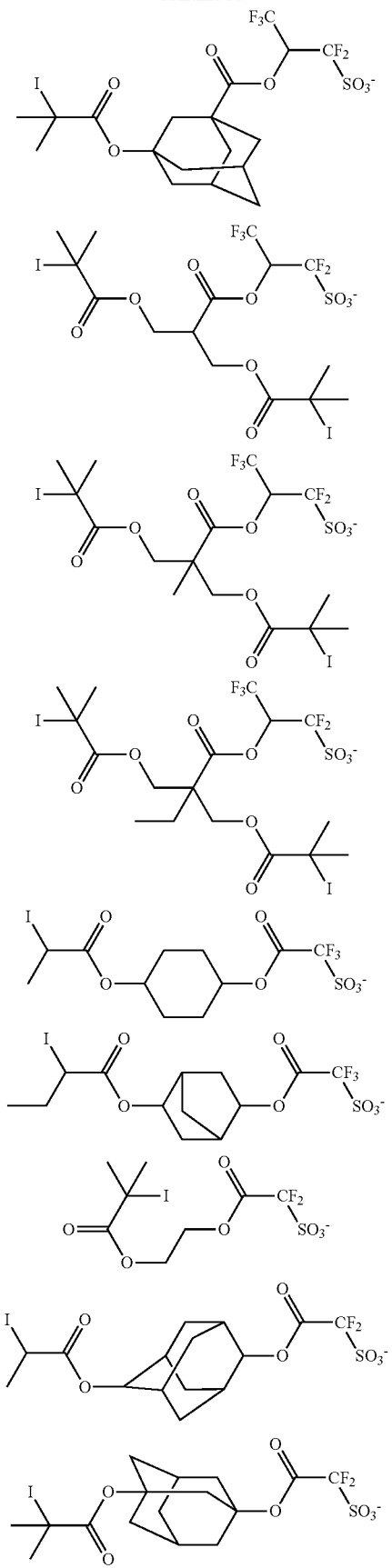
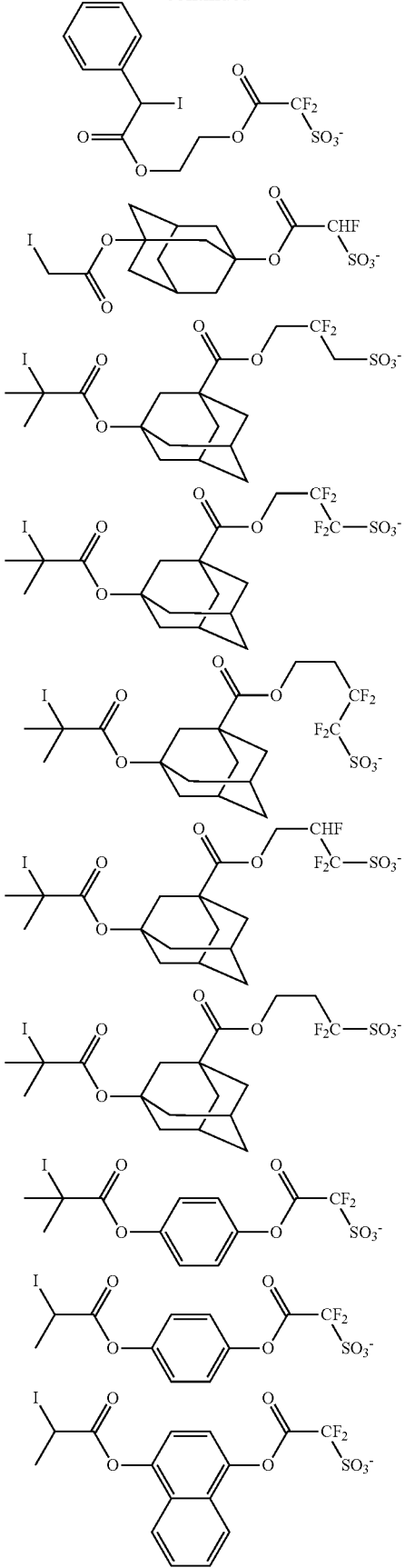

-continued

-continued
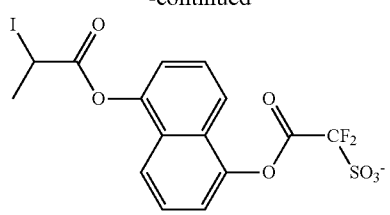
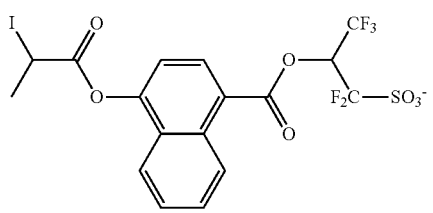
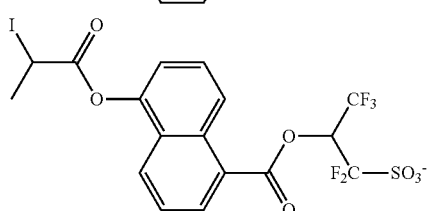
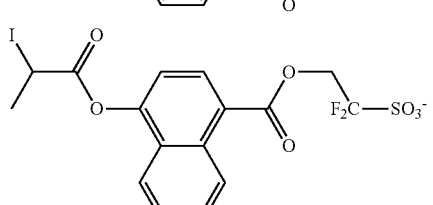
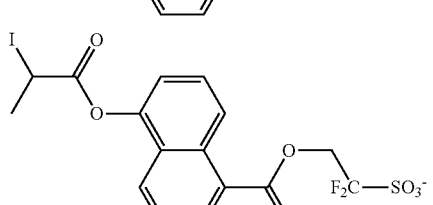
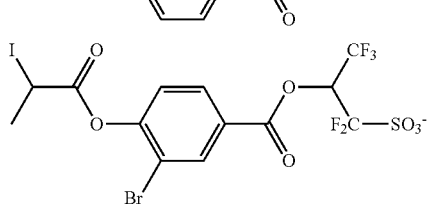
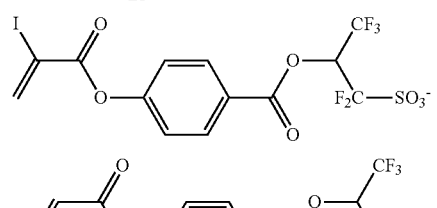
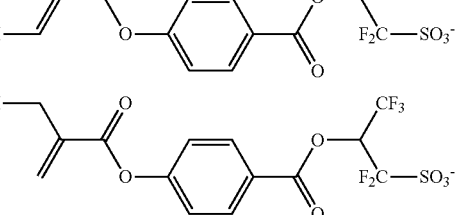
-continued
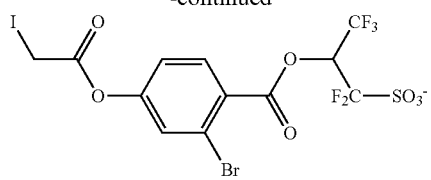
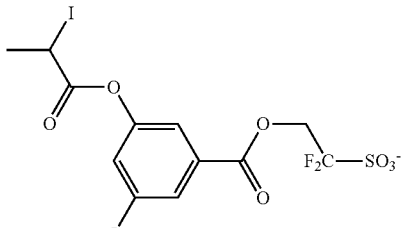
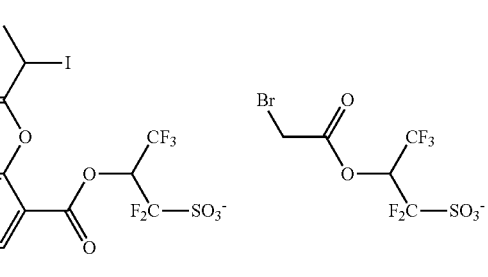
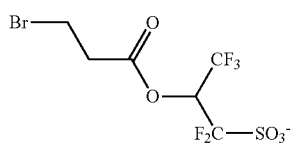
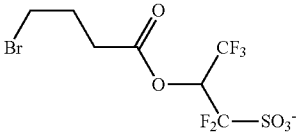
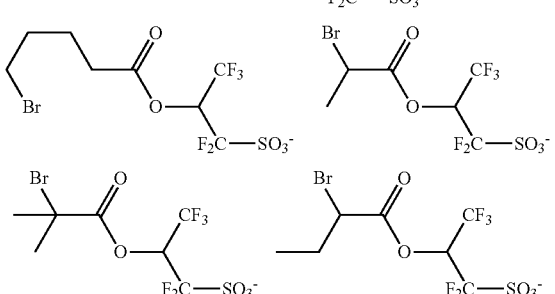
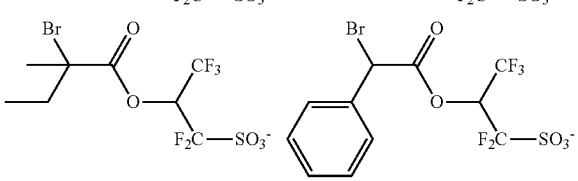
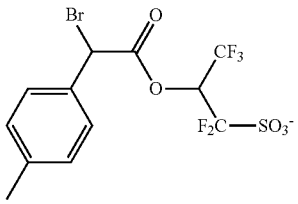

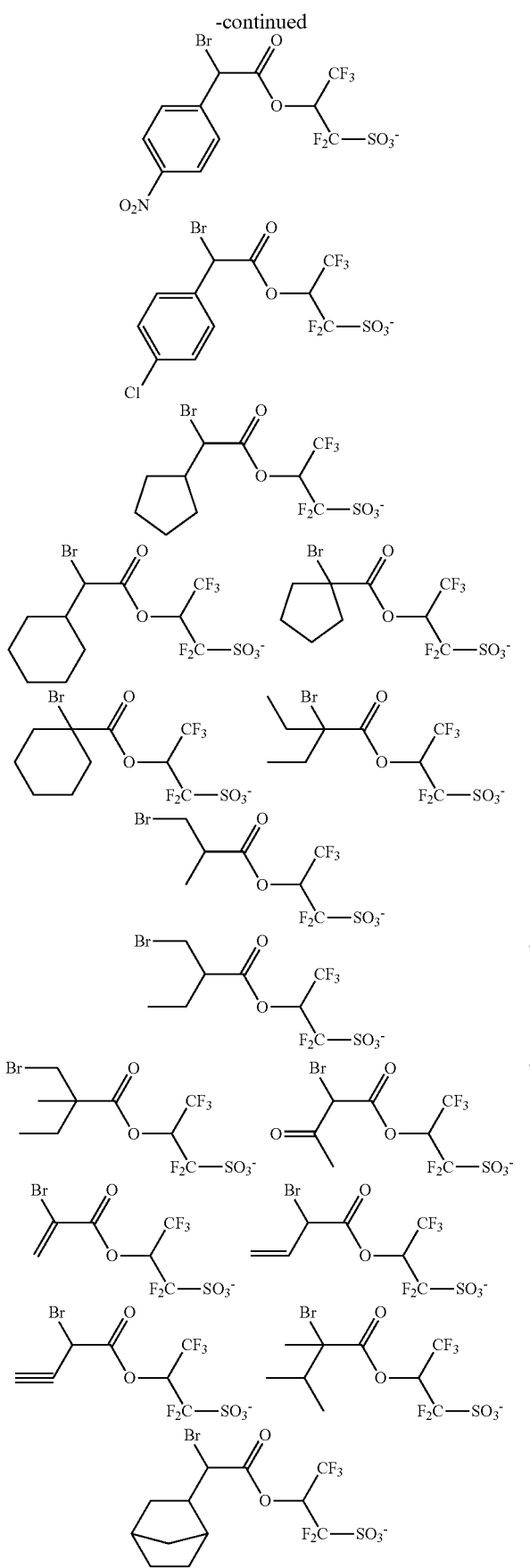
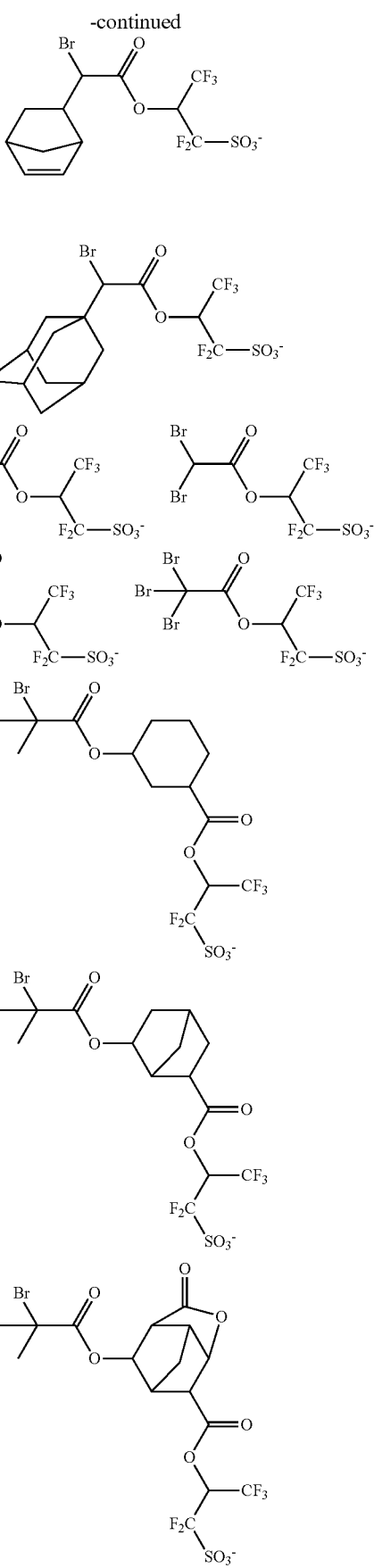

57
-continued
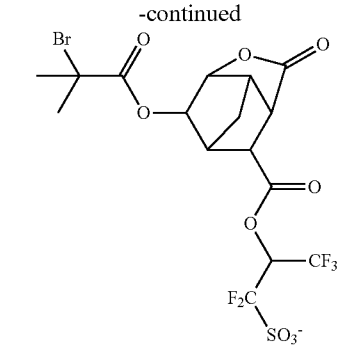
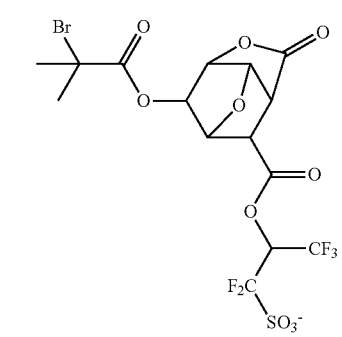
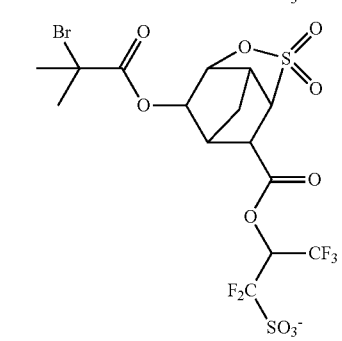
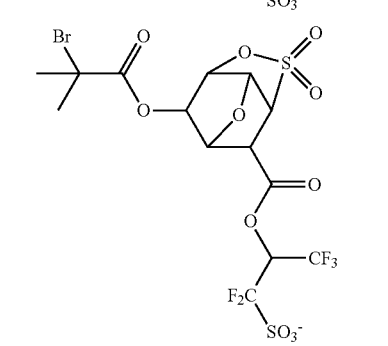
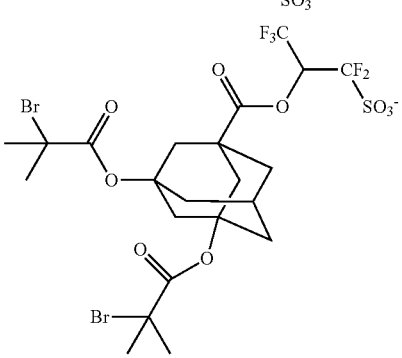
58
-continued
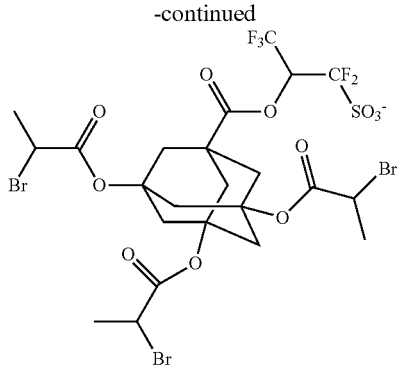
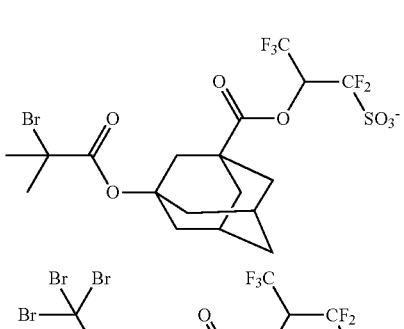
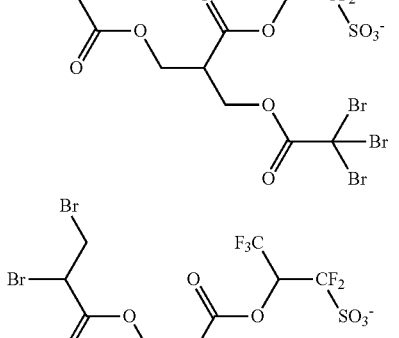
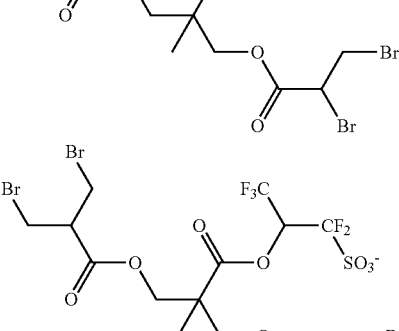
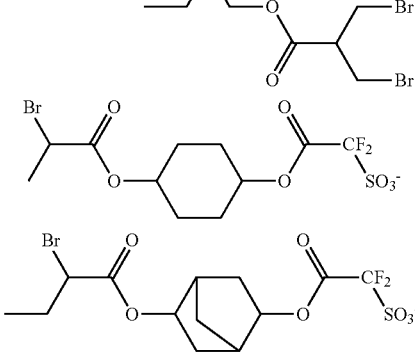

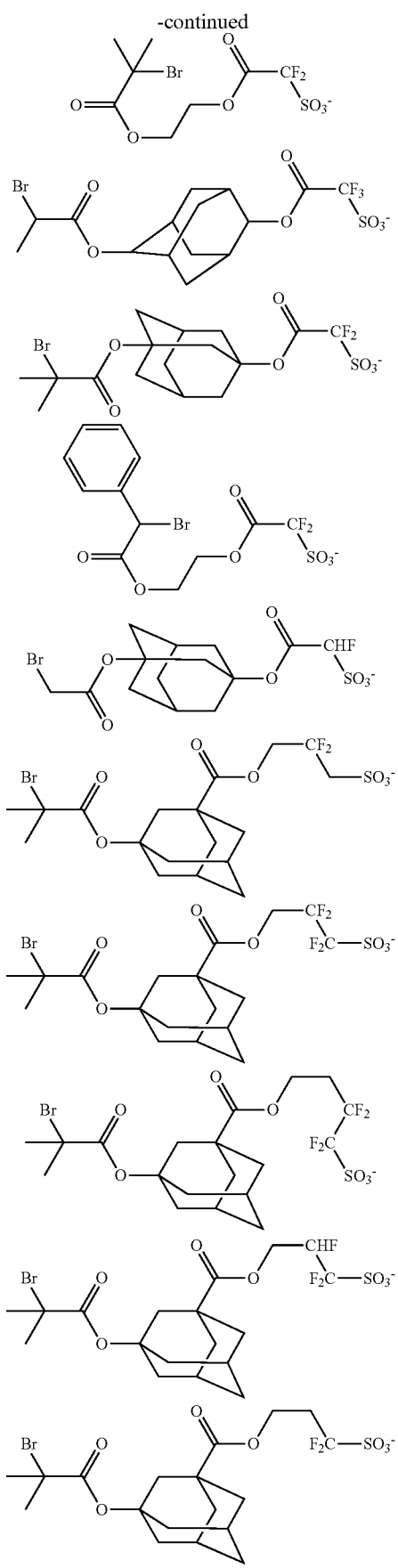
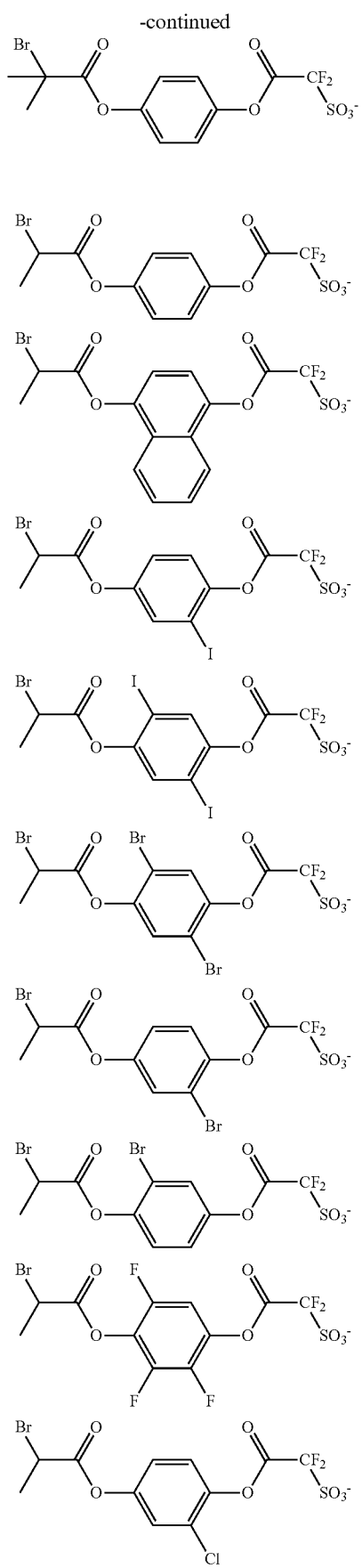

-continued
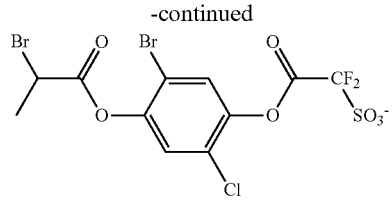
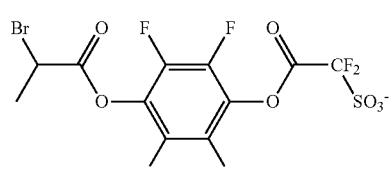
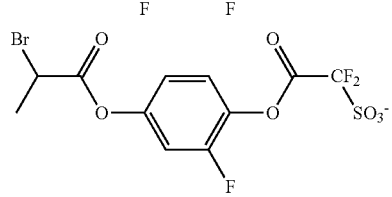
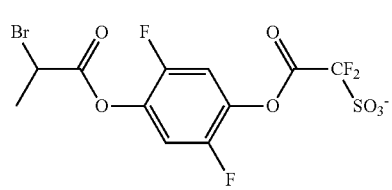
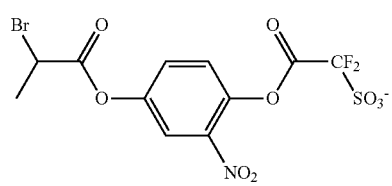
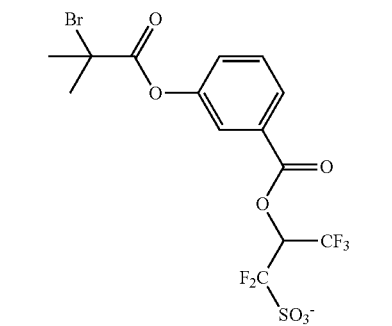
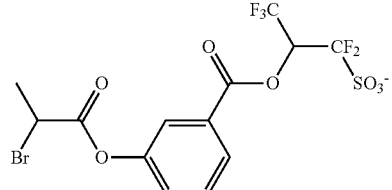
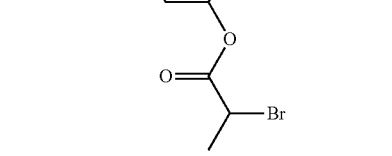
-continued
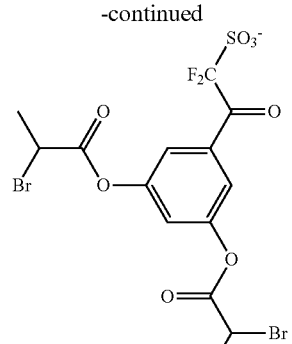
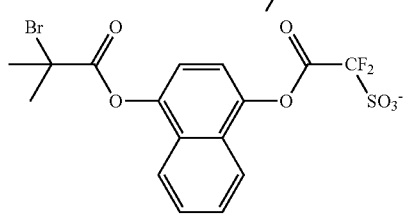
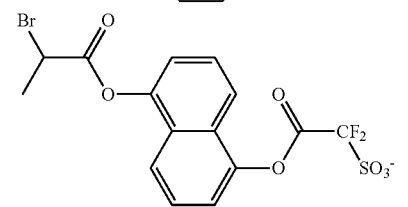
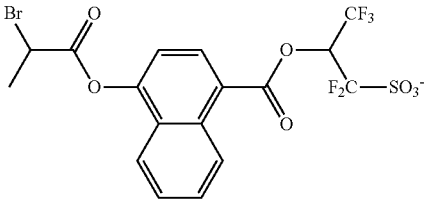
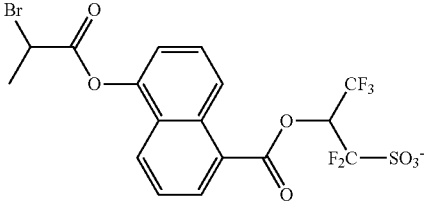
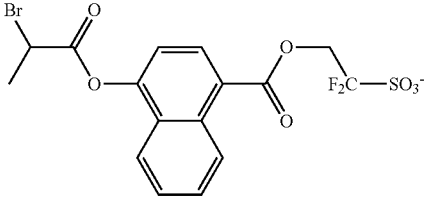
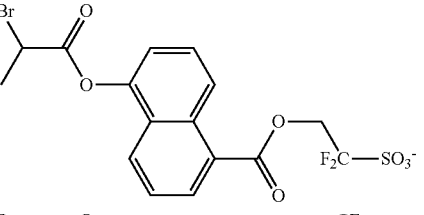
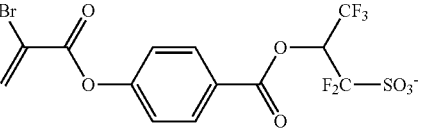

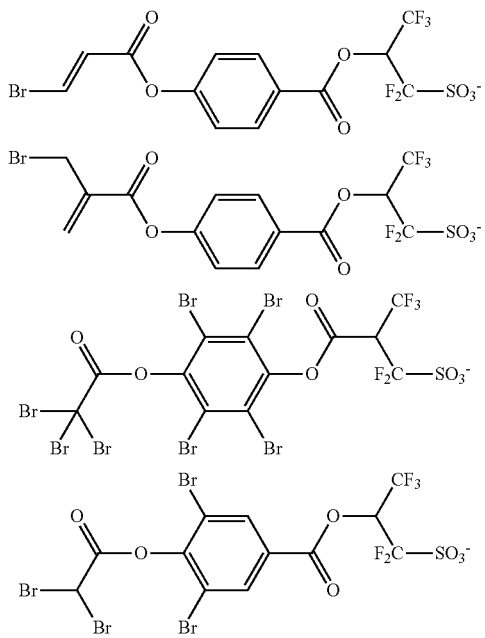

The sulfonium salt having the formula (1) or the iodonium salt having the formula (2) may be synthesized, for example, by ion exchange between an iodized or brominated hydrocarbylcarbonyloxy group-containing fluorinated sulfonic acid and a sulfonium or iodonium salt of a weaker acid than the sulfonic acid. Examples of the weaker acid than the iodized or brominated hydrocarbylcarbonyloxy group-containing fluorinated sulfonic acid include carbonic acid and hydrochloric acid. Alternatively, the sulfonium or iodonium salt may be synthesized by ion exchange between a sodium or ammonium salt of an iodized or brominated hydrocarbylcarbonyloxy group-containing fluorinated sulfonic acid and a sulfonium or iodonium chloride.

In the resist composition, the sulfonium or iodonium salt having the formula (1) or (2) is preferably used in an amount of 0.01 to 1,000 parts by weight, more preferably 0.05 to 500 parts by weight per 100 parts by weight of the base polymer (described below), as viewed from sensitivity and acid diffusion suppressing effect.

Base Polymer

Where the resist composition is of positive tone, the base polymer contained in the resist composition comprises recurring units containing an acid labile group, preferably recurring units having the formula (a1) or recurring units having the formula (a2). These units are simply referred to as recurring units (a1) and (a2).

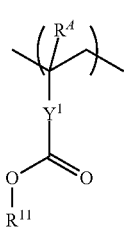

(a1)

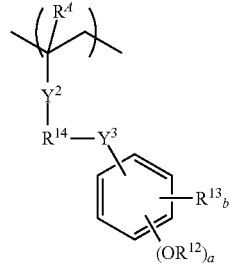

(a2)

Herein $R^A$ is each independently hydrogen or a methyl group. $Y^1$ is a single bond, a phenylene group, a naphthylene group, or a $C_1$-$C_{12}$ linking group containing at least one selected from an ester bond and a lactone ring. $Y^2$ is a single bond or an ester bond. $Y^3$ is a single bond, an ether bond, or an ester bond. $R^{11}$ and $R^{12}$ each are an acid labile group. $R^{13}$ is fluorine, a trifluoromethyl group, a cyano group, a $C_1$-$C_6$ saturated hydrocarbyl group, a $C_1$-$C_6$ saturated hydrocarbyloxy group, a $C_2$-$C_7$ saturated hydrocarbylcarbonyl group, a $C_2$-$C_7$ saturated hydrocarbylcarbonyloxy group, or a $C_2$-$C_7$ saturated hydrocarbyloxycarbonyl group. $R^{14}$ is a single bond or a $C_1$-$C_6$ alkanediyl group in which some carbon may be replaced by an ether bond or an ester bond, a is 1 or 2. b is an integer of 0 to 4.

Examples of the monomer from which the recurring units (a1) are derived are shown below, but not limited thereto. $R^A$ and $R^{11}$ are as defined above.

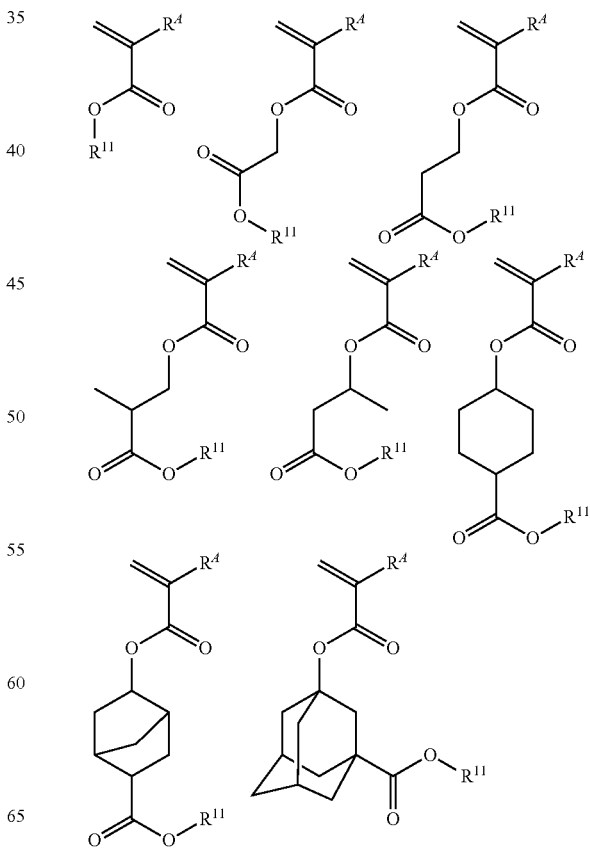

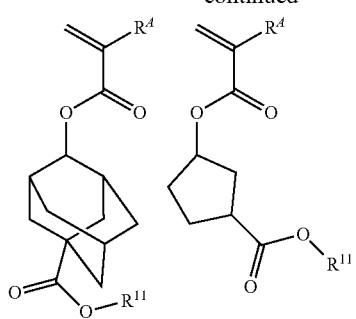
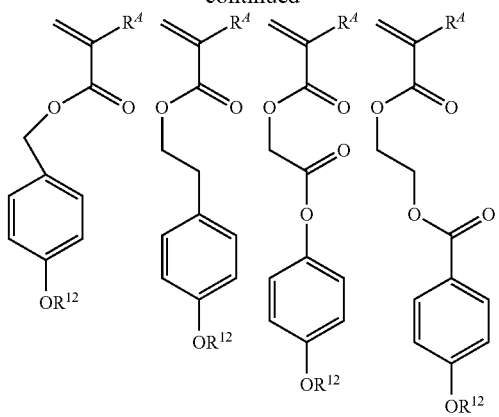
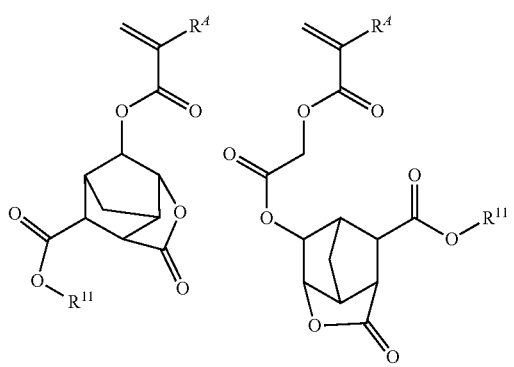
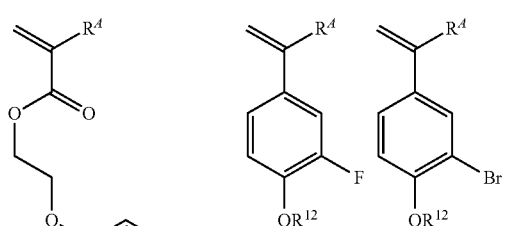
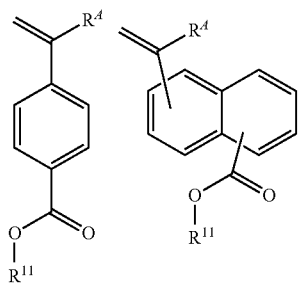
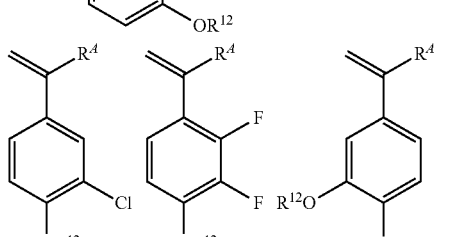
Examples of the monomer from which the recurring units (a2) are derived are shown below, but not limited thereto. $R^A$ and $R^{12}$ areas defined above.
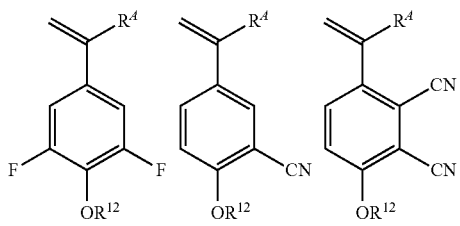
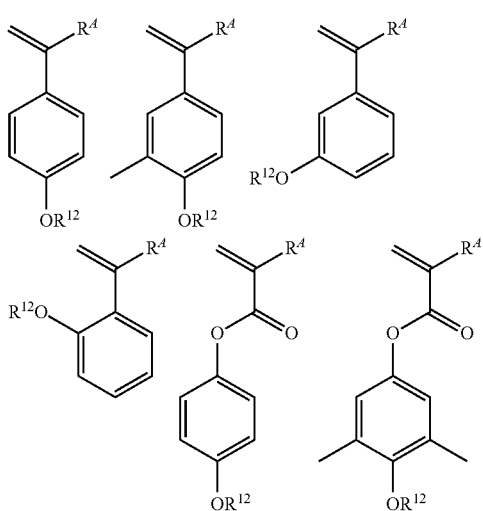

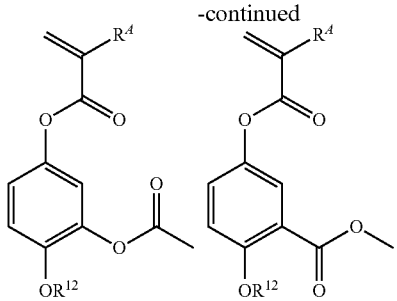

The acid labile groups represented by $R^{11}$ and $R^{12}$ in the recurring units (a1) and (a2) may be selected from a variety of such groups, for example, those groups described in JP-A 2013-80033 and JP-A 2013-83821.

Typical of the acid labile group are groups of the following formulae (AL-1) to (AL-3).

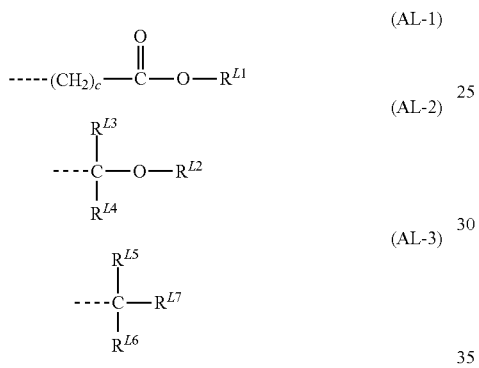

Herein the broken line designates a point of attachment.

In the formulae (AL-1) and (AL-2), $R^{L1}$ and $R^{L2}$ are each independently a $C_1$-$C_{40}$ hydrocarbyl group which may contain a heteroatom such as oxygen, sulfur, nitrogen, or fluorine. The hydrocarbyl group may be saturated or unsaturated, and may be straight, branched, or cyclic. Inter alia, $C_1$-$C_{40}$ saturated hydrocarbyl groups are preferred, with $C_1$-$C_{20}$ saturated hydrocarbyl group being more preferred.

In the formula (AL-1), c is an integer of 0 to 10, preferably 1 to 5.

In the formula (AL-2), $R^{L3}$ and $R^{L4}$ are each independently hydrogen or a $C_1$-$C_{20}$ hydrocarbyl group which may contain a heteroatom such as oxygen, sulfur, nitrogen, or fluorine. The hydrocarbyl group may be saturated or unsaturated, and may be straight, branched, or cyclic. Inter alia, $C_1$-$C_{20}$ saturated hydrocarbyl groups are preferred. Any two of $R^{L2}$, $R^{L3}$, and $R^{L4}$ may bond together to form a ring, typically alicyclic, with the carbon atom or carbon and oxygen atoms to which they are attached, the ring containing 3 to 20 carbon atoms, preferably 4 to 16 carbon atoms.

In the formula (AL-3), $R^{L5}$, $R^{L6}$, and $R^{L7}$ are each independently a $C_1$-$C_{20}$ hydrocarbyl group which may contain a heteroatom such as oxygen, sulfur, nitrogen, or fluorine. The hydrocarbyl group may be saturated or unsaturated, and may be straight, branched, or cyclic. Inter alia, $C_1$-$C_{20}$ saturated hydrocarbyl groups are preferred. Any two of $R^{L5}$, $R^{L6}$, and $R^{L7}$ may bond together to form a ring, typically alicyclic, with the carbon atom to which they are attached, the ring containing 3 to 20 carbon atoms, preferably 4 to 16 carbon atoms.

The base polymer may further comprise recurring units (b) having a phenolic hydroxyl group as an adhesive group. Examples of the monomer from which the recurring units (b) are derived are shown below, but not limited thereto. Herein $R^A$ is as defied above.

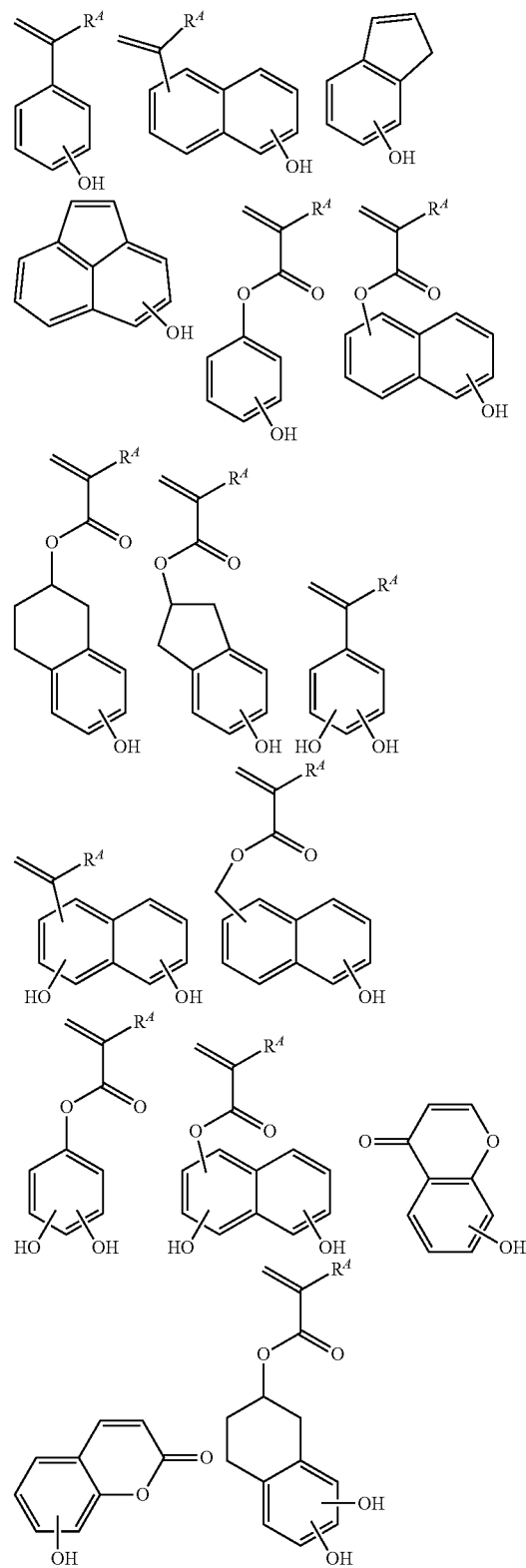

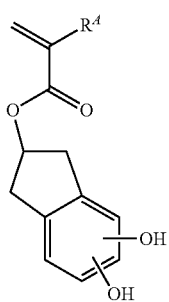

Further, recurring units (c) having another adhesive group selected from a hydroxyl group (other than the foregoing phenolic hydroxyl group), a lactone ring, an ether bond, an ester bond, a carbonyl group, or a cyano group may also be incorporated in the base polymer. Examples of the monomer from which the recurring units (c) are derived are shown below, but not limited thereto. Herein $R^A$ is as defined above.

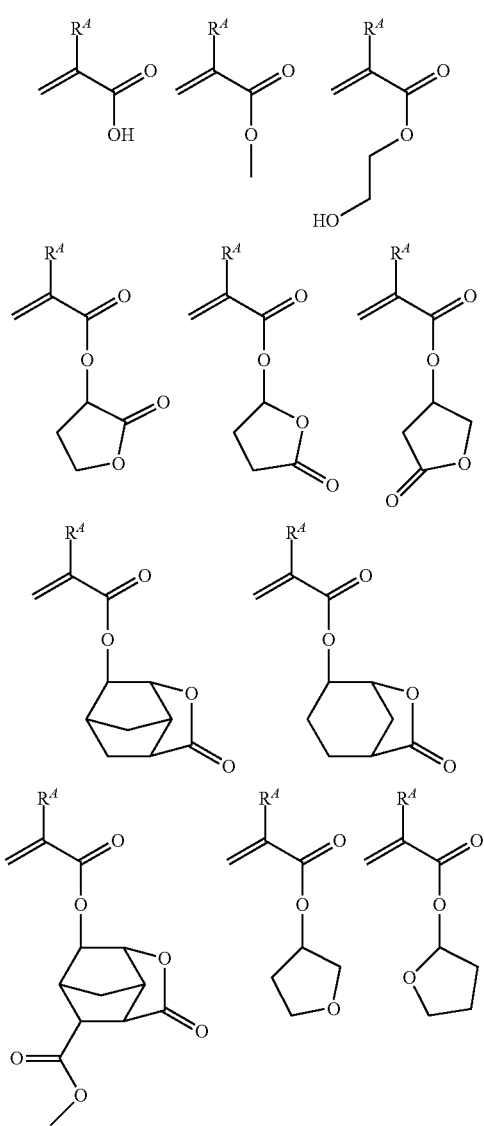
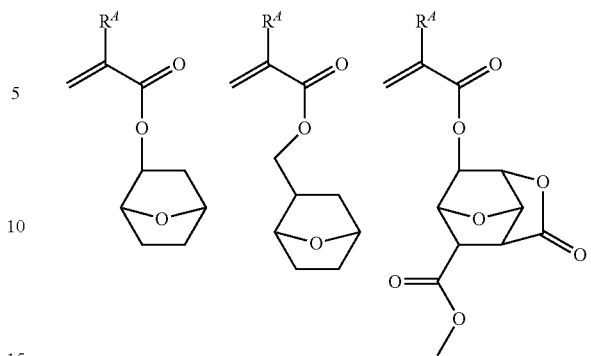
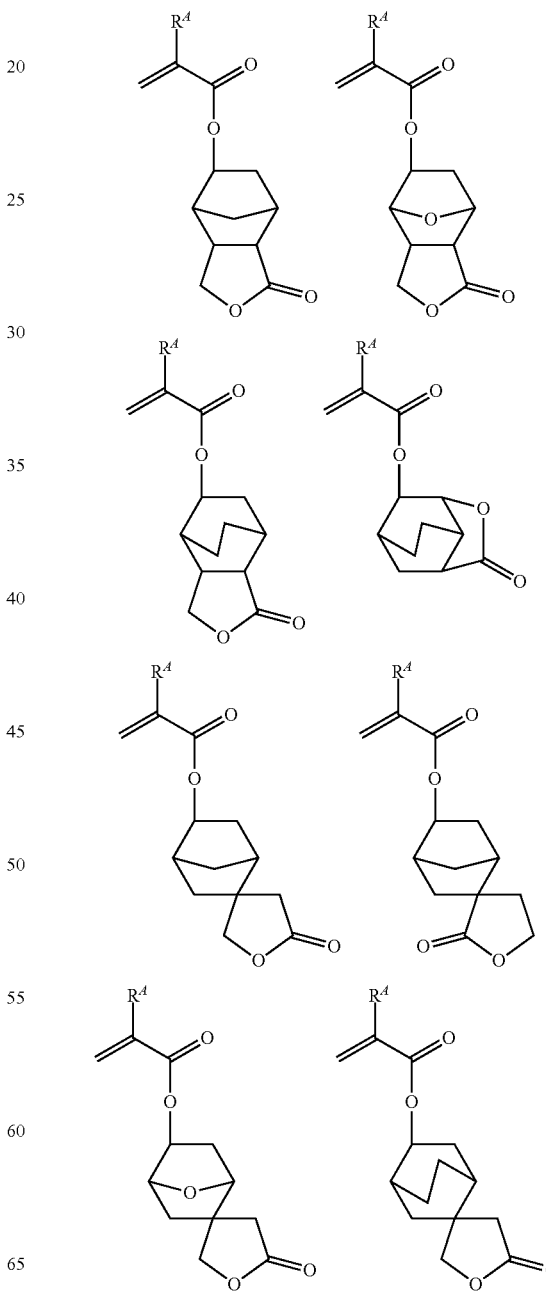

71
-continued
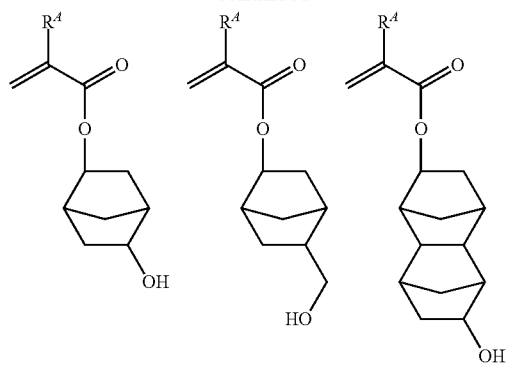
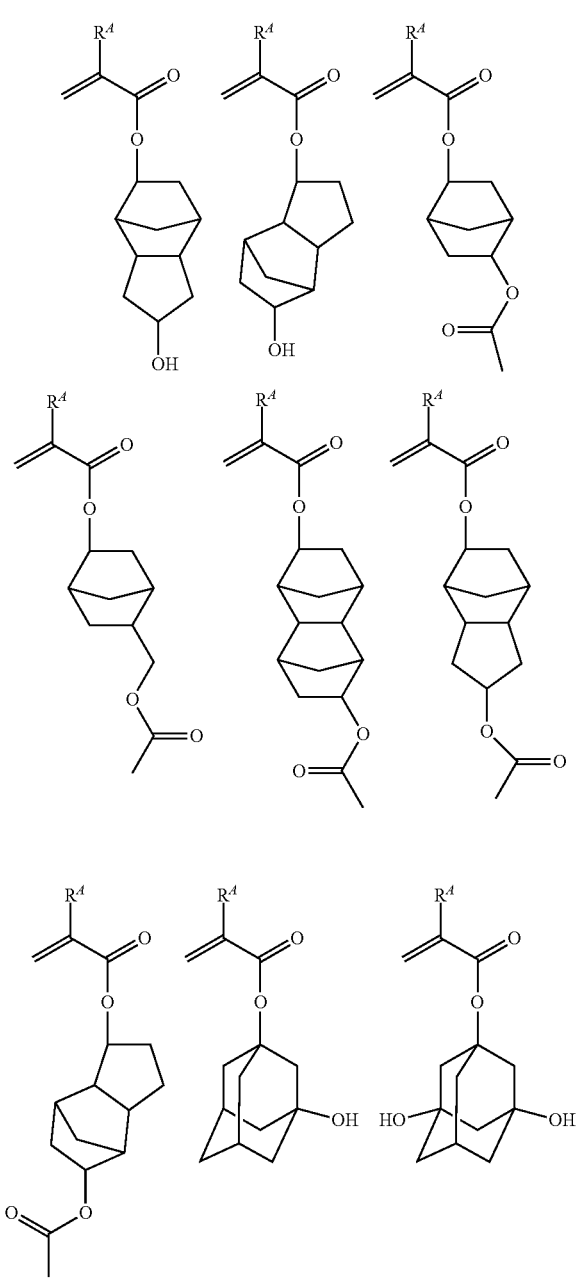
72
-continued
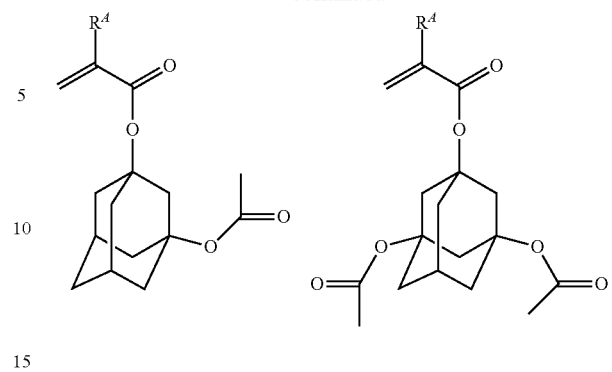
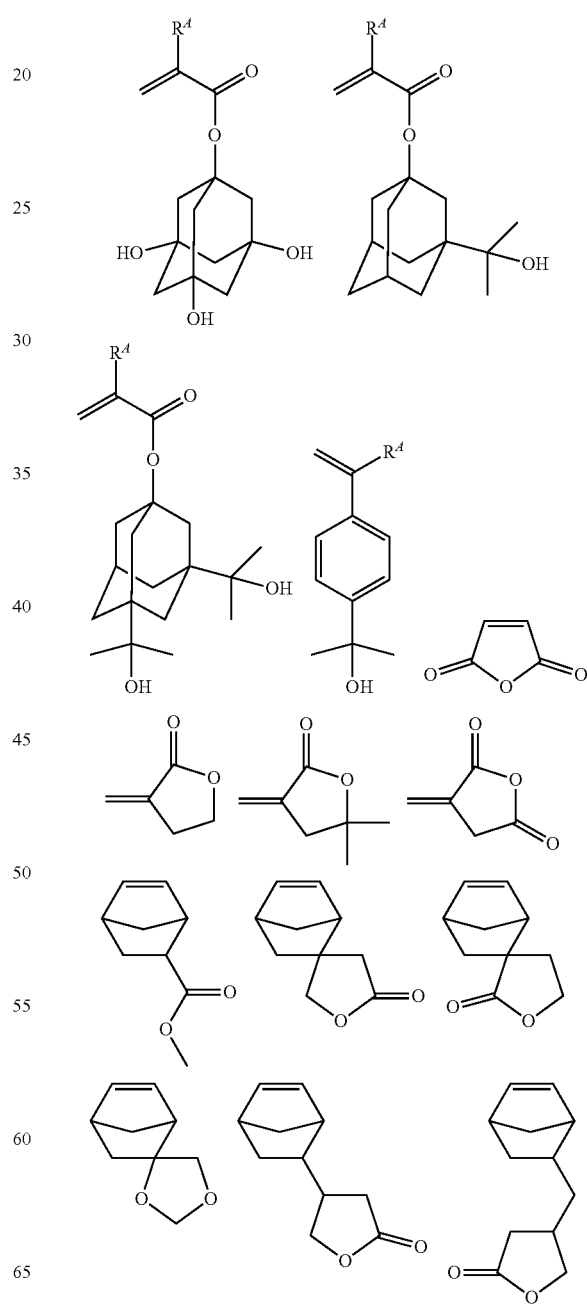

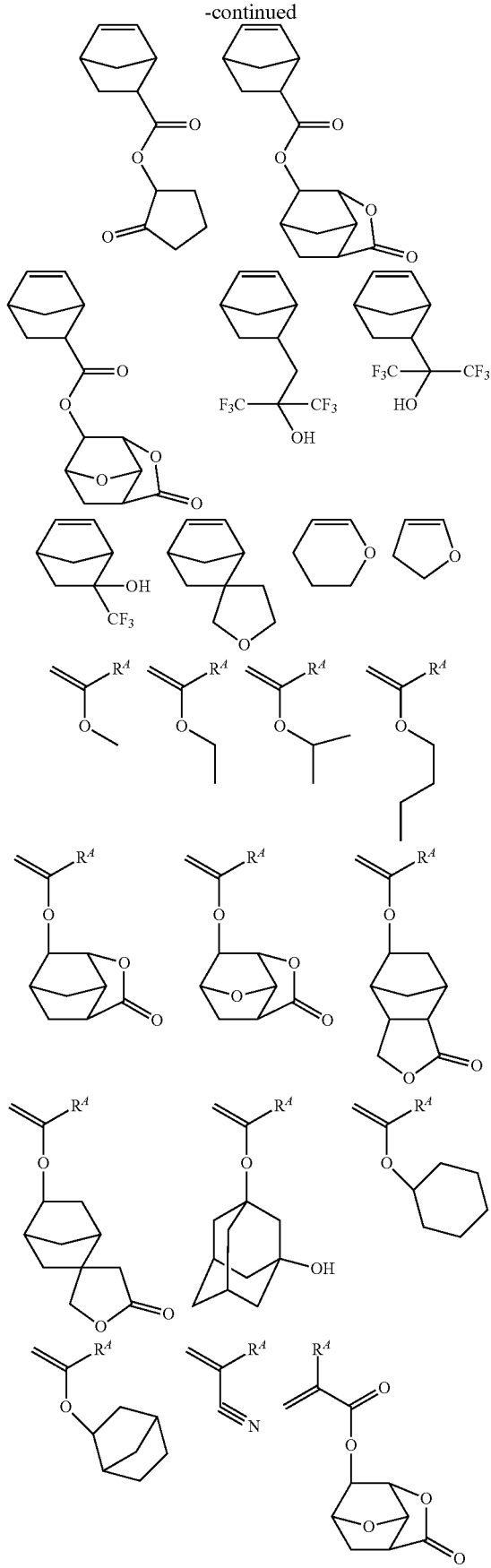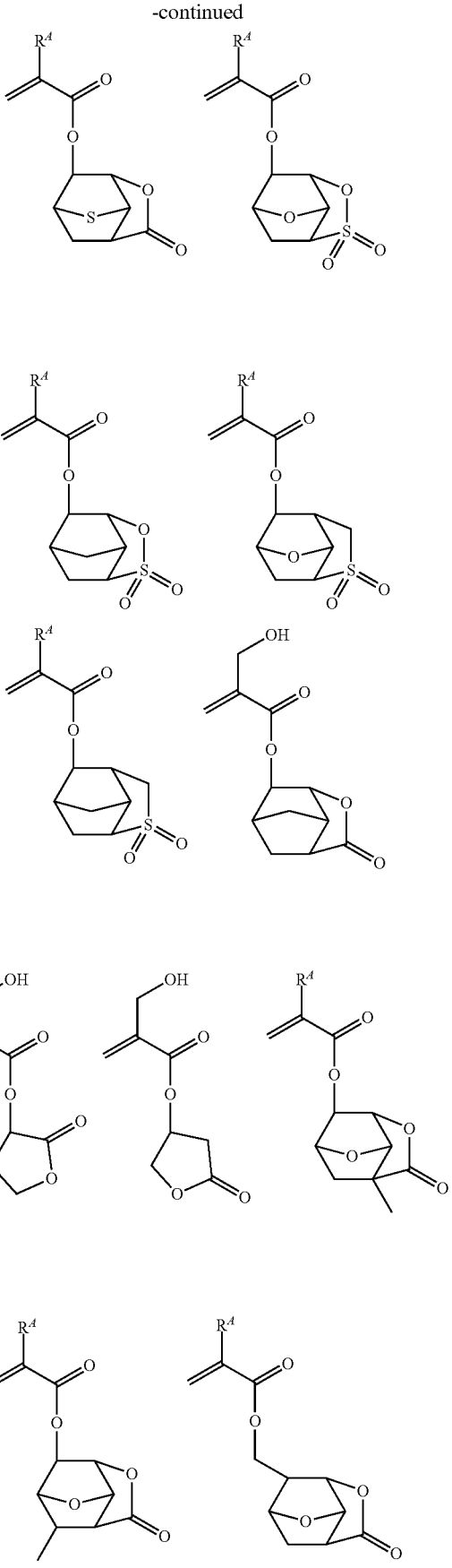

-continued
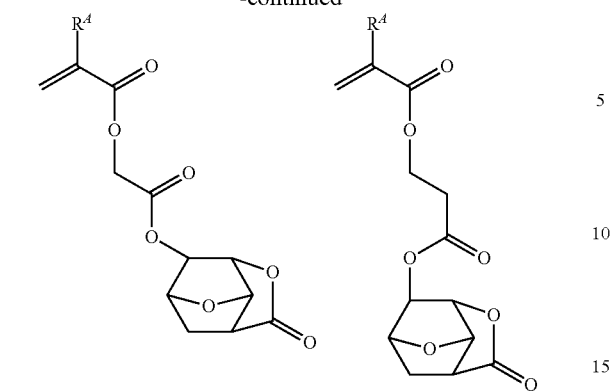
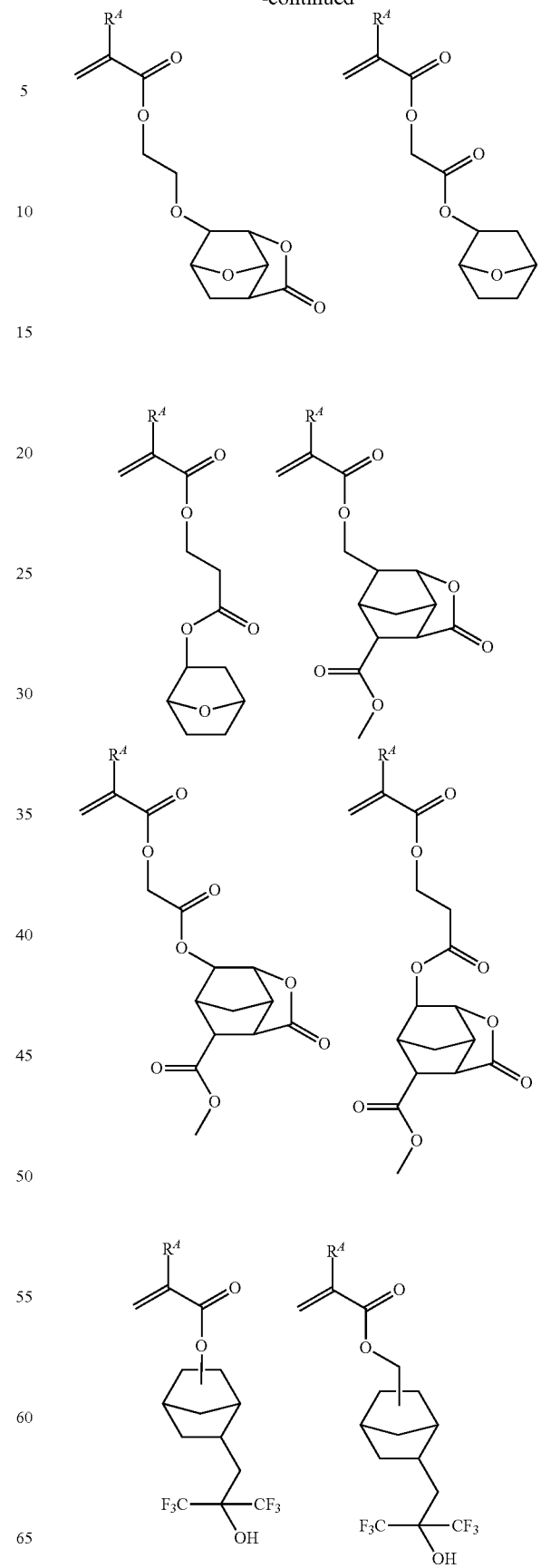

77
-continued
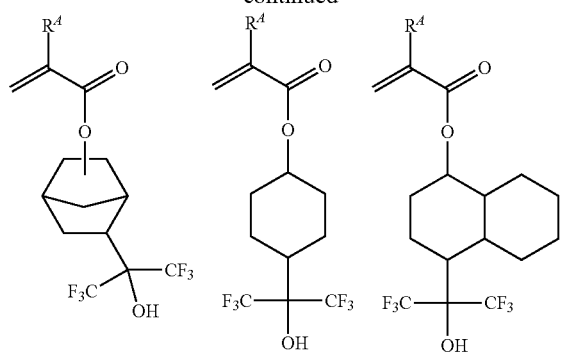
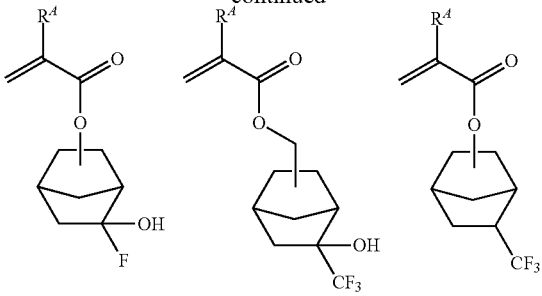
78
-continued
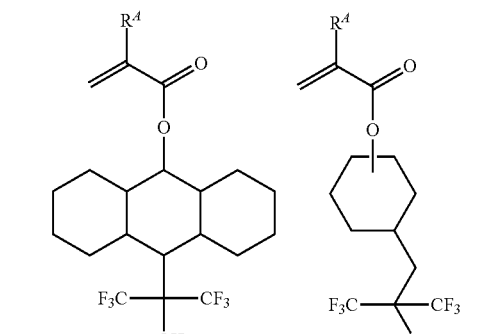
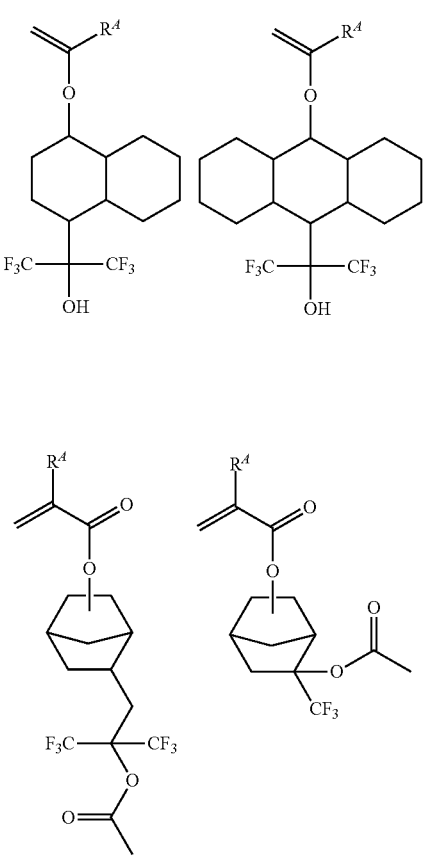
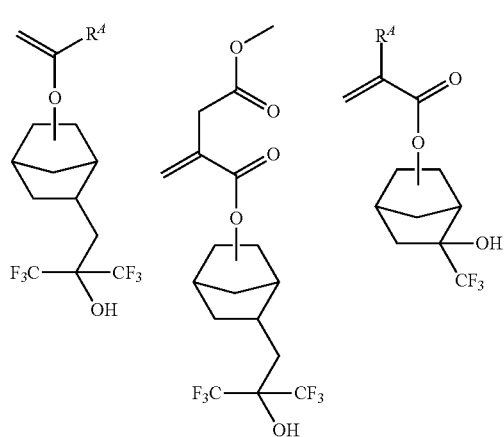

-continued
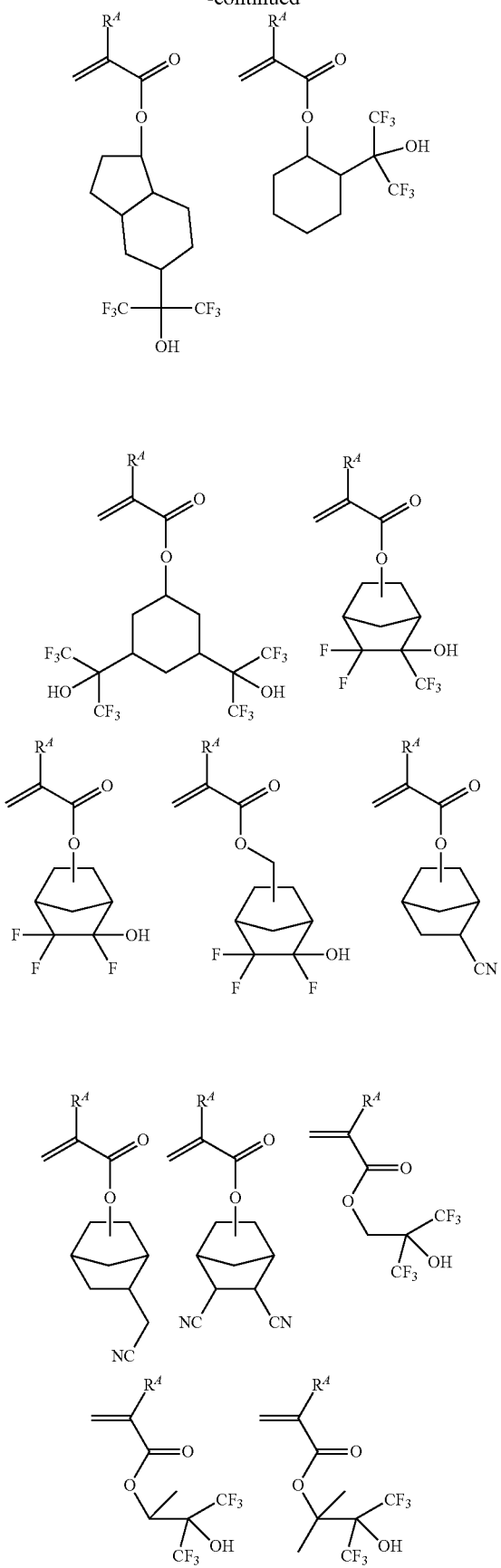
-continued
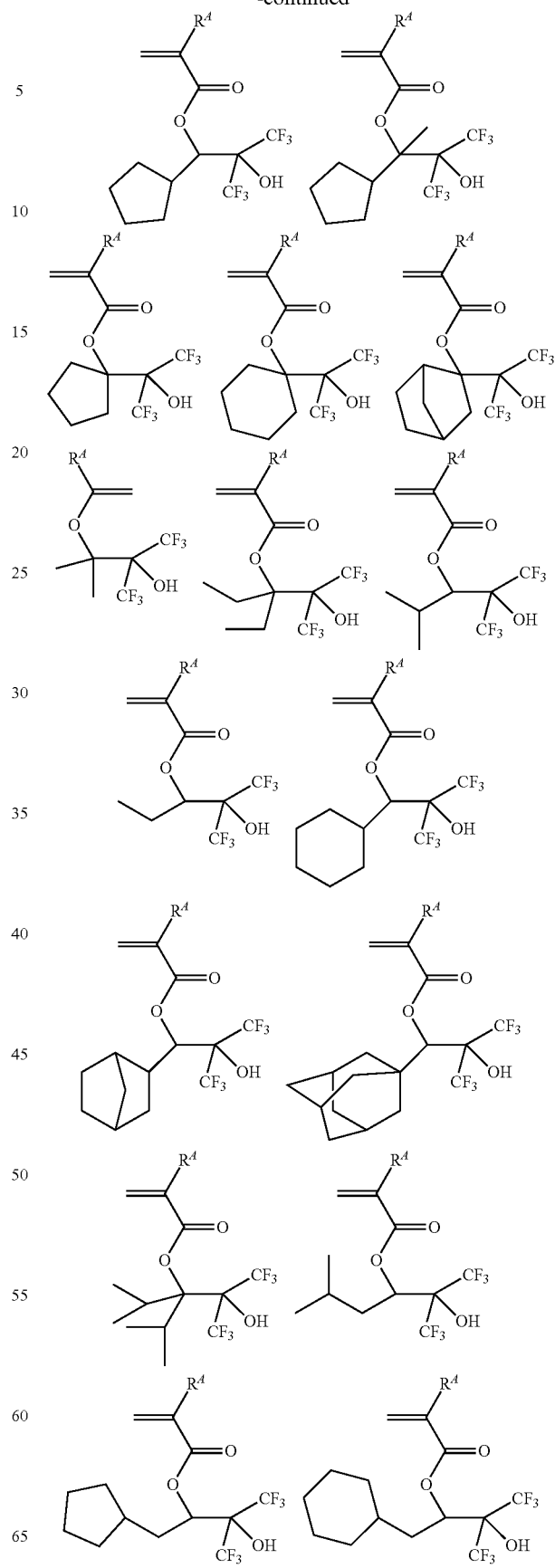

-continued
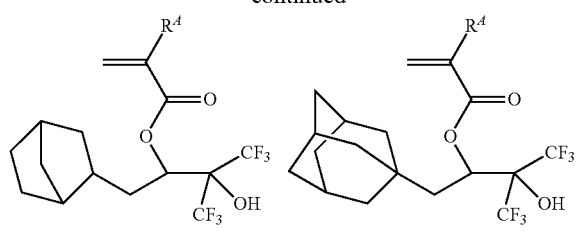
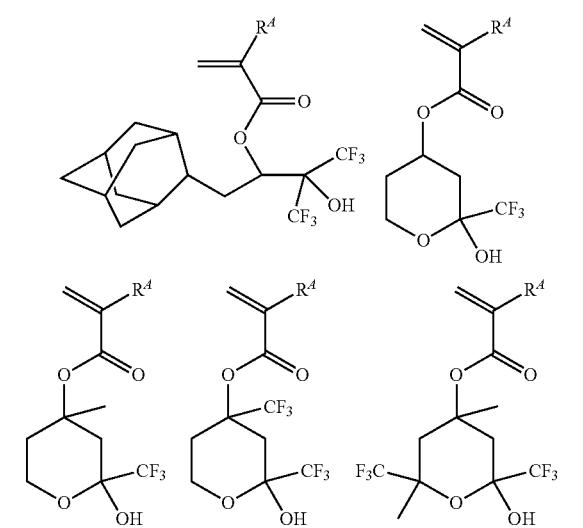
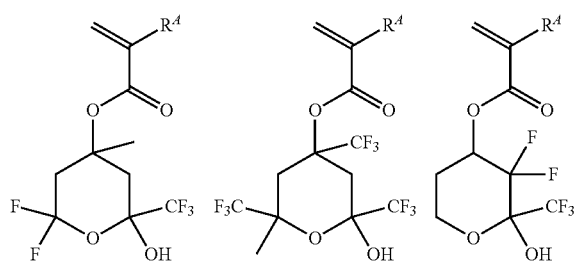
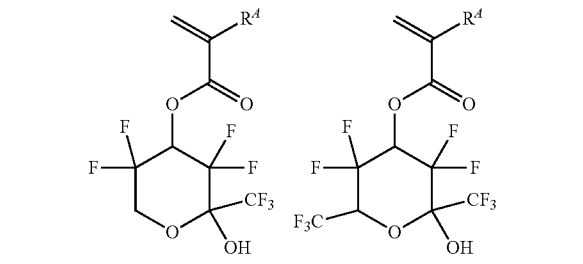
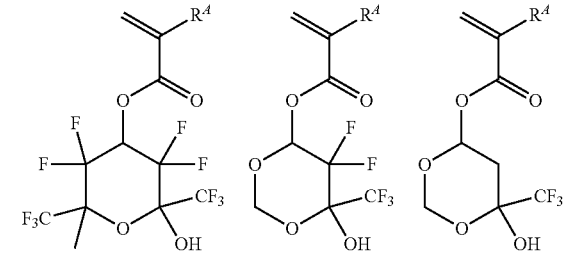
-continued
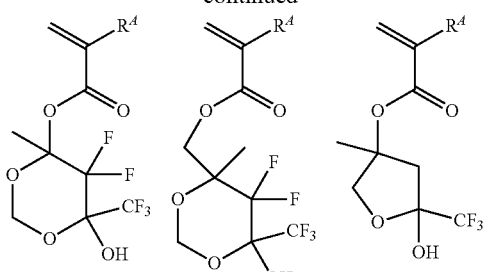
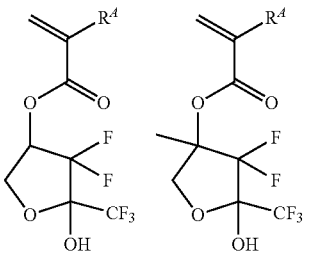
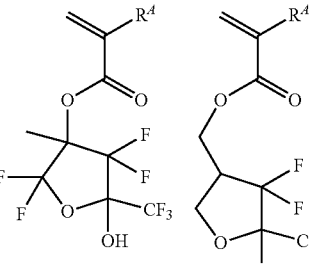
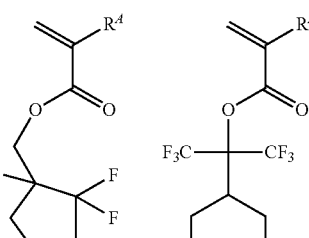
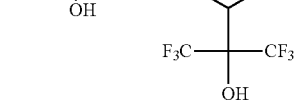
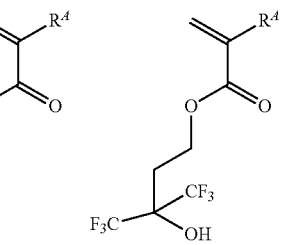
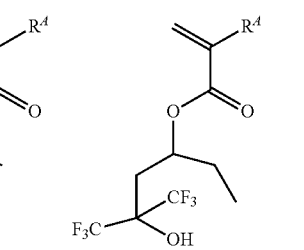

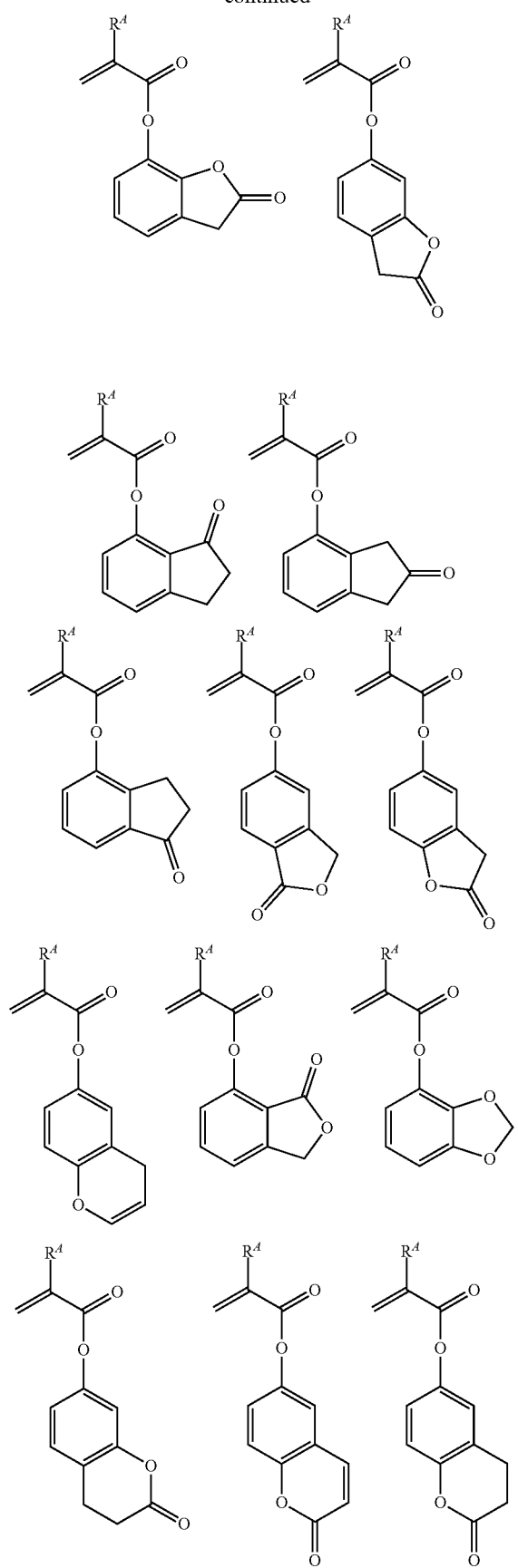
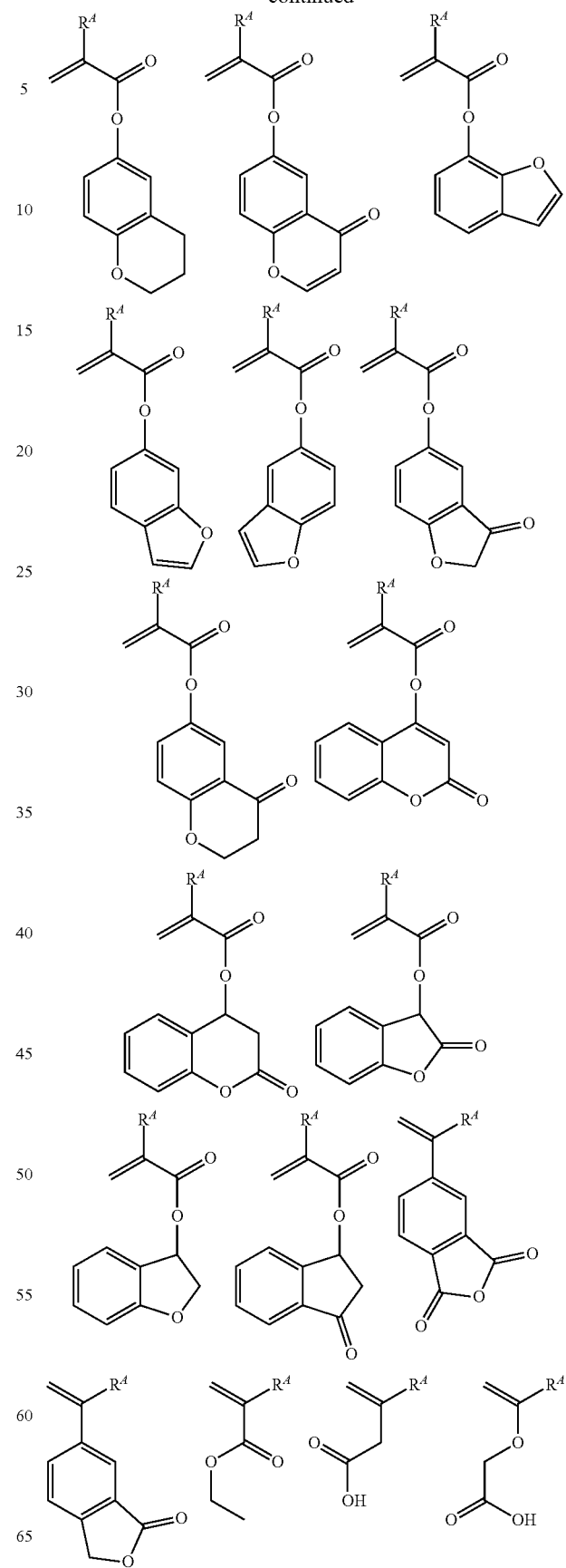

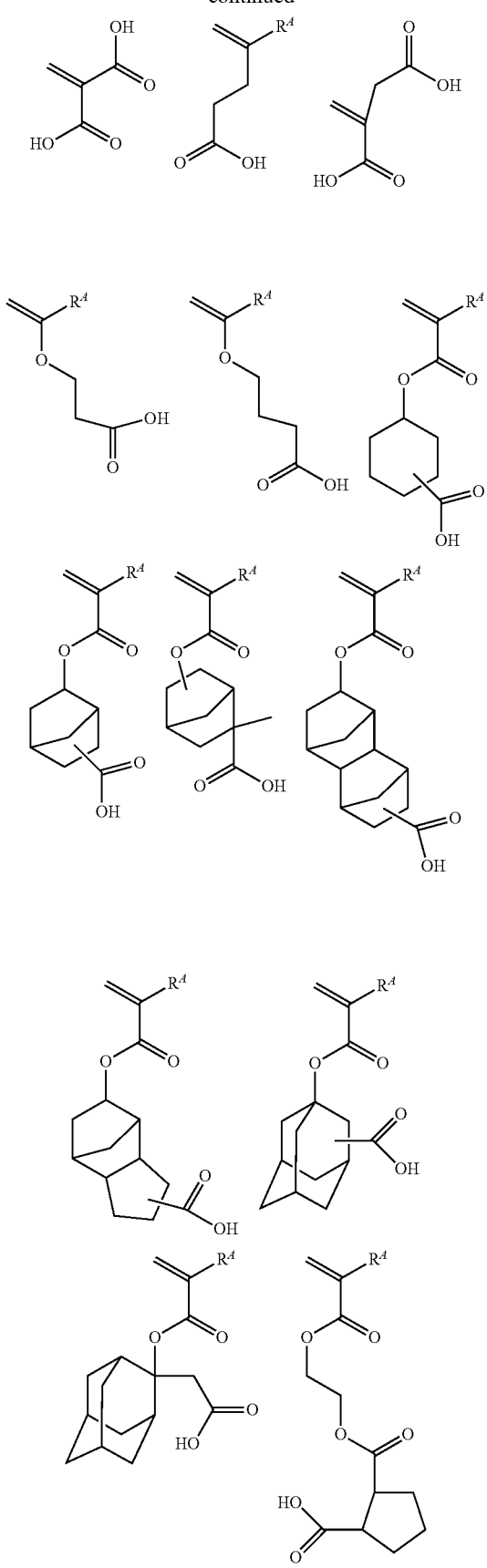
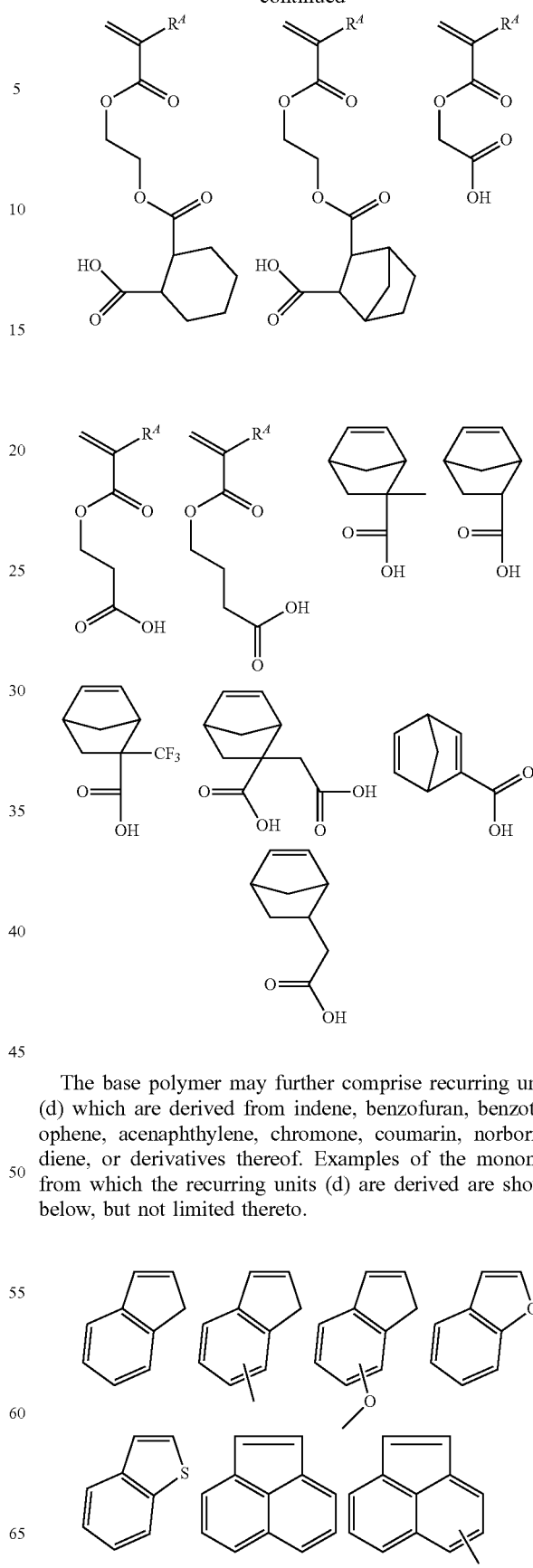
The base polymer may further comprise recurring units (d) which are derived from indene, benzofuran, benzothiophene, acenaphthylene, chromone, coumarin, norbornadiene, or derivatives thereof. Examples of the monomer from which the recurring units (d) are derived are shown below, but not limited thereto.

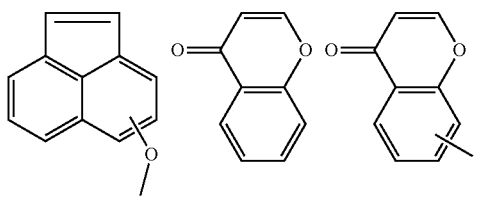
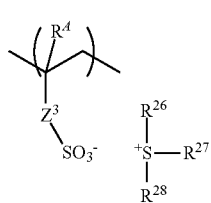
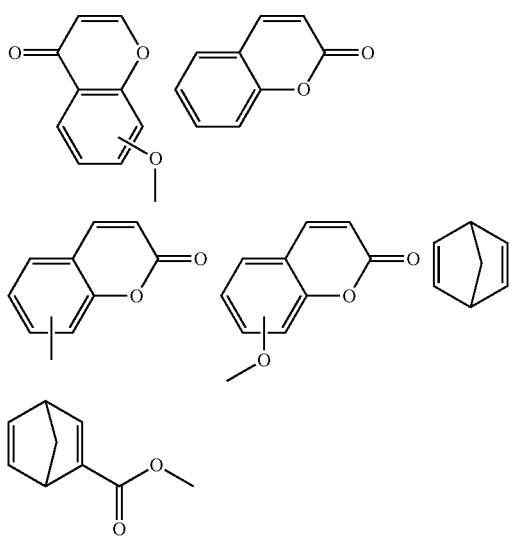

The base polymer may further comprise recurring units (e) which are derived from styrene, vinylnaphthalene, vinylanthracene, vinylpyrene, methyleneindene, vinylpyridine, or vinylcarbazole.

In a further embodiment, recurring units (f) derived from an onium salt having a polymerizable unsaturated bond may be incorporated in the base polymer. The preferred recurring units (f) are recurring units of at least one type selected from the formulae (f1), (f2) and (f3). These units are simply referred to as recurring units (f1), (f2), and (f3). The recurring units (f1), (f2), and (f3) may be used alone or in combination of two or more types.

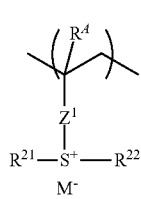
(f1)

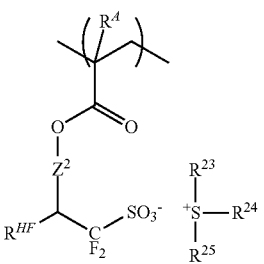
(f2)

(f3)

In the formulae (f1) to (f3), $R^A$ is each independently hydrogen or a methyl group. $Z^1$ is a single bond, a phenylene group, —O—$Z^{11}$—, —C(=O)—O—$Z^{11}$—, or —C(=O)—NH—$Z^{11}$—, wherein $Z^{11}$ is a $C_1$-$C_6$ aliphatic hydrocarbylene group, a phenylene group, a naphthylene group, or a $C_7$-$C_{18}$ group obtained from combination thereof, which may contain a carbonyl group, an ester bond, an ether bond, or a hydroxyl group. $Z^2$ is a single bond, —$Z^{21}$—C(=O)—O—, —$Z^{21}$—O—, or —$Z^{21}$—O—C(=O)—, wherein $Z^{21}$ is a $C_1$-$C_{12}$ saturated hydrocarbylene group which may contain a carbonyl group, an ester bond, or an ether bond. $Z^3$ is a single bond, a methylene group, an ethylene group, a phenylene group, a fluorinated phenylene group, —O—$Z^{31}$—, —C(=O)—O—$Z^{31}$—, or —C(=O)—NH—$Z^{31}$—, wherein $Z^{31}$ is a $C_1$-$C_6$ aliphatic hydrocarbylene group, a phenylene group, a fluorinated phenylene group, or a trifluoromethyl-substituted phenylene group, which may contain a carbonyl group, an ester bond, an ether bond, or a hydroxyl group. The aliphatic hydrocarbylene groups represented by $Z^{11}$ and $Z^{31}$ may be saturated or unsaturated, and may be straight, branched, or cyclic. The saturated hydrocarbylene group represented by $Z^{21}$ may be straight, branched, or cyclic.

In the formulae (f1) to (3), $R^{21}$ to $R^{28}$ are each independently a $C_1$-$C_{20}$ hydrocarbyl group which may contain a heteroatom. The hydrocarbyl group may be saturated or unsaturated, and may be straight, branched, or cyclic. Specific examples of the hydrocarbyl group include $C_1$-$C_{20}$ alkyl groups, $C_6$-$C_{20}$ aryl groups, $C_7$-$C_{20}$ aralkyl groups, and combinations thereof. Illustrative examples are as exemplified above for $R^1$ to $R^5$ in the formulae (1) and (2). In these groups, some or all hydrogen atoms may be substituted by $C_1$-$C_{10}$ saturated hydrocarbyl, halogen, trifluoromethyl, cyano, nitro, hydroxyl, mercapto, $C_1$-$C_{10}$ saturated hydrocarbyloxy, $C_2$-$C_{10}$ saturated hydrocarbyloxycarbonyl or $C_2$-$C_{10}$ saturated hydrocarbylcarbonyloxy groups, or some carbon may be replaced by a carbonyl group, ether bond, or ester bond. Also, a pair of $R^{23}$ and $R^{24}$ or $R^{26}$ and $R^{27}$ may bond together to form a ring with the sulfur atom to which they are attached. Examples of the ring are as exemplified above as the ring that $R^1$ and $R^2$, taken together, form with the sulfur atom to which they are attached in the formula (1).

In the formula (2), $R^{HF}$ is hydrogen or a trifluoromethyl group.

In the formula (f1), $M^-$ is a non-nucleophilic counter ion. Examples of the non-nucleophilic counter ion include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylsulfoyl)imide, bis(perfluoroethylsulfonyl) imide, and bis(perfluorobutylsulfonyl)imide; and methide ions such as tris(trifluoromethylsulfonyl)methide and tris(perfluoroethylsulfonyl)methide.

Also included are sulfonate ions having fluorine substituted at α-position as represented by the formula (f1-1) and sulfonate ions having fluorine substituted at α-position and trifluoromethyl at β-position as represented by the formula (f1-2).

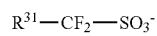
(f1-1)

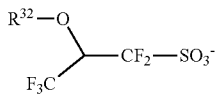
(f1-2)

In the formula (f1-1), $R^{31}$ is hydrogen or a $C_1$-$C_{20}$ hydrocarbyl group which may contain an ether bond, an ester bond, a carbonyl group, a lactone ring, or a fluorine atom.

In the formula (f1-2), $R^{32}$ is hydrogen, or a $C_1$-$C_{30}$ hydrocarbyl or $C_2$-$C_{30}$ hydrocarbylcarbonyl group which may contain an ether bond, an ester bond, a carbonyl group, or a lactone ring.

The hydrocarbyl group and hydrocarbyl moiety of the hydrocarbylcarbonyl group, represented by $R^{31}$ or $R^{32}$, may be saturated or unsaturated and straight, branched, or cyclic. Examples thereof include alkyl groups such as methyl, ethyl, propyl, isopropyl, butyl, isobutyl, sec-butyl, tert-butyl, pentyl, neopentyl, hexyl, heptyl, 2-ethyhexyl, nonyl, undecyl, tridecyl, pentadecyl, heptadecyl, and icosanyl; cyclic saturated hydrocarbyl groups such as cyclopentyl, cyclohexyl, 1-adamantyl, 2-adamantyl, 1-adamantylmethyl, norbornyl, norbornylmethyl, tricyclodecanyl, tetracyclododecanyl, tetracyclododecanylmethyl, and dicyclohexylmethyl; alkenyl groups such as allyl; cyclic unsaturated hydrocarbyl groups such as 3-cyclohexenyl; aryl groups such as phenyl, 1-naphthyl, and 2-naphthyl; and aralkyl groups such as benzyl and diphenylmethyl.

In these groups, some or all of the hydrogen atoms may be substituted by a group containing a heteroatom such as oxygen, sulfur, nitrogen, or halogen, or some carbon may be replaced by a group containing a heteroatom such as oxygen, sulfur, or nitrogen, so that the group may contain a hydroxyl group, a cyano group, a carbonyl group, an ether bond, an ester bond, a sulfonic acid ester bond, a carbonate group, a lactone ring, a sultone ring, a carboxylic anhydride, or a haloalkyl group. Examples of the heteroatom-containing hydrocarbyl group include groups such as tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl.

Examples of the cation in the monomer from which the recurring unit (f1) is derived are shown below, but not limited thereto. $R^A$ are as defined above.

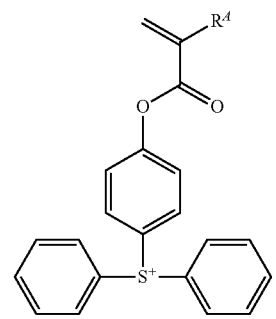

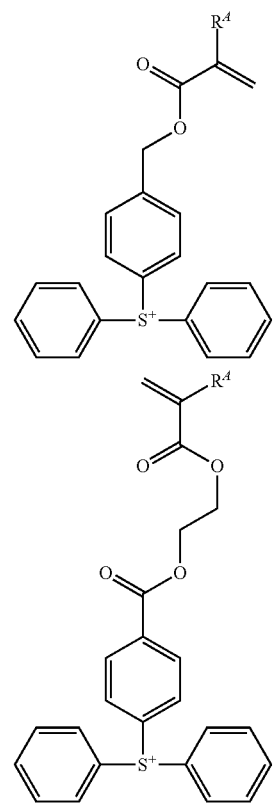

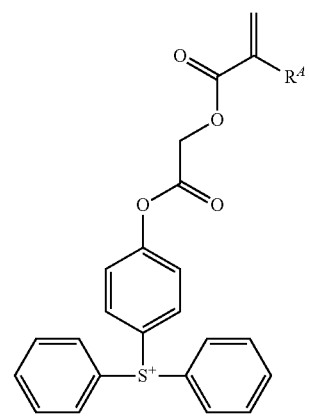

91
-continued
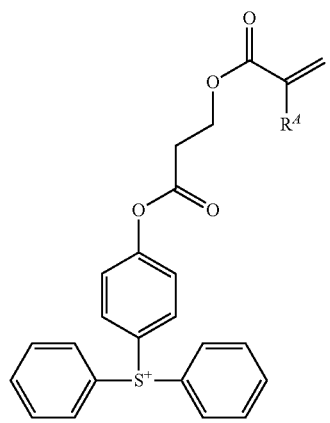
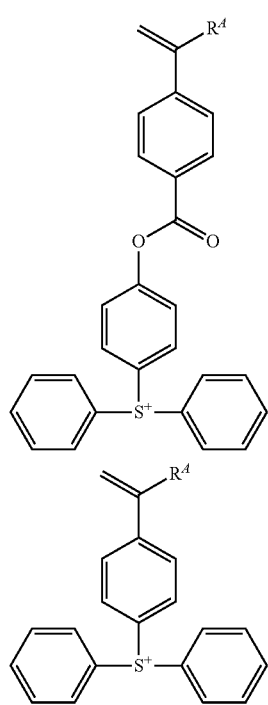
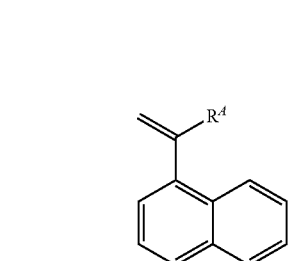
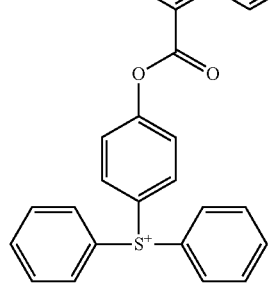
92
-continued
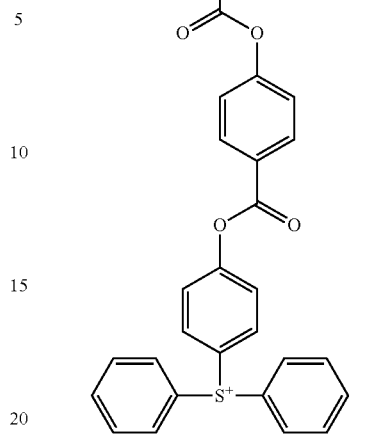
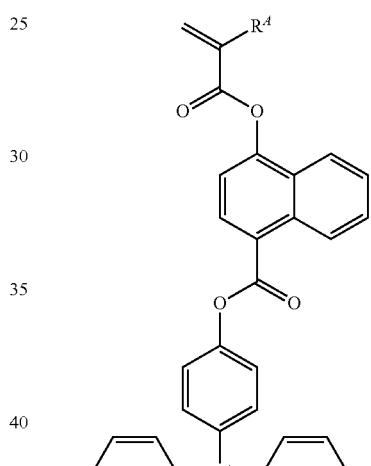
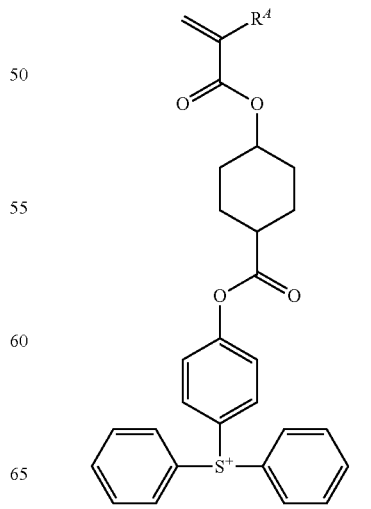

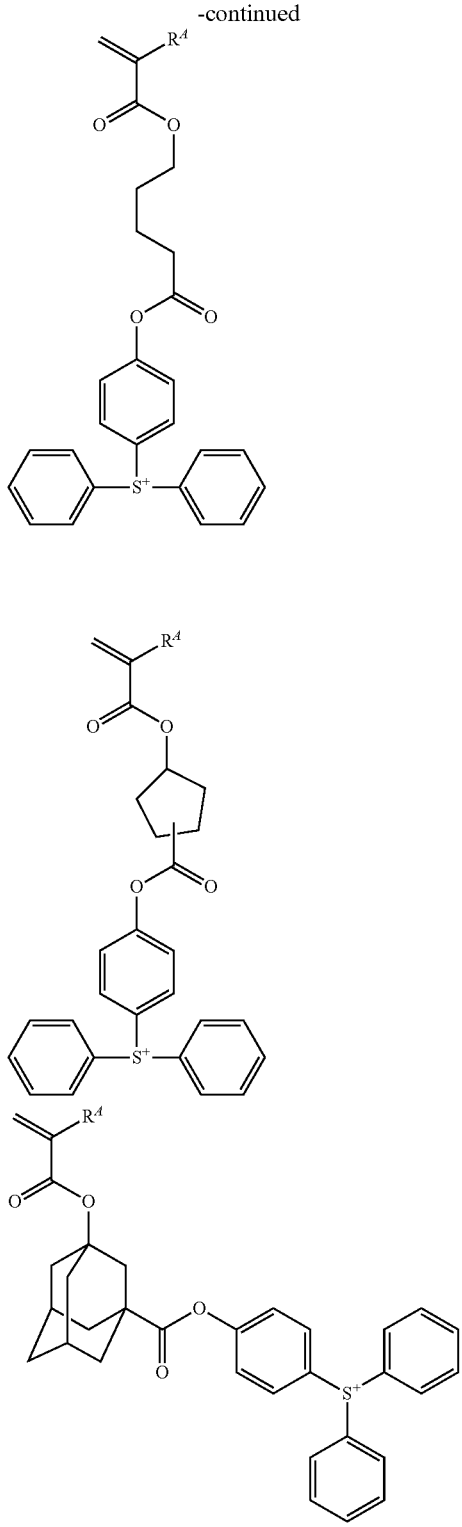
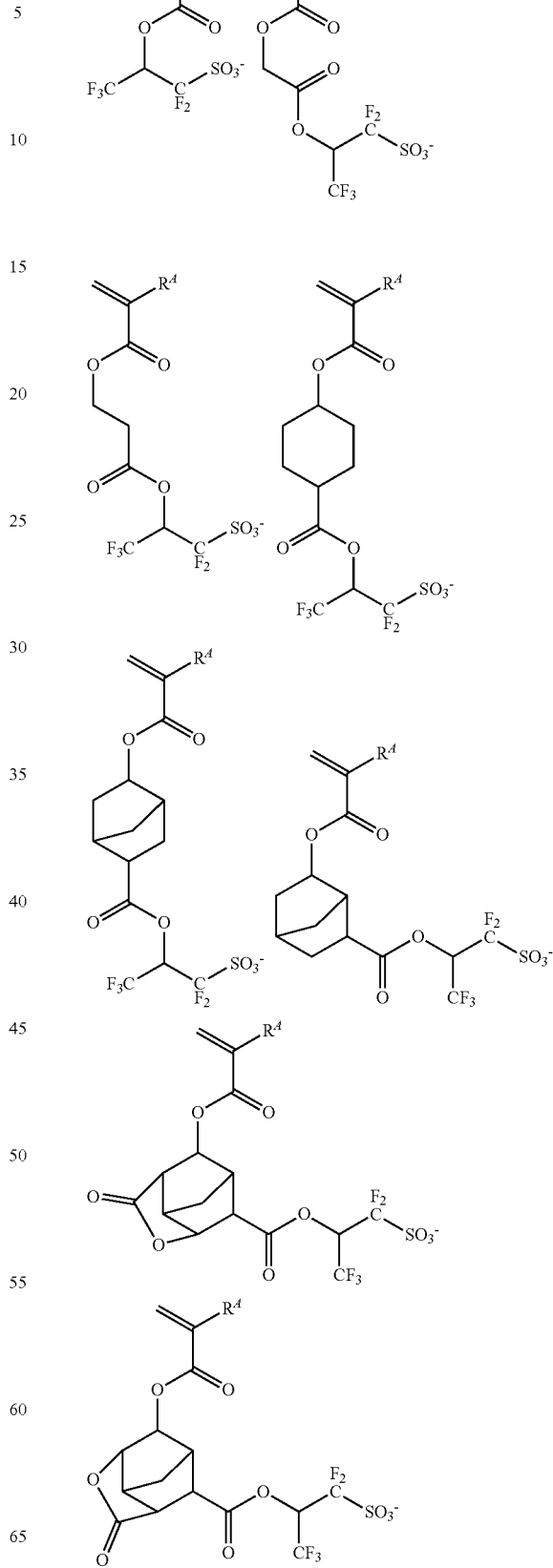
Examples of the cation in the monomer from which the recurring unit (f2) or (f3) is derived are the same as exemplified above as the cation in the sulfonium salt having the formula (1).
Examples of the anion in the monomer from which the recurring unit (f2) is derived are shown below, but not limited thereto. Herein $R^A$ is as defined above.

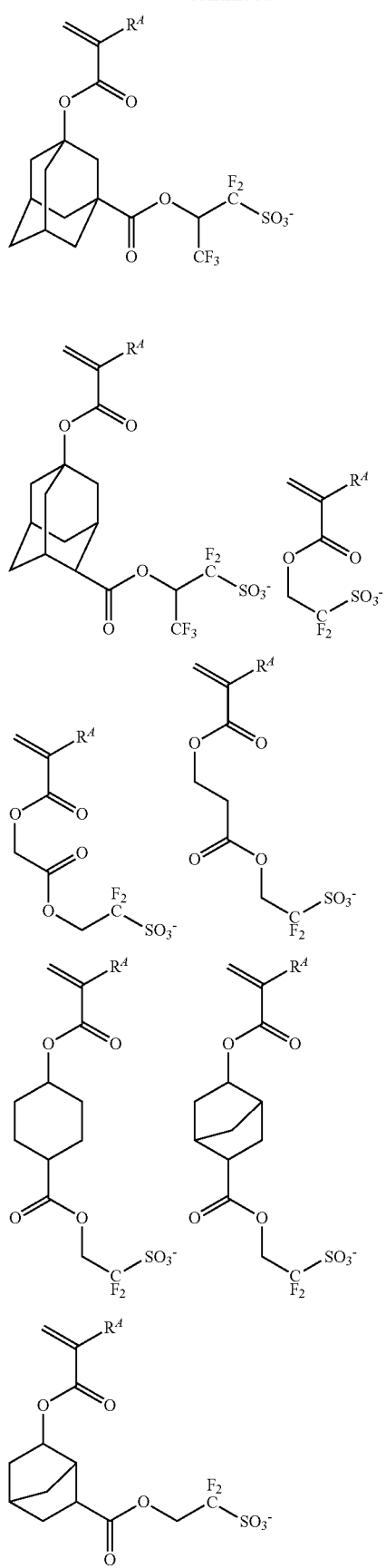
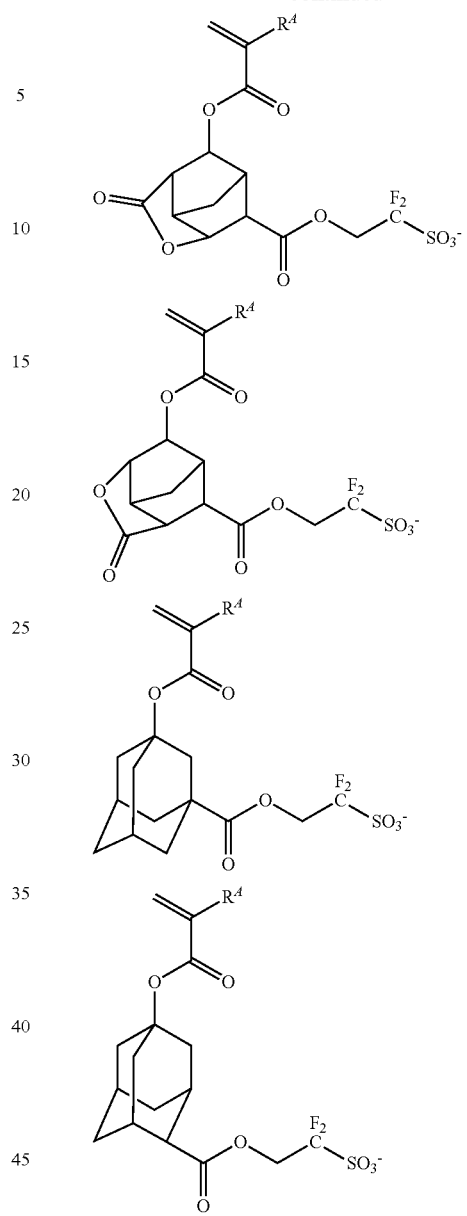
Examples of the anion in the monomer from which the recurring unit (f3) is derived are shown below, but not limited thereto. Herein $R^A$ is as defined above.
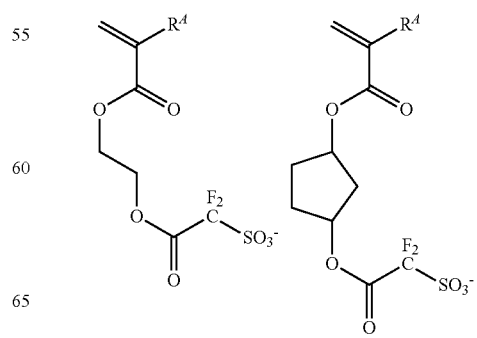

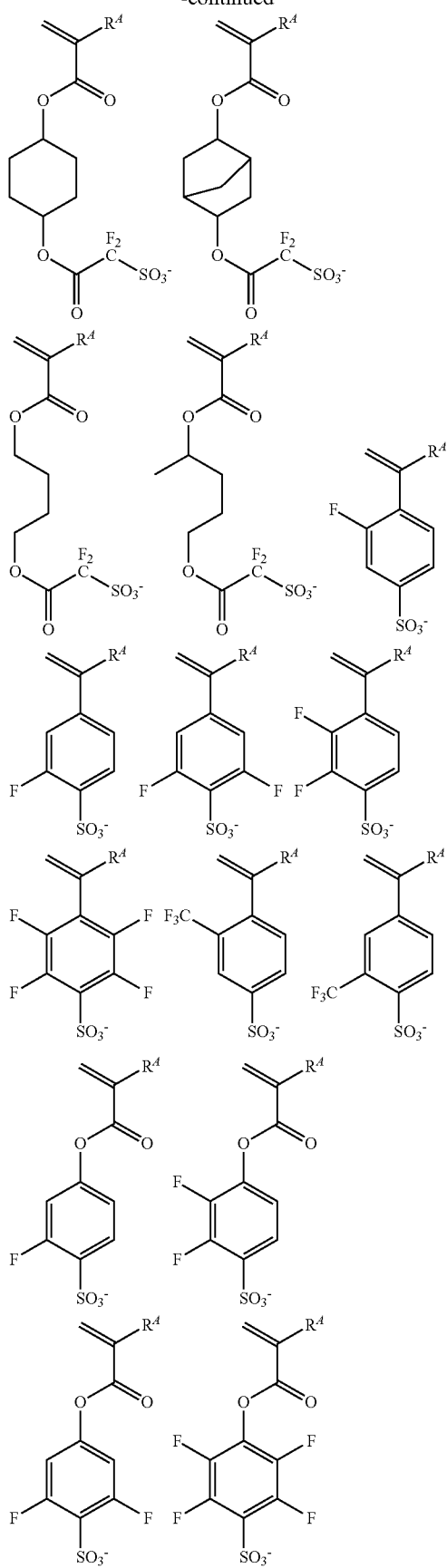
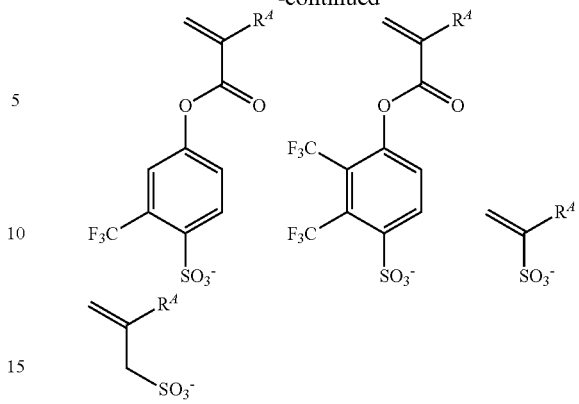

The attachment of an acid generator to the polymer main chain is effective in restraining acid diffusion, thereby preventing a reduction of resolution due to blur by acid diffusion. Also LWR is improved since the acid generator is uniformly distributed.

The base polymer for formulating the positive resist composition comprises recurring unit (a1) or (a2) having an acid labile group as essential component. A fraction of recurring units (a1), (a2), (b), (c), (d), (e), and (f) is: preferably $0 \leq a1 < 1.0$, $0 \leq a2 < 1.0$, $0 < a1+a2 < 1.0$, $0 \leq b \leq 0.9$, $0 \leq c \leq 0.9$, $0 \leq d \leq 0.8$, $0 \leq e \leq 0.8$, and $0 \leq f \leq 0.5$; more preferably $0 \leq a1 \leq 0.9$, $0 \leq a2 \leq 0.9$, $0.1 \leq a1+a2 \leq 0.9$, $0 \leq b \leq 0.8$, $0 \leq c \leq 0.8$, $0 \leq d \leq 0.7$, $0 \leq e \leq 0.7$, and $0 \leq f \leq 0.4$; and even more preferably $0 \leq a1 \leq 0.8$, $0 \leq a2 \leq 0.8$, $0.1 \leq a1+a2 \leq 0.8$, $0 \leq b \leq 0.75$, $0 \leq c \leq 0.75$, $0 \leq d \leq 0.6$, $0 \leq e \leq 0.6$, and $0 \leq f \leq 0.3$. Notably, $f=f1+f2+f3$, meaning that recurring unit (f) is at least one of recurring units (f1) to (f3). $a1+a2+b+c+d+e+f=1.0$.

For the base polymer for formulating the negative resist composition, an acid labile group is not necessarily essential. The base polymer comprises recurring units (b), and optionally recurring units (c), (d), (e), and/or (f). A fraction of these recurring units is preferably $0 < b \leq 1.0$, $0 \leq c \leq 0.9$, $0 \leq d \leq 0.8$, $0 \leq e \leq 0.8$, and $0 \leq f \leq 0.5$, more preferably $0.2 \leq b \leq 1.0$, $0 \leq c \leq 0.8$, $0 \leq d \leq 0.7$, $0 \leq e \leq 0.7$, and $0 \leq f \leq 0.4$, and even more preferably $0.3 \leq b \leq 1.0$, $0 \leq c \leq 0.75$, $0 \leq d \leq 0.6$, $0 \leq e \leq 0.6$, and $0 \leq f \leq 0.3$. Notably, $f=f1+f2+f3$, meaning that recurring unit (f) is at least one of recurring units (f1) to (f3). $b+c+d+e+f=1.0$.

The base polymer may be synthesized, for example, by dissolving monomers giving the foregoing recurring units in an organic solvent, adding a radical polymerization initiator thereto, and heating for polymerization.

Examples of the organic solvent which can be used for polymerization include toluene, benzene, tetrahydrofuran (THF), diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. The polymerization temperature is preferably 50 to 80° C. The reaction time is preferably 2 to 100 hours, and more preferably 5 to 20 hours.

When a monomer having a hydroxyl group is copolymerized, the hydroxyl group may be replaced by an acetal group susceptible to deprotection with acid, typically ethoxyethoxy, prior to polymerization, and the polymerization may be followed by deprotection with weak acid and water. Alternatively, the hydroxyl group may be replaced by an acetyl, formyl, pivaloyl or similar group prior to polymerization, and the polymerization may be followed by alkaline hydrolysis.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene.

For alkaline hydrolysis, a base such as aqueous ammonia or triethylamine may be used. The reaction temperature is preferably −20° C. to 100° C., and more preferably 0° C. to 60° C. The reaction time is preferably 0.2 to 100 hours, and more preferably 0.5 to 20 hours.

The base polymer should preferably have a weight average molecular weight (Mw) in the range of 1,000 to 500.000, and more preferably 2,000 to 30.000, as measured by gel permeation chromatography (GPC) versus polystyrene standards using THF solvent. With too low a Mw, the resist composition may become less heat resistant. A polymer with too high a Mw may lose alkaline solubility and give rise to a footing phenomenon after pattern formation.

If a base polymer has a wide molecular weight distribution or dispersity (Mw/Mn), which indicates the presence of lower and higher molecular weight polymer fractions, there is a possibility that foreign matter is left on the pattern or the pattern profile is degraded after exposure. The influences of Mw and Mw/Mn become stronger as the pattern rule becomes finer. Therefore, the base polymer should preferably have a narrow dispersity (Mw/Mn) of 1.0 to 2.0, especially 1.0 to 1.5, in order to provide a resist composition suitable for micropatterning to a small feature size.

In the base polymer, it is understood that a blend of two or more polymers which differ in compositional ratio, Mw or Mw/Mn is acceptable.

Quencher

In the resist composition, a quencher may be blended. The quencher is typically selected from conventional basic compounds. Examples of conventional basic compounds include primary, secondary, and tertiary aliphatic amines, mixed amines, aromatic amines, heterocyclic amines, nitrogen-containing compounds with a carboxyl group, nitrogen containing compounds with a sulfonyl group, nitrogen-containing compounds with a hydroxyl group, nitrogen-containing compounds with a hydroxyphenyl group, alcoholic nitrogen-containing compounds, amide derivatives, imide derivatives, and carbamate derivatives. Particularly preferable compounds among the conventional basic compounds are primary, secondary, and tertiary amine compounds, specifically amine compounds having a hydroxyl group, an ether bond, an ester bond, a lactone ring, a cyano group, or a sulfonic acid ester bond as described in JP-A 2008-111103, paragraphs [0146] to [0164], and compounds having a carbamate group as described in JP 3790649. Addition of such a basic compound may be effective for further suppressing the diffusion rate of acid in the resist film, correcting the pattern profile, or the like.

Onium salts such as sulfonium salts, iodonium salts, and ammonium salts of sulfonic acids which are not fluorinated at α-position as described in JP-A 2008-158339 may also be used as the quencher. While an α-fluorinated sulfonic acid, imide acid, and methide acid are necessary to deprotect the acid labile group of a carboxylic acid ester, an α-non-fluorinated sulfonic acid is released by salt exchange with an α-non-fluorinated onium salt. An α-non-fluorinated sulfonic acid functions as a quencher because the α-non-fluorinated sulfonic acid does not induce deprotection reaction.

A carboxylic acid onium salt having the following formula (q1) can also be suitably used as a quencher.

$$R^{41}-CO_2^-M_A^+ \quad (q1)$$

In the formula (q1), $R^{41}$ is a $C_1$-$C_{40}$ hydrocarbyl group which may contain a heteroatom. $M_A^+$ is an onium ion. Examples of the onium ion include sulfonium ions and iodonium ions. Examples of the sulfonium ion are the same as exemplified above as the cation in the sulfonium salt having the formula (1). Examples of the iodonium ion are the same as exemplified above as the cation in the iodonium salt having the formula (2).

As the anion in the carboxylic acid onium salt, the anion having the following formula (q2) is preferable.

In the formula (q2), $R^{51}$ is hydrogen, a hydroxyl group, a $C_1$-$C_{35}$ hydrocarbyl group which may contain a heteroatom, or a substituted or unsubstituted $C_6$-$C_{30}$ aryl group. $R^{52}$ and $R^{53}$ are each independently hydrogen, fluorine, or a trifluoromethyl group.

Also useful are quenchers of polymer type as described in JP-A 2008-239918. The polymeric quencher segregates at the resist surface and thus enhances the rectangularity of resist pattern. When a protective film is applied as is often the case in the immersion lithography, the polymeric quencher is also effective for preventing a film thickness loss of resist pattern or rounding of pattern top.

In the resist composition, the quencher is preferably added in an amount of 0 to 5 parts, more preferably 0 to 4 parts by weight per 100 parts by weight of the base polymer.

Organic Solvent

In the resist composition, an organic solvent may be blended. The organic solvent is not particularly limited as long as each component described above and each component described below can be dissolved in the organic solvent. Examples of the organic solvent used herein are described in JP-A 2008-111103, paragraphs [0144] to [0145], and include ketones such as cyclohexanone, cyclopentanone, and methyl-2-n-pentyl ketone; alcohols such as 3-methoxybutanol, 3-methyl-3-methoxybutanol, 1-methoxy-2-propanol, 1-ethoxy-2-propanol, and diacetone alcohol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof.

In the resist composition, the organic solvent is preferably added in an amount of 100 to 10,000 parts, more preferably 200 to 8,000 parts by weight per 100 parts by weight of the base polymer.

Other Components

In the resist composition containing the foregoing components, other components such as an acid generator, a surfactant, a dissolution inhibitor, and a crosslinker may be blended in any desired combination to formulate a positive or negative resist composition. This positive or negative resist composition has a very high sensitivity in that the dissolution rate in developer of the base polymer in exposed areas is accelerated by catalytic reaction. In this case, the resist film has a high dissolution contrast, resolution, exposure latitude, and process adaptability, and provides a good pattern profile after exposure, and minimal proximity bias because of restrained acid diffusion. By virtue of these advantages, the composition is fully useful in commercial application and suited as a pattern-forming material for the fabrication of VLSIs. Particularly when a chemically amplified resist composition capable of utilizing acid catalyzed reaction is formulated, the composition has a higher sensitivity and is further improved in the properties described above.

The other acid generator is typically a compound, other than the sulfonium salt having the formula (1) or the iodonium salt having the formula (2), capable of generating an acid upon exposure to actinic ray or radiation (photoacid generator). Although the photoacid generator used herein is not particularly limited as long as it is capable of generating an acid upon exposure to high-energy radiation, acid generators capable of generating a sulfonic acid, an imide acid, or a methide acid are preferred. Suitable examples of the photoacid generator include sulfonium salts, iodonium salts, sulfonyldiazomethane, N-sulfonyloxyimide, and oxime-O-sulfonate acid generators. Specific examples of the other acid generator include the acid generators described in JP-A 2008-111103, paragraphs [0122] to [0142]. In the resist composition, the amount of the other acid generator used is not particularly limited as long as an effect of the invention is not impaired, but is preferably 0 to 200 parts, more preferably 0.1 to 100 parts by weight per 100 parts by weight of the base polymer.

Examples of the surfactant include the surfactants described in JP-A 2008-111103, paragraphs [0165] to [0166]. Addition of a surfactant may improve or control the coating characteristics of the resist composition. In the resist composition, the surfactant is preferably added in an amount of 0.0001 to 10 parts by weight per 100 parts by weight of the base polymer.

In the case of positive resist compositions, blending of a dissolution inhibitor may lead to an increased difference in dissolution rate between exposed and unexposed areas and a further improvement in resolution. The dissolution inhibitor which can be used herein is a compound having at least two phenolic hydroxyl groups on the molecule, in which an average of from 0 to 100 mol % of all the hydrogen atoms on the phenolic hydroxyl groups are replaced by acid labile groups or a compound having at least one carboxyl group on the molecule, in which an average of 50 to 100 mol % of all the hydrogen atoms on the carboxyl groups are replaced by acid labile groups, both the compounds preferably having a molecular weight of 100 to 1,000, and more preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxyl or carboxyl group is replaced by an acid labile group, as described in JP-A 2008-122932, paragraphs [0155] to [0178].

In the positive resist composition, the dissolution inhibitor is preferably added in an amount of 0 to 50 parts, more preferably 5 to 40 parts by weight per 100 parts by weight of the base polymer.

In the case of negative resist compositions, a negative pattern may be formed by adding a crosslinker to reduce the dissolution rate of exposed area. Examples of the crosslinker include epoxy compounds, melamine compounds, guanamine compounds, glycoluril compounds, and urea compounds having substituted thereon at least one group selected from among methylol, alkoxymethyl, and acyloxymethyl groups, isocyanate compounds, azide compounds, and compounds having a double bond such as an alkenyloxy group. These compounds may be used as an additive or introduced into a polymer side chain as a pendant. Hydroxy-containing compounds may also be used as the crosslinker.

Examples of the epoxy compound include tris(2,3-epoxypropyl) isocyanurate, trimethylolmethane triglycidyl ether, trimethylolpropane triglycidyl ether, and triethylolethane triglycidyl ether.

Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof.

Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof.

Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylolurea compounds having 1 to 4 methylol groups methoxymethylated and mixtures thereof, and tetramethoxyethylurea.

Examples of the isocyanate compound include tolylene diisocyanate, diphenylmethane diisocyanate, hexamethylene diisocyanate, and cyclohexane diisocyanate.

Examples of the azide compound include 1,1'-biphenyl-4,4'-bisazide, 4,4'-methylidenebisazide, and 44'-oxybisazide.

Examples of the alkenyloxy group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

In the negative resist composition, the crosslinker is preferably added in an amount of 0.1 to 50 parts, more preferably 1 to 40 pats by weight per 100 pats by weight of the base polymer.

To the resist composition, a water repellency improver may also be added for improving the water repellency on surface of a resist film. The water repellency improver may be used in the topcoatless immersion lithography. Suitable examples of the water repellency improver include polymers having a fluoroalkyl group, polymers having a specific structure with a 1,1,1,3,3,3-hexafluoro-2-propanol residue, and polymers described in JP-A 2007-297590, JP-A 2008-111103, and the like. The water repellency improver should be soluble in alkaline developers and organic solvent developers. The water repellency improver of specific structure with a 1,1,1,3,3,3-hexafluoro-2-propanol residue is well soluble in the developer. A polymer having an amino group or amine salt copolymerized as recurring units may serve as the water repellency improver and is effective for preventing evaporation of acid during PEB, thus preventing any hole pattern opening failure after development. In the resist composition, the water repellency improver is preferably added in an amount of 0 to 20 parts, more preferably 0.5 to 10 parts by weight per 100 parts by weight of the base polymer. The water repellency improver may be used alone or in combination of two or more.

Also, an acetylene alcohol may be blended in the resist composition. Examples of the acetylene alcohol include the acetylene alcohols described in JP-A 2008-122932, paragraphs [0179] to [0182]. In the resist composition, the acetylene alcohol is preferably added in an amount of 0 to 5 parts by weight per 100 parts by weight of the base polymer.

Pattern Forming Process

In a case where the resist composition is used in the fabrication of various integrated circuits, pattern formation using the resist composition may be performed by well-known lithography processes. The pattern forming process generally involves the steps of applying the resist composition onto a substrate to form a resist film thereon, exposing the resist film to high-energy radiation, and developing the exposed resist film in a developer.

For example, the resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying, or doctor coating. The coating is prebaked on a hotplate preferably at a temperature of 60 to 150° C. for 10 seconds to 30 minutes, more preferably at 80 to 120° C. for 30 seconds to 20 minutes. The resulting resist film is generally 0.01 to 2 μm thick.

Then the resist film is exposed to high-energy radiation. Examples of the high-energy radiation include ultraviolet (LV), deep-UV, EB, EU, x-rays, soft x-rays, excimer laser radiation, 7-rays, and synchrotron radiation. On use of UV as the high-energy radiation, deep UV, EUV, x-rays, soft x-rays, excimer laser radiation, γ-rays, or synchrotron radiation, the resist film is exposed through a mask having a desired pattern, preferably in a dose of about 1 to 200 mJ/cm², more preferably about 10 to 100 mJ/cm². On use of EB as the high-energy radiation, a pattern may be written directly or through a mask having a desired pattern, preferably in a dose of about 0.1 to 100 μC/cm², more preferably about 0.5 to 50 μC/cm². The resist composition is suited for micropatterning using high-energy radiation such as i-line of wavelength 365 nm, KrF excimer laser radiation, ArF excimer laser radiation, EB, EUV, x-rays, soft x-rays, γ-rays, or synchrotron radiation, especially EB or EUV.

After the exposure, the resist film may be baked (PEB) on a hotplate or in an oven preferably at 50 to 150° C. for 10 seconds to 30 minutes, more preferably at 60 to 120° C. for 30 seconds to 20 minutes.

After the exposure or PEB, the resist film exposed is developed with a developer for 3 seconds to 3 minutes, preferably 5 seconds to 2 minutes by conventional techniques such as dip, puddle, and spray techniques, thereby forming a desired pattern. A typical developer is a 0.1 to 10 wt %, preferably 2 to 5 wt % aqueous alkaline solution of tetramethylammonium hydroxide (TMAH), tetraethylammonium hydroxide (TEAH), tetrapropylammonium hydroxide (TPAH), or tetrabutylammonium hydroxide (TBAH). In the case of a positive resist composition, the resist film in the exposed area is dissolved in the developer whereas the resist film in the unexposed area is not dissolved. In this way, the desired positive pattern is formed on the substrate. Inversely in the case of a negative resist composition, the exposed area of resist film is insolubilized and the unexposed area is dissolved in the developer.

There may be performed negative development in which a negative pattern may be formed via organic solvent development using a positive resist composition comprising a base polymer having an acid labile group. Examples of the developer used at this time include 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in combination of two or more.

At the end of development, the resist film is rinsed. As the rinsing liquid, a solvent which is miscible with the developer and does not dissolve the resist film is preferred. Suitable examples of the solvent include alcohols of 3 to 10 carbon atoms, ether compounds of 8 to 12 carbon atoms, alkanes alkenes, and alkynes of 6 to 12 carbon atoms, and aromatic solvents.

Specific examples of the alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol.

Examples of the ether compounds of 8 to 12 carbon atoms include di-n-butyl ether, diisobutyl ether, di-sec-butyl ether, di-n-pentyl ether, diisopentyl ether, di-sec-pentyl ether, di-tert-pentyl ether, and di-n-hexyl ether.

Examples of the alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Examples of the alkenes of 6 to 12 carbon atoms include hexene, heptene, octene, cyclohexene, methylcyclohexene, dimethylcyclohexene, cycloheptene, and cyclooctene. Examples of the alkynes of 6 to 12 carbon atoms include hexyne, heptyne, and octyne.

Examples of the aromatic solvents include toluene, xylene, ethylbenzene, isopropylbenzene, tert-butylbenzene, and mesitylene.

Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS (registered trademark) or DSA process. A hole pattern is shrunk by coating a shrink agent thereto, the shrink agent may undergo crosslinking at the resist surface as a result of the acid catalyst diffusing from the resist film during bake, and the shrink agent may attach to the sidewall of the hole pattern. The bake is preferably at a temperature of 70 to 180° C., more preferably 80 to 170° C. preferably for a time of 10 to 300 seconds. The extra shrink agent is stripped and the hole pattern is shrunk.

EXAMPLES

Hereinafter, the invention is specifically described with reference to Synthesis Examples, Examples, and Comparative Examples, but the invention is not limited to the following Examples.

The structures of the acid generators PAG 1 to PAG 25 including the sulfonium salt or the iodonium salt used in the resist composition are shown below. PAG 1 to PAG 25 each were synthesized by ion exchange between an ammonium salt of the iodized or brominated hydrocarbylcarbonyloxy group-containing fluorinated sulfonic acid that gives each anion described below and a sulfonium or iodonium chloride that gives each cation described below.

PAG 1

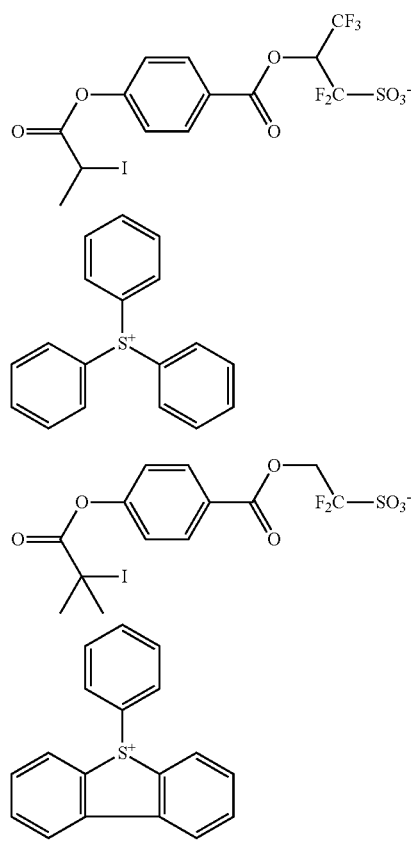

PAG 2

PAG 3

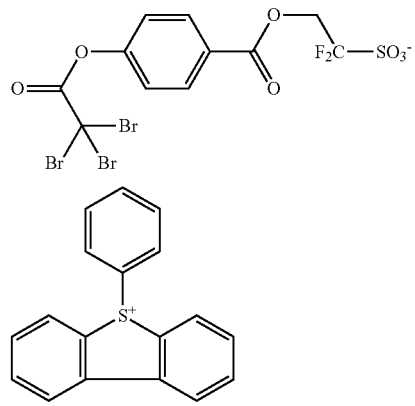

PAG 4

PAG 5

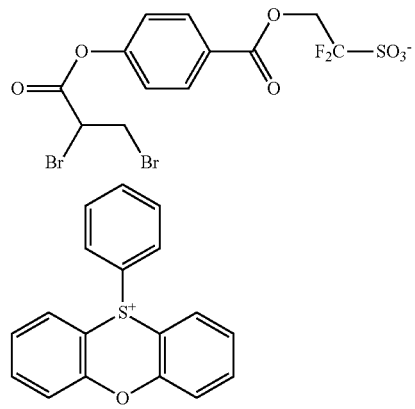

PAG 6

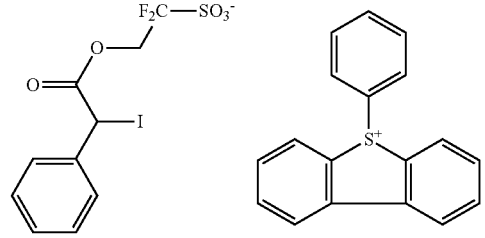

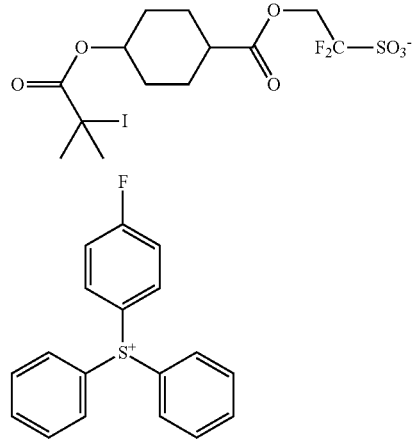

-continued
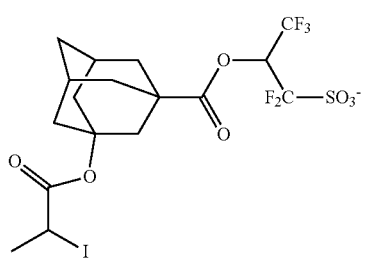
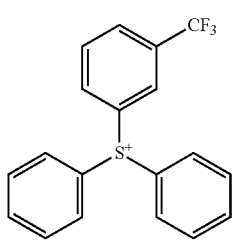
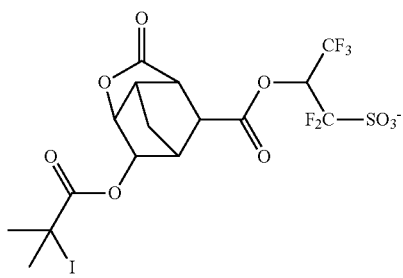
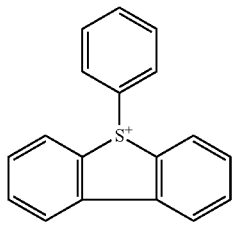
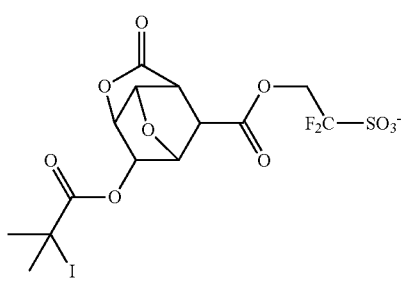
-continued
PAG 7
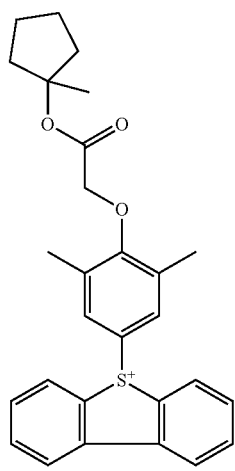
PAG 8
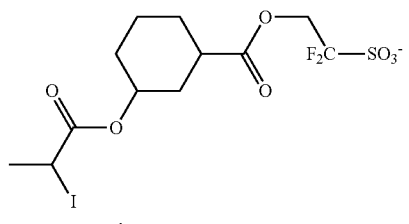
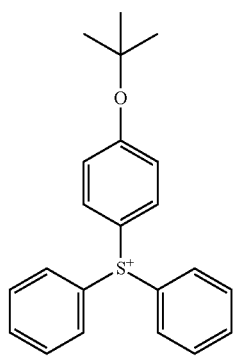
PAG 9
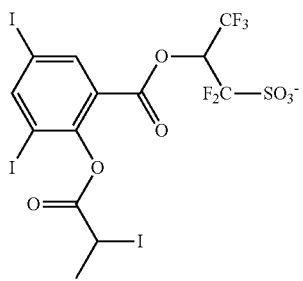
PAG 10
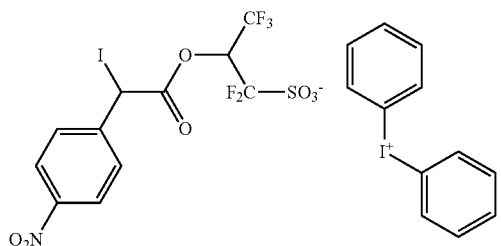
PAG 11
PAG 12

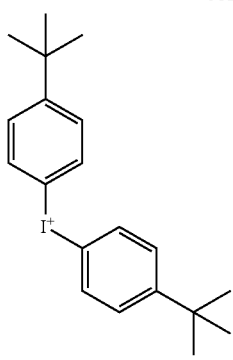
PAG 13
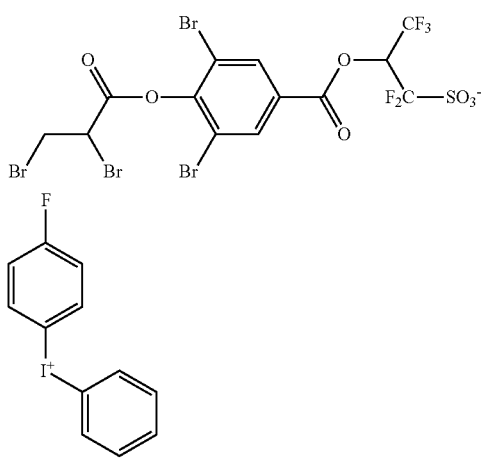
PAG 14
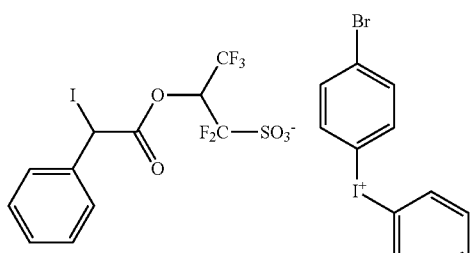
PAG 15
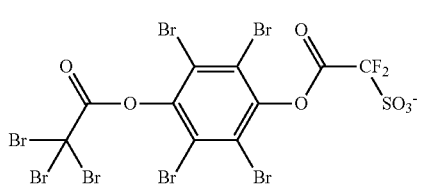
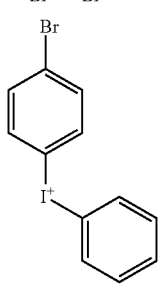
PAG 16
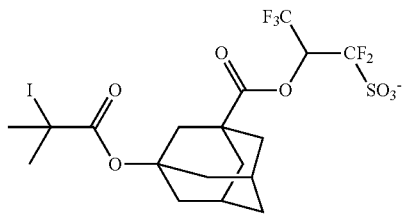
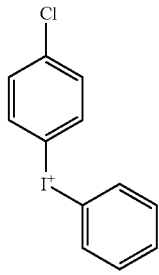
PAG 17
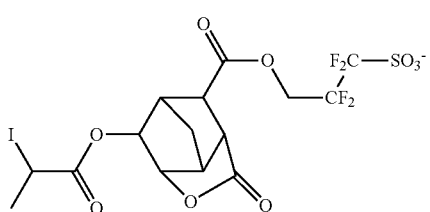
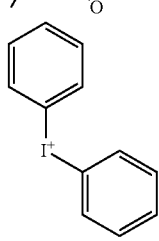
PAG 18
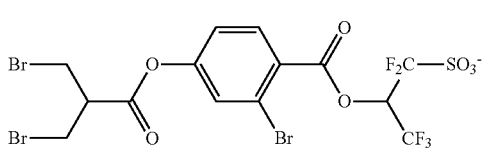
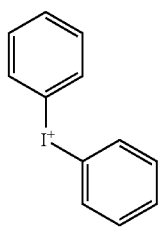
PAG 19
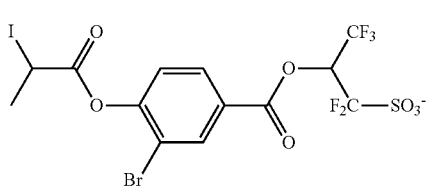

PAG 20

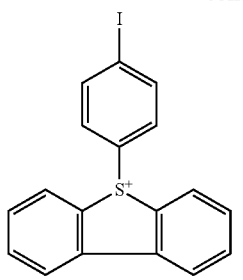

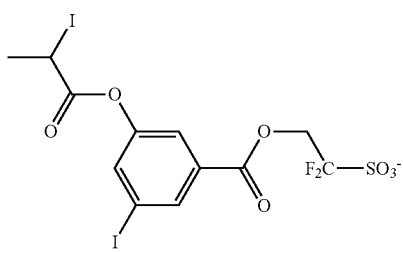

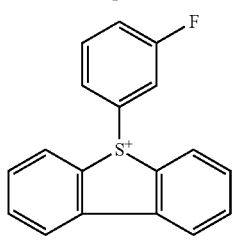

PAG 21

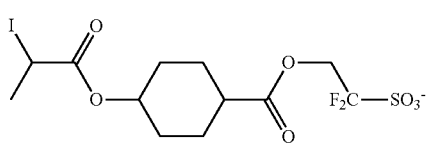

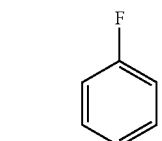

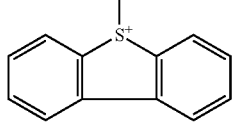

PAG 22

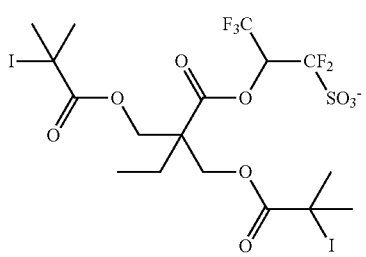

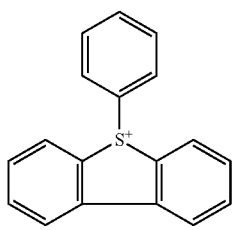

PAG 23

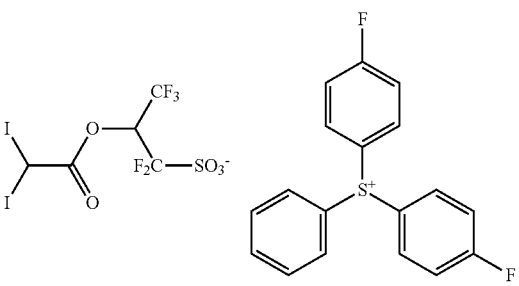

PAG 24

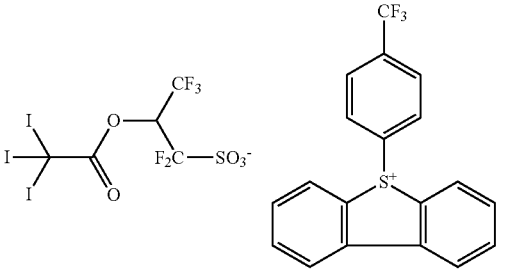

PAG 25

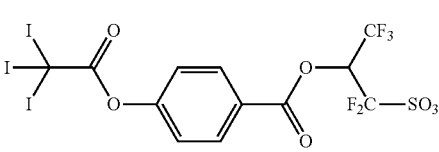

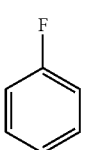

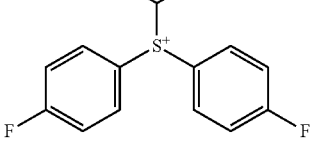

Synthesis Example

Synthesis of Base Polymer (Polymers 1 to 4)

Base polymers (Polymers 1 to 4) were prepared by combining suitable monomers, effecting copolymerization reaction thereof in THF, pouring the reaction solution into methanol, repeatedly washing with hexane, isolating, and drying the precipitated solid. The resulting base polymers were analyzed for composition by $^1$H-NMR spectroscopy, and for Mw and Mw/Mn by GPC versus polystyrene standards using THF solvent.

Polymer 1
Mw = 6,600
Mw/Mn = 1.66

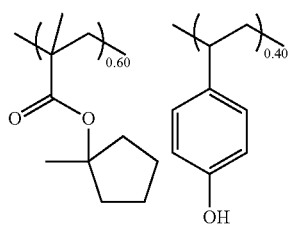

Polymer 2
Mw = 8,700
Mw/Mn = 1.81

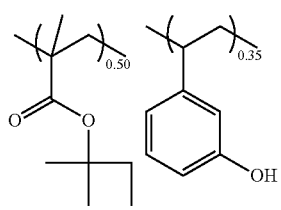

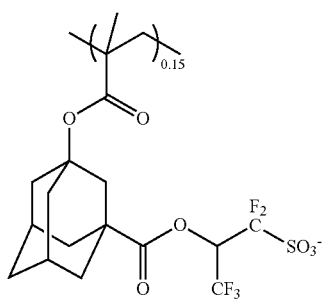

Polymer 3
Mw = 7,900
Mw/Mn = 1.88

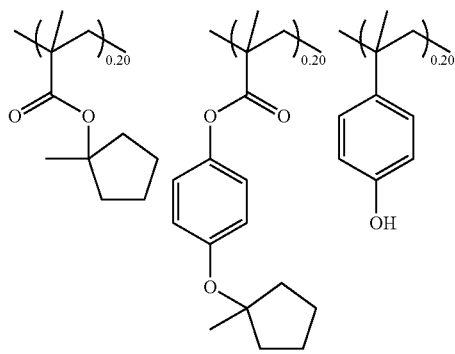

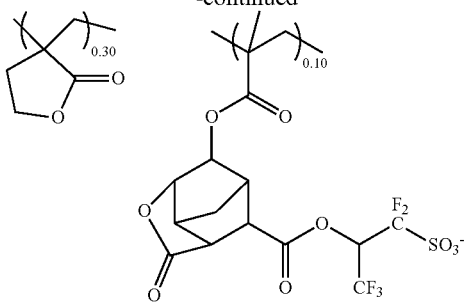

-continued

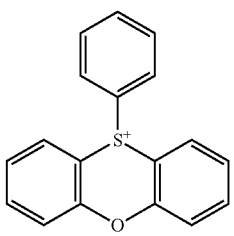

Polymer 4
Mw = 6,900
Mw/Mn = 1.62

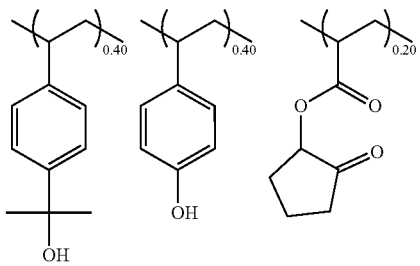

Examples 1 to 26 and Comparative Examples 1 to 4

Preparation of Resist Composition and its Evaluation (1) Preparation of Resist Composition Resist compositions were prepared by dissolving components in a solvent in accordance with the recipe shown in Tables 1 and 2, and filtering through a filter having a pore size of 0.2 µm. The solvent contained 100 ppm of surfactant PolyFox PF-636 (Omnova Solutions Inc.). The resist compositions of Examples 1 to 25 and Comparative Examples 1 to 3 are of positive tone, and the resist compositions of Example 26 and Comparative Examples 4 are of negative tone.

The components in Tables 1 and 2 are as identified below.

Organic Solvents:
PGMEA (propylene glycol monomethyl ether acetate)
CyH (cyclohexanone)
PGME (propylene glycol monomethyl ether)
DAA (diacetone alcohol)

Acid Generators for Comparative Examples: cPAG 1 to cPAG 3

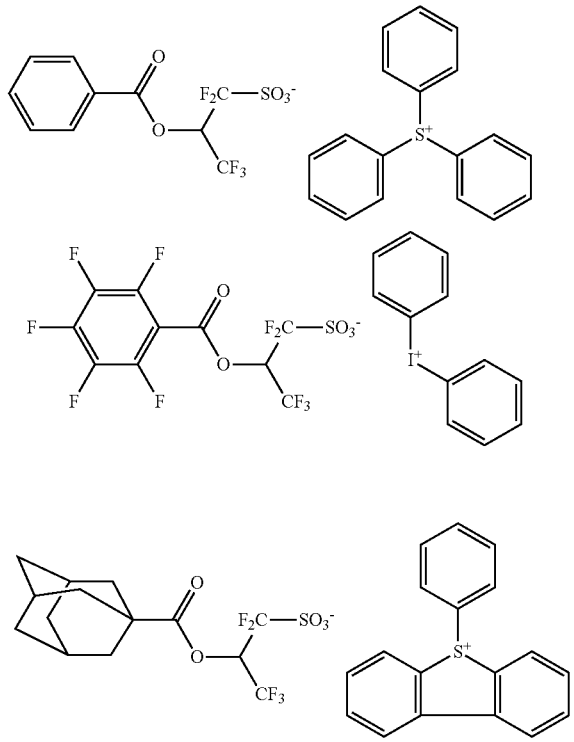

Quencher: Q-1 to Q-3

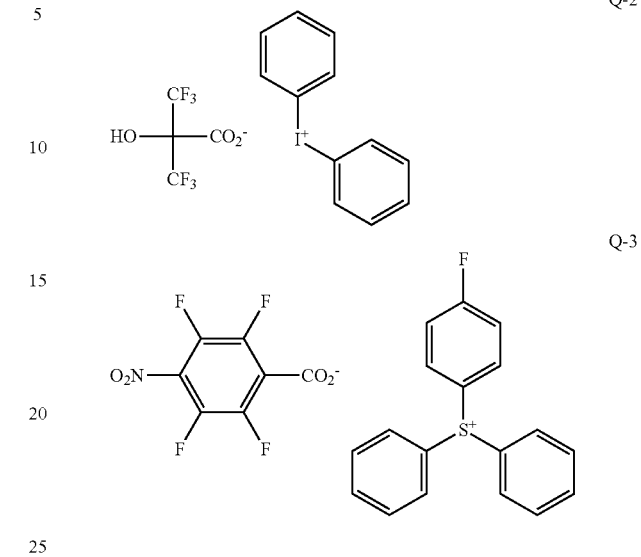

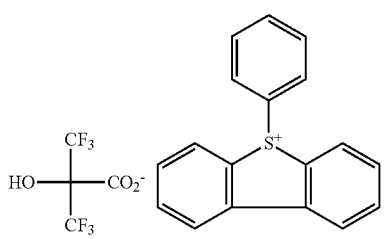

(2) EUV Lithography Test

Each of the resist compositions in Tables 1 and 2 was spin coated on a silicon substrate having a 20-nm coating of silicon-containing spin-on hard mask SHB-A940 (Shin-Etsu Chemical Co., Ltd., Si content 43 wt %) and prebaked on a hotplate at 105° C. for 60 seconds to form a resist film of 60 nm thick. Using an EUV scanner NXE3300 (ASML, NA 0.33, σ 0.9/0.6, quadrupole illumination), the resist film was exposed to EUV through a mask bearing a hole pattern at a pitch 46 nm (on-wafer size) and +20% bias. The resist film was baked (PEB) on a hotplate at the temperature shown in Tables 1 and 2 for 60 seconds and developed in a 2.38 wt % TMAH aqueous solution for 30 seconds to form a pattern. In Examples 1 to 25 and Comparative Examples 1 to 3, a hole pattern having a size of 23 m was formed. In Example 26 and Comparative Example 4, a dot pattern having a size of 23 nm was formed.

The resist pattern was observed under CD-SEM (CG-5000, Hitachi High-Technologies Corp.). The exposure dose that provides a hole or dot pattern having a size of 23 nm was reported as sensitivity. The size of 50 hole or dot patterns was measured, from which a size variation (3σ) was computed and reported as CDU. The results are shown in Tables 1 and 2.

TABLE 1

| | | Polymer (pbw) | Acid generator (pbw) | Quencher (pbw) | Organic solvent (pbw) | PEB (° C.) | Sensitivity (mJ/cm$^2$) | CDU (nm) |
|---|---|---|---|---|---|---|---|---|
| Example | 1 | Polymer 1 (100) | PAG 1 (23.8) | Q-1 (4.00) | PGMEA (400) CyH (2,000) PGME (100) | 100 | 26 | 3.5 |
| | 2 | Polymer 1 (100) | PAG 2 (22.1) | Q-1 (4.00) | PGMEA (400) CyH (2,000) PGME (100) | 100 | 25 | 3.2 |
| | 3 | Polymer 1 (100) | PAG 3 (24.6) | Q-1 (4.00) | PGMEA (2,000) DAA (500) | 100 | 25 | 2.8 |
| | 4 | Polymer 1 (100) | PAG 4 (23.2) | Q-1 (4.00) | PGMEA (2,000) DAA (500) | 100 | 26 | 2.6 |
| | 5 | Polymer 1 (100) | PAG 5 (23.0) | Q-2 (4.00) | PGMEA (2,000) DAA (500) | 100 | 24 | 2.4 |
| | 6 | Polymer 1 (100) | PAG 6 (22.9) | Q-2 (4.00) | PGMEA (2,000) DAA (500) | 100 | 24 | 2.4 |

TABLE 1-continued

| | Polymer (pbw) | Acid generator (pbw) | Quencher (pbw) | Organic solvent (pbw) | PEB (° C.) | Sensitivity (mJ/cm$^2$) | CDU (nm) |
|---|---|---|---|---|---|---|---|
| 7 | Polymer 1 (100) | PAG 7 (27.6) | Q-2 (4.00) | PGMEA (2,000) DAA (500) | 100 | 26 | 2.2 |
| 8 | Polymer 1 (100) | PAG 8 (26.0) | Q-2 (4.00) | PGMEA (2,000) DAA (500) | 100 | 27 | 2.5 |
| 9 | Polymer 1 (100) | PAG 9 (9.3) | Q-2 (4.00) | PGMEA (2,000) DAA (500) | 100 | 27 | 2.4 |
| 10 | Polymer 2 (100) | PAG 10 (8.0) | Q-2 (4.00) | PGMEA (2,000) DAA (500) | 100 | 23 | 2.3 |
| 11 | Polymer 3 (100) | PAG 11 (8.0) | Q-2 (4.00) | PGMEA (2,000) DAA (500) | 100 | 22 | 2.3 |
| 12 | Polymer 1 (100) | PAG 12 (35.3) | Q-2 (4.00) | PGMEA (2,000) DAA (500) | 100 | 22 | 2.4 |
| 13 | Polymer 1 (100) | PAG 13 (30.5) | Q-2 (4.00) | PGMEA (2,000) DAA (500) | 100 | 23 | 2.6 |
| 14 | Polymer 1 (100) | PAG 14 (25.0) | Q-2 (4.00) | PGMEA (2,000) DAA (500) | 100 | 22 | 2.6 |
| 15 | Polymer 1 (100) | PAG 15 (36.6) | Q-2 (4.00) | PGMEA (2,000) DAA (500) | 100 | 21 | 2.4 |
| 16 | Polymer 1 (100) | PAG 16 (27.5) | Q-2 (4.00) | PGMEA (2,000) DAA (500) | 100 | 23 | 2.4 |
| 17 | Polymer 1 (100) | PAG 17 (25.6) | Q-2 (4.00) | PGMEA (2,000) DAA (500) | 100 | 23 | 2.5 |
| 18 | Polymer 1 (100) | PAG 18 (28.1) | Q-2 (4.00) | PGMEA (2,000) DAA (500) | 100 | 22 | 2.5 |
| 19 | Polymer 1 (100) | PAG 19 (29.9) | Q-2 (4.00) | PGMEA (2,000) DAA (500) | 100 | 23 | 2.5 |
| 20 | Polymer 1 (100) | PAG 20 (26.0) | Q-2 (4.00) | PGMEA (2,000) DAA (500) | 100 | 22 | 2.4 |
| 21 | Polymer 1 (100) | PAG 21 (22.4) | Q-2 (4.00) | PGMEA (2,000) DAA (500) | 100 | 23 | 2.5 |
| 22 | Polymer 1 (100) | PAG 22 (30.3) | Q-2 (4.00) | PGMEA (2,000) DAA (500) | 100 | 21 | 2.6 |
| 23 | Polymer 1 (100) | PAG 23 (25.1) | Q-2 (4.00) | PGMEA (2,000) DAA (500) | 100 | 21 | 2.4 |
| 24 | Polymer 1 (100) | PAG 24 (27.8) | Q-2 (4.00) | PGMEA (2,000) DAA (500) | 100 | 20 | 2.5 |
| 25 | Polymer 1 (100) | PAG 25 (32.6) | Q-2 (4.00) | PGMEA (2,000) DAA (500) | 100 | 20 | 2.6 |
| 26 | Polymer 4 (100) | PAG 21 (15.0) | Q-3 (4.00) | PGMEA (2,000) DAA (500) | 130 | 34 | 3.2 |

TABLE 2

| | | Polymer (pbw) | Acid generator (pbw) | Quencher (pbw) | Organic solvent (pbw) | PEB (° C.) | Sensitivity (mJ/cm$^2$) | CDU (nm) |
|---|---|---|---|---|---|---|---|---|
| Comparative Example | 1 | Polymer 1 (100) | cPAG 1 (20.0) | Q-1 (4.00) | PGMEA (400) CyH (2,000) PGME (100) | 100 | 33 | 4.0 |
| | 2 | Polymer 1 (100) | cPAG 2 (20.0) | Q-1 (4.00) | PGMEA (400) CyH (2,000) PGME (100) | 100 | 28 | 3.5 |
| | 3 | Polymer 1 (100) | cPAG 3 (20.0) | Q-1 (4.00) | PGMEA (400) CyH (2,000) PGME (100) | 100 | 30 | 3.7 |
| | 4 | Polymer 4 (100) | cPAG 3 (20.0) | Q-1 (4.00) | PGMEA (400) CyH (2,000) PGME (100) | 130 | 50 | 4.7 |

It is demonstrated in Tables 1 and 2 that resist compositions comprising an iodized or brominated hydrocarbylcarbonyloxy group-containing fluorinated sulfonic acid onium salt as an acid generator offer a high sensitivity and improved CDU.

Japanese Patent Application No. 2020-007992 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a base polymer and an acid generator containing a sulfonium salt having the formula (1) or an iodonium salt having the formula (2):

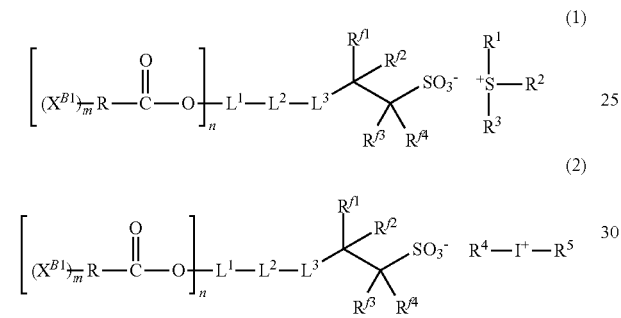

wherein m is an integer of 1 to 3, n is an integer of 1 to 3, $X^{BI}$ is bromine or iodine, R is a $C_1$-$C_{20}$ (m+1)-valent aliphatic hydrocarbon group which may contain at least one selected from fluorine, chlorine, a hydroxyl group, a carboxyl group, a $C_6$-$C_{12}$ aryl group, an ether bond, an ester bond, a carbonyl group, an amide bond, a carbonate group, a urethane bond, or a urea bond, $L^1$ is a single bond or a $C_1$-$C_{20}$ hydrocarbylene group which may contain a heteroatom when n is 1, or a $C_1$-$C_{20}$ (n+1)-valent hydrocarbon group which may contain a heteroatom when n is 2 or 3, $L^2$ is a single bond, an ester bond, or an ether bond, $L^3$ is a single bond or a $C_1$-$C_{10}$ aliphatic hydrocarbylene group, $Rf^1$ to $Rf^4$ are each independently hydrogen, fluorine, or a trifluoromethyl group, at least one of $Rf^1$ to $Rf^4$ being fluorine or a trifluoromethyl group, $Rf^1$ and $Rf^2$, taken together, may form a carbonyl group, $R^1$ to $R^3$ are each independently a $C_1$-$C_{20}$ alkyl group, a $C_3$-$C_{20}$ cyclic saturated hydrocarbyl group, a $C_6$-$C_{20}$ aryl group, a $C_7$-$C_{20}$ aralkyl group or a combination thereof, which may contain a heteroatom, $R^4$ and $R^5$ are each independently a $C_1$-$C_{20}$ hydrocarbyl group which may contain a heteroatom, and $R^1$ and $R^2$ may bond together to form a ring with the sulfur atom to which they are attached.

2. The resist composition of claim 1, further comprising a quencher.

3. The resist composition of claim 1, further comprising an organic solvent.

4. The resist composition of claim 1, wherein the base polymer comprises recurring units having the formula (a1) or recurring units having the formula (a2):

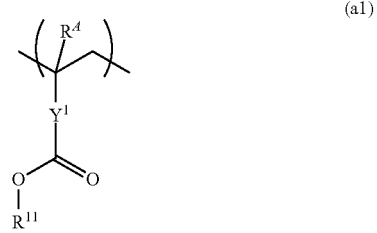

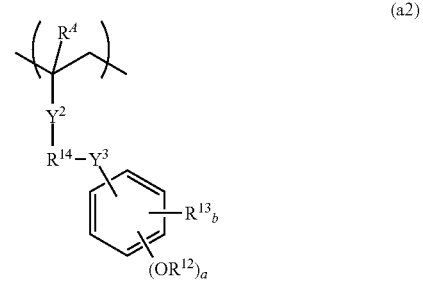

wherein $R^A$ is each independently hydrogen or a methyl group, $Y^1$ is a single bond, a phenylene group, a naphthylene group, or a $C_1$-$C_{12}$ linking group containing at least one selected from an ester bond or a lactone ring, $Y_2$ is a single bond or an ester bond, $Y_3$ is a single bond, an ether bond, or an ester bond, $R^{11}$ and $R^{12}$ each are an acid labile group, $R^{13}$ is fluorine, a trifluoromethyl group, a cyano group, a $C_1$-$C_6$ saturated hydrocarbyl group, a $C_1$-$C_6$ saturated hydrocarbyloxy group, a $C_2$-$C_7$ saturated hydrocarbylcarbonyl group, a $C_2$-$C_7$ saturated hydrocarbylcarbonyloxy group, or a $C_2$-$C_7$ saturated hydrocarbyloxycarbonyl group, $R^{14}$ is a single bond or a $C_1$-$C_6$ alkanediyl group in which some carbon may be replaced by an ether bond or an ester bond, a is 1 or 2, and b is an integer of 0 to 4.

5. The resist composition of claim 4 which is a chemically amplified positive resist composition.

6. The resist composition of claim 1, wherein the base polymer is free of an acid labile group.

7. The resist composition of claim 6 which is a chemically amplified negative resist composition.

8. The resist composition of claim 1, further comprising a surfactant.

9. The resist composition of claim 1, wherein the base polymer comprises recurring units having any one of the formulae (f1) to (f3):

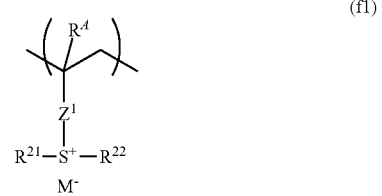

-continued (f2)

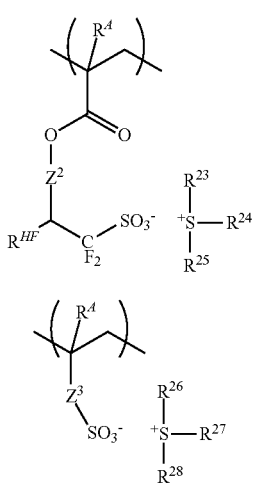

(f3)

wherein $R^A$ is each independently hydrogen or a methyl group, $Z^1$ is a single bond, a phenylene group, —O—$Z^{11}$—, —C(=O)—O—$Z^{11}$—, or —C(=O)—NH—$Z^{11}$—, $Z^{11}$ is a $C_1$-$C_6$ aliphatic hydrocarbylene group, a phenylene group, a naphthylene group, or a $C_7$-$C_{18}$ group obtained from combination thereof, which may contain a carbonyl group, an ester bond, an ether bond, or a hydroxyl group, $Z^2$ is a single bond, —$Z^{21}$—C(=O)—O—, —$Z^{21}$—O—, or —$Z^{21}$—O—C(=O)—, $Z^{21}$ is a $C_1$-$C_{12}$ saturated hydrocarbylene group which may contain a carbonyl group, an ester bond, or an ether bond, $Z^3$ is a single bond, a methylene group, an ethylene group, a phenylene group, a fluorinated phenylene group, —O—$Z^{31}$—, —C(=O)—O—$Z^{31}$—, or —C(=O)—NH—$Z^{31}$—, $Z^{31}$ is a $C_1$-$C_6$ aliphatic hydrocarbylene group, a phenylene group, a fluorinated phenylene group, or a trifluoromethyl-substituted phenylene group, which may contain a carbonyl group, an ester bond, an ether bond, or a hydroxyl group, $R^{21}$ to $R^{28}$ are each independently a $C_1$-$C_{20}$ hydrocarbyl group which may contain a heteroatom, a pair of $R^{23}$ and $R^{24}$ or $R^{26}$ and $R^{27}$ may bond together to form a ring with the sulfur atom to which they are attached, $R^{HF}$ is hydrogen or a trifluoromethyl group, and $M^-$ is a non-nucleophilic counter ion.

10. The resist composition of claim 1, wherein $L^1$ is a $C_1$-$C_{20}$ hydrocarbylene group which may contain a heteroatom when n is 1, or a $C_1$-$C_{20}$ (n+1)-valent hydrocarbon group which may contain a heteroatom when n is 2 or 3, and $L^2$ is an ester bond, or an ether bond.

11. The resist composition of claim 1, wherein $X^{BI}$ is bromine.

12. A pattern forming process comprising the steps of applying the resist composition of claim 1 onto a substrate to form a resist film thereon, exposing the resist film to high-energy radiation, and developing the exposed resist film in a developer.

13. The pattern forming process of claim 12, wherein the high-energy radiation is ArF excimer laser radiation of wavelength 193 nm or KrF excimer laser radiation of wavelength 248 nm.

14. The pattern forming process of claim 12, wherein the high-energy radiation is an electron beam or extreme ultraviolet light of wavelength 3 to 15 nm.

* * * * *